US012068320B2

United States Patent
Pan et al.

(10) Patent No.: US 12,068,320 B2
(45) Date of Patent: Aug. 20, 2024

(54) GATE ISOLATION FOR MULTIGATE DEVICE

(71) Applicant: Taiwan Semiconductor Manufacturing Company, Ltd., Hsin-Chu (TW)

(72) Inventors: Kuan-Ting Pan, Taipei (TW); Kuo-Cheng Chiang, Zhubei (TW); Shi Ning Ju, Hsinchu (TW); Yi-Ruei Jhan, Keelung (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 399 days.

(21) Appl. No.: 17/466,569

(22) Filed: Sep. 3, 2021

(65) Prior Publication Data
US 2022/0320088 A1    Oct. 6, 2022

Related U.S. Application Data

(60) Provisional application No. 63/167,899, filed on Mar. 30, 2021.

(51) Int. Cl.
*H01L 27/12* (2006.01)
*H01L 21/02* (2006.01)
(Continued)

(52) U.S. Cl.
CPC ........ *H01L 27/092* (2013.01); *H01L 21/0259* (2013.01); *H01L 21/823807* (2013.01);
(Continued)

(58) Field of Classification Search
CPC ............. H01L 29/66795; H01L 29/785; H01L 21/823431; H01L 29/7851;
(Continued)

(56) References Cited

U.S. PATENT DOCUMENTS 6,287,904 B1    9/2001 Lee et al.
11,616,062 B2 *  3/2023 Ju .................... H01L 21/02603
                                                        257/351
(Continued)

FOREIGN PATENT DOCUMENTS

WO  WO2000060659 A   10/2000
WO  WO2016099570 A1  12/2014
WO  WO2015094305 A    6/2015

OTHER PUBLICATIONS

Chen, Guan-Lin et al., "Self-Aligned Metal Gate for Multigate Device", U.S. Appl. No. 17/174,109, Assignee: Taiwan Semiconductor Manufacturing Co., Ltd. 66 Pages of specification, 30 pages of drawings.
(Continued)

*Primary Examiner* — Niki H Nguyen
(74) *Attorney, Agent, or Firm* — HAYNES AND BOONE, LLP

(57) ABSTRACT

Gate isolation techniques disclosed herein form gate isolation fins to isolate metal gates of multigate devices from one another before forming the multigate devices, and in particular, before forming the metal gates of the multigate devices. An exemplary device includes a first multigate device having first source/drain features and a first metal gate that surrounds a first channel layer and a second multigate device having second source/drain features and a second metal gate that surrounds a second channel layer. A gate isolation fin, which separates the first metal gate and the second metal gate, includes a dielectric feature having a first dielectric layer having a first dielectric constant (e.g., a
(Continued)

low-k dielectric core) and a second dielectric layer (e.g., a high-k dielectric shell) surrounding the first dielectric layer. The second dielectric layer has a second dielectric constant that is greater than the first dielectric constant.

20 Claims, 33 Drawing Sheets

(51) Int. Cl.
*H01L 21/8238* (2006.01)
*H01L 27/092* (2006.01)
*H01L 29/06* (2006.01)
*H01L 29/417* (2006.01)
*H01L 29/423* (2006.01)
*H01L 29/66* (2006.01)
*H01L 29/786* (2006.01)

(52) U.S. Cl.
CPC .. *H01L 21/823878* (2013.01); *H01L 29/0665* (2013.01); *H01L 29/41733* (2013.01); *H01L 29/42392* (2013.01); *H01L 29/66742* (2013.01); *H01L 29/78696* (2013.01)

(58) Field of Classification Search
CPC ....... H01L 29/66439; H01L 21/823475; H01L 21/823462; H01L 21/823468; H01L 21/823412; H01L 21/823828; H01L 21/823842; H01L 27/1211; H01L 29/7846; H01L 21/823857; H01L 29/1033; H01L 29/78; H01L 21/764; H01L 21/28088; H01L 21/76877; H01L 21/76831; H01L 27/1203; H01L 29/24; H01L 21/76849; H01L 29/66469; H01L 21/823425; H01L 21/76805; H01L 21/02172; H01L 21/76846; H01L 29/66348; H01L 21/32135; H01L 27/0928; H01L 21/31051; H01L 29/49; H01L 29/7835; H01L 21/3085; H01L 21/76885; H01L 29/41733; H01L 29/78391; H01L 21/76837; H01L 23/5329; H01L 29/456; H01L 21/0337; H01L 21/32053; H01L 27/14612; H01L 29/4238; H01L 29/78642; H01L 21/02167; H01L 21/76825; H01L 27/1463; H01L 27/092; H01L 21/0259; H01L 21/823807; H01L 21/823878; H01L 29/0665; H01L 29/42392; H01L 29/66742; H01L 29/78696
See application file for complete search history.

(56) References Cited

U.S. PATENT DOCUMENTS

2019/0378903 A1* 12/2019 Jeon ................... H01L 27/088
2020/0287015 A1    9/2020 Subramanian et al.
2021/0036122 A1    2/2021 Wong et al.

OTHER PUBLICATIONS

Ju, Shi Ning et al., "Gate Isolation for Multigate Device" U.S. Appl. No. 17/170,740, Assignee: Taiwan Semiconductor Manufacturing Co., Ltd, 75 Pages of Specification, 28 pages of drawings.

Chiang, Kuo-Cheng et al."Gate Isolation for Multigate Device" U.S. Appl. No. 17/199,777, Assignee: Taiwan Semiconductor Manufacturing Co., Ltd., 61 Pages of Specification, 47 Pages of Drawings.

* cited by examiner

GATE ISOLATION FOR MULTIGATE DEVICE

This application is a non-provisional application of and claims benefit of U.S. Provisional Patent Application Ser. No. 63/167,899, filed Mar. 30, 2021, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices include a gate structure that extends, partially or fully, around a channel region to provide access to the channel region on at least two sides. Exemplary multigate devices include fin-like field effect transistors (FinFETs) and gate-all around (GAA) transistors, such as nanowire transistors. Multigate devices enable aggressive scaling down of IC technologies, maintaining gate control and mitigating short-channel effects (SCEs), while seamlessly integrating with conventional IC manufacturing processes. However, as multigate devices continue to scale, non-self-aligned gate cutting techniques typically implemented to isolate gates of different devices from one another, such as a first gate of a first GAA transistor and a second gate of a second GAA transistor, are hindering the dense packing of IC features needed for advanced IC technology nodes. Accordingly, although existing multigate devices and methods for fabricating these existing multigate devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
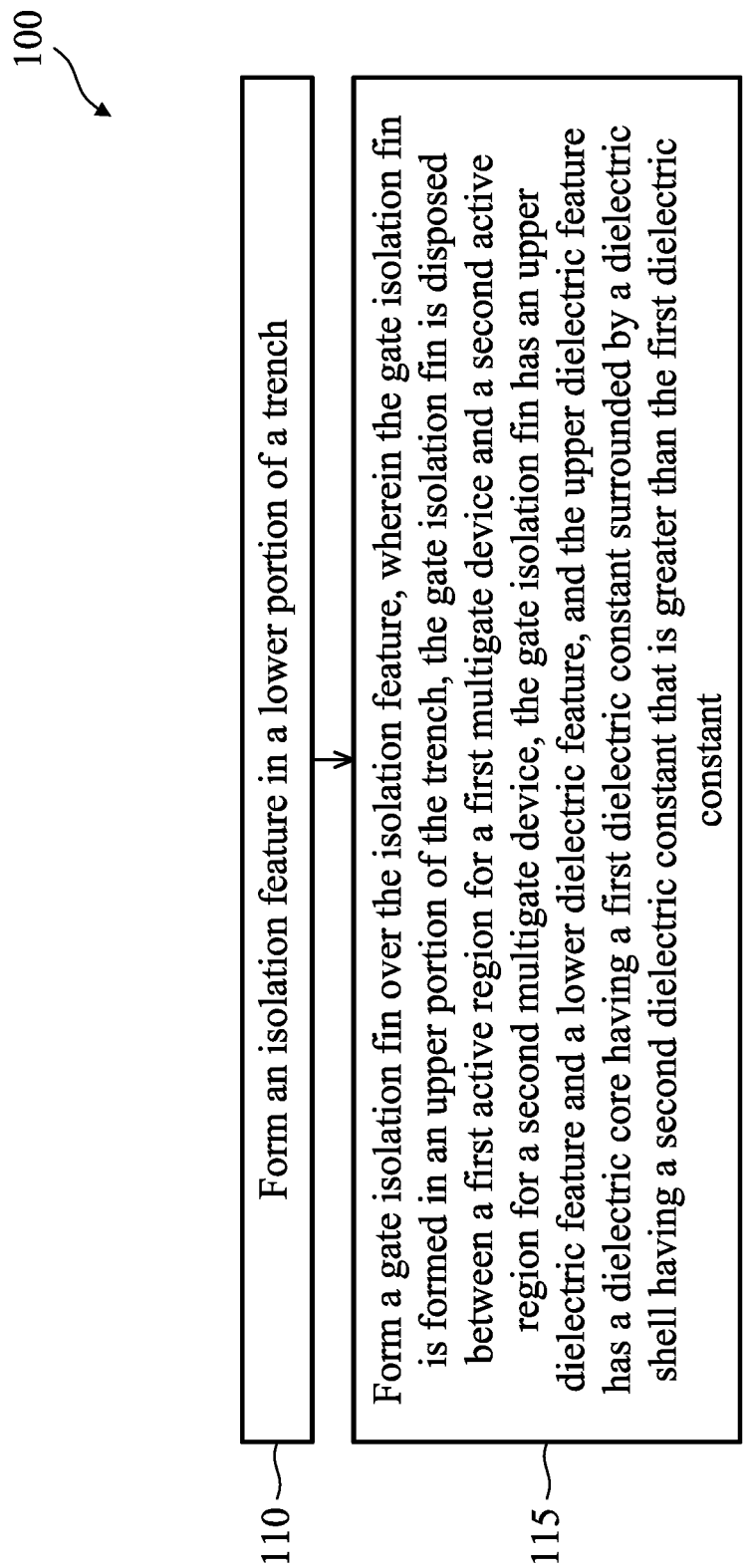
FIG. 1 is a flow chart of a method for fabricating a multigate device according to various aspects of the present disclosure.

The present disclosure relates generally to integrated circuit devices, and more particularly, to gate isolation techniques for multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An exemplary non-self-aligned gate cutting technique can involve forming a mask layer over a gate stack, where the mask layer covers a first portion of the gate stack and a second portion of the gate stack and exposes a third portion of the gate stack via an opening formed in the mask layer. The third portion of the gate stack is disposed between the first portion of the gate stack and the second portion of the gate stack. An etching process is then performed that removes the exposed third portion of the gate stack (including, for example, at least one gate electrode layer and at least one gate dielectric layer), thereby forming a gate opening between and separating the first portion of the gate stack from the second portion of the gate stack. A gate isolation feature, such as a dielectric layer (for example, a silicon nitride layer), is then formed in the gate opening to provide electrical isolation between the first portion of the gate stack, which may be disposed over a first channel layer of a first GAA device (i.e., first active device area), and the second portion of the gate stack, which may be disposed over a second channel layer of a second GAA device (i.e., second active device area).

A spacing between active device areas, such as the first channel layer and the second channel layer, is intentionally designed larger than necessary to compensate for process variations that arise during the non-self-aligned gate cutting technique. For example, etch loading effects and/or other loading effects may reduce critical dimension uniformity (CDU) across a wafer, such that in some locations, a width of the opening in the mask layer and/or a width of the gate opening may be larger than a target width, which can lead to unintentional exposure and/or damage of the first channel layer, the second channel layer, the first portion of the gate stack, and/or the second portion of the gate stack. In another example, overlay shift arising from lithography processes may result in the opening in the mask layer shifted left or right of its intended position, which can also lead to unintentional exposure and/or damage of the first channel layer, the second channel layer, the first portion of the gate stack, and/or the second portion of the gate stack. The increased spacing required between the active device areas to adequately compensate for such process variations prevents compact packing of active device areas, thereby reducing pattern density desired for advanced IC technology nodes.

The present disclosure thus proposes a self-aligned gate cutting (isolation) technique for multigate devices that allows for smaller spacing between active device areas (and thus smaller cell heights) compared to spacing required between active device areas when implementing non-self-aligned gate cutting techniques. The self-aligned gate cutting technique provides a gate isolation fin disposed between and separating a first gate of a first multigate device (e.g., a first transistor) from a second gate of a second multigate device (e.g., a second transistor). The gate isolation fin has an upper portion and a lower portion, where the upper portion has a low-k dielectric core surrounded by a high-k dielectric shell. In some embodiments, the upper portion is different in channel regions of the multigate devices and source/drain regions of the multigate devices. For example, a height of the upper portion in the source/drain regions is less than a height of the upper portion in the channel regions. In another example, in the source/drain regions, the high-k dielectric shell wraps the low-k dielectric core, instead of surrounding the low-k dielectric core. In some embodiments, the lower portion includes an oxide layer (core) wrapped by a low-k dielectric layer. In some embodiments, the gate isolation fin is a first gate isolation fin, the first gate is disposed between the first gate isolation fin and the second gate isolation fin, and the second gate is disposed between the first gate isolation fin and a third gate isolation fin. The second gate isolation fin and the third gate isolation fin are similar to the first gate isolation fin in source/drain regions of the multigate devices. For example, the second gate isolation fin and the third gate isolation fin have an upper portion and a lower portion, where the upper portion has a high-k dielectric shell that wraps a low-k dielectric core. The second gate isolation fin and the third gate isolation fin are different than the first gate isolation fin in channel regions of the multigate devices. For example, the second gate isolation fin and the third gate isolation fin include the lower portion, but not the upper portion. In such embodiments, the first metal gate may extend over a top surface of the second gate isolation fin and the second metal gate may extend over a top surface of the third gate isolation fin. The disclosed gate isolation fins can improve performance of multigate devices, such as the first multigate device and the second multigate device. For example, it has been observed that voids can form easily in a high-k dielectric core of an upper portion of a gate isolation fin, and these voids can provide leakage paths between, for example, a gate and a source/drain contact of a multigate device, which degrades performance the multigate device. Incorporating a low-k dielectric core into the upper portions of the gate isolation fins, as described herein, reduces (and, in some embodiments, eliminates) void formation in the gate isolation fins. Multigate devices having the proposed gate isolation fins may thus exhibit improved speed, gate-drain capacitance, and/or power efficiency, and thus overall improved performance, compared to a multigate device having a gate isolation fin with an upper portion having a high-k dielectric core. Details of the proposed self-aligned gate cutting techniques for multigate devices and resulting multigate devices are described herein in the following pages.

FIG. 1 is a flow chart of a method 100 for fabricating a multigate device according to various aspects of the present disclosure. In some embodiments, method 100 fabricates a p-type multigate transistor and/or an n-type multigate transistor. At block 110, method 100 includes forming an isolation feature, such as a shallow trench isolation structure, a deep trench isolation structure, other isolation structure, or combinations thereof, in a lower portion of a trench. In some embodiments, the trench is formed between a first active region for a first multigate device and a second active region for a second multigate device. At block 115, method 100 includes forming a gate isolation fin over the isolation feature. The gate isolation fin is formed in an upper portion of the trench. The gate isolation fin has an upper dielectric feature and a lower dielectric feature. The upper dielectric feature has a dielectric core having a first dielectric constant surrounded by a dielectric shell having a second dielectric constant. The second dielectric constant is greater than the first dielectric constant. In some embodiments, the dielectric core includes a low-k dielectric material, and the dielectric shell includes a high-k dielectric material. The gate isolation fin is disposed between the first active region for the first multigate device and the second active region for the second multigate device. In some embodiments, the first multigate device and the second multigate device are formed after forming the gate isolation fin. For example, a first channel layer, a first metal gate, and/or first source/drain features of the first multigate device are formed in the first active region and/or a second channel layer, a second metal gate, and/or second source/drain features of the second multigate device are formed in the second active region after forming the gate isolation fin. Additional steps can be provided before, during, and after method 100, and some of the steps described can be moved, replaced, or eliminated for additional embodiments of method 100. The discussion that follows illustrates various embodiments of multigate-based integrated circuit devices that can be fabricated according to method 100.

FIGS. 2-26 and FIGS. 27A-27E are fragmentary perspective views of a multigate device 200, in portion or entirety, at various fabrication stages (such as those associated with method 100 in FIG. 1) according to various aspects of the present disclosure. As described herein, multigate device 200 includes a first transistor region 202A and a second transistor region 202B, each of which is processed to form at least one transistor therein. In some embodiments, p-type transistors are formed in both first transistor region 202A and second transistor region 202B. In some embodiments, n-type transistors are formed in both first transistor region 202A and second transistor region 202B. In some embodiments, a p-type transistor (or an n-type transistor) in first transistor region 202A is a portion of a first complementary transistor, such as a first complementary metal-oxide semiconductor (CMOS) transistor, and a p-type transistor (or an n-type transistor) in second transistor region 202B is a portion of a second complementary transistor, such as a second CMOS transistor. In some embodiments, an n-type transistor is formed in first transistor region 202A (and can thus be referred to as an n-type transistor region) and a p-type transistor is formed in second transistor region 202B (and can thus be referred to as a p-type transistor region). In some embodiments, first transistor region 202A and second transistor region 202B are a portion of a device region, such as a core region (also referred to as a logic region), a memory region (e.g., a static random access memory (SRAM) region), an analog region, a peripheral region (also referred to as an input/output (I/O) region), a dummy region, and/or other suitable region of a device. The device region can include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. Multigate device 200 can be included in a microprocessor, a memory, and/or other IC device. In some embodiments, multigate device 200 is a portion of an IC chip, a system on chip (SoC), or portion thereof. FIGS. 2-26 and FIGS. 27A-27E have been simplified for the sake of clarity to better understand the inventive concepts of the present disclosure. Additional features can be added in multigate device 200, and some of the features described herein can be replaced, modified, or eliminated in other embodiments of multigate device 200.

Figure 2:
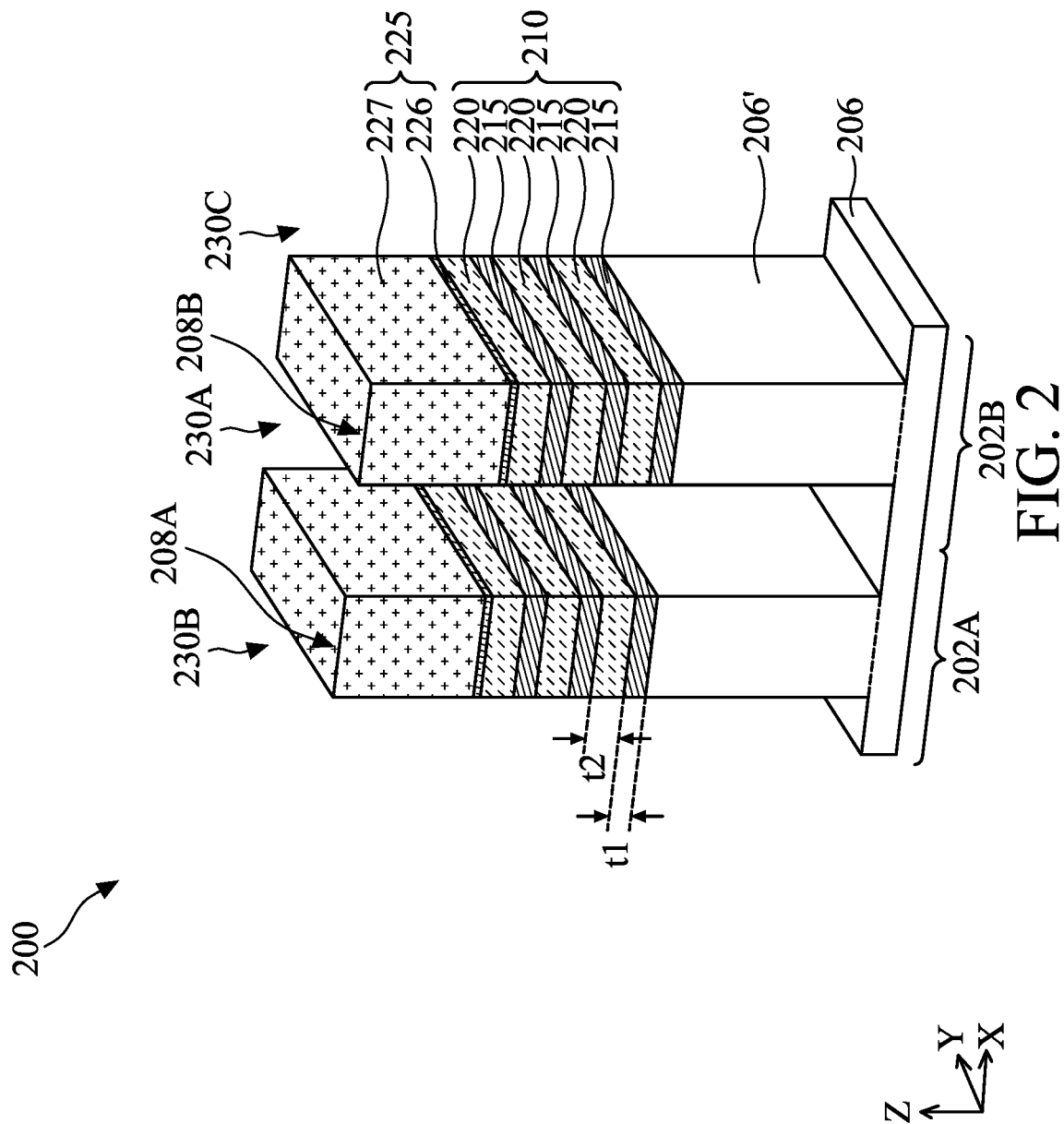
FIGS. 2-26 are fragmentary perspective views of a multigate device, in portion or entirety, at various fabrication stages (such as those associated with the method in FIG. 1) according to various aspects of the present disclosure.

Turning to FIG. 2, a fin fabrication process is performed to form fins extending from a substrate (wafer) 206. For example, a fin 208A and a fin 208B (also referred to as fin structures, fin elements, etc.) extend from substrate 206 after the fin fabrication process. Fin 208A and fin 208B each include a substrate portion (i.e., a fin portion 206' of substrate 206 (also referred to as a substrate extension, a substrate fin portion, an etched substrate portion, etc.)), a semiconductor layer stack portion (i.e., a semiconductor layer stack 210 that includes semiconductor layers 215 and semiconductor layers 220) disposed over the substrate portion, and a patterning layer portion (i.e., a patterning layer 225 that includes a pad layer 226 and a mask layer 227) disposed over the semiconductor layer stack portion. Fin 208A and fin 208B each extend substantially parallel to one another along a y-direction, having a length in the y-direction, a width in an x-direction, and a height in a z-direction.

In some embodiments, the fin fabrication process includes forming a semiconductor layer stack over substrate 206 (for example, depositing semiconductor layers 215 and semiconductor layers 220 over substrate 206) and then performing a lithography and/or etching process to pattern the semiconductor layer stack and substrate 206 to form fins 208A, 208B. In some embodiments, semiconductor layers 215 and semiconductor layers 220 are epitaxially grown in the depicted interleaving and alternating configuration. For example, a first one of semiconductor layers 215 is epitaxially grown on substrate 206, a first one of semiconductor layers 220 is epitaxially grown on the first one of semiconductor layers 220, a second one of semiconductor layers 215 is epitaxially grown on the first one of semiconductor layers 220, and so on until semiconductor layer stacks 210 have a desired number of semiconductor layers 215 and semiconductor layers 220. In such embodiments, semiconductor layers 215 and semiconductor layers 220 can be referred to as epitaxial semiconductor layers. In some embodiments, epitaxial growth of semiconductor layers 215 and semiconductor layers 220 is achieved by molecular beam epitaxy (MBE), chemical vapor deposition (CVD), metalorganic chemical vapor deposition (MOCVD), other suitable epitaxial growth process, or combinations thereof. The lithography process can include forming a resist layer over the semiconductor layer stack (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of the semiconductor layer stack using the patterned resist layer as an etch mask. In some embodiments, the patterned resist layer is formed over a mask layer disposed over the semiconductor layer stack, a first etching process removes portions of the mask layer to form patterning layer 225 (i.e., a patterned hard mask layer), and a second etching process removes portions of the semiconductor layer stack to form semiconductor layer stack 210 using patterning layer 225 as an etch mask. The etching process can include a dry etch, a wet etch, other suitable etch, or combinations thereof. In some embodiments, the etching process is a reactive ion etch (RIE). After the etching process, the patterned resist layer is removed, for example, by a resist stripping process or other suitable process. Alternatively, fins 208A, 208B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Such processes can also provide fins 208A, 208B with patterning layer 225, semiconductor layer stack 210, and fin portion 206' as depicted in FIG. 2. In some embodiments, directed self-assembly (DSA) techniques are implemented while patterning semiconductor layer stack 210. Further, in some embodiments, the exposure process can implement maskless lithography, electron-beam (e-beam) writing, and/or ion-beam writing for patterning the resist layer.

In the depicted embodiment, substrate 206 includes silicon. In some embodiments, substrate 206 includes an elementary semiconductor, such as silicon and/or germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, substrate 206 is a semiconductor-on-insulator substrate, such as a silicon-on-insulator (SOI) substrate, a silicon germanium-on-insulator (SGOI) substrate, or a germanium-on-insulator (GOI) substrate. Substrate 206 (including fin portions 206') can include various doped regions, such as p-type doped regions (referred to as p-wells), n-type doped regions (referred to as n-wells), or combinations thereof. In an example, fin portions 206' of fins 208A, 208B include p-wells, such as where n-type transistors are formed in first transistor region 202A and second transistor region 202B. In another example, fin portions 206' of fins 208A, 208B include n-wells, such as where p-type transistors are formed in first transistor region 202A and second transistor region 202B. In yet another example, fin portion 206' of fin 208A can include a p-well and fin portion 206' of fin 208B can include an n-well, such as where an n-type transistor is formed in first transistor region 202A and a p-type transistor is formed in second transistor region 202B. In yet another example, fin portion 206' of fin 208A can include an n-well and fin portion 206' of fin 208B can include a p-well, such as where a p-type transistor is formed in first transistor region 202A and an n-type transistor is formed in second transistor region 202B. The n-wells include n-type dopants, such as phosphorus, arsenic, other n-type dopant, or combinations thereof. The p-wells include p-type dopants, such as boron, indium, other p-type dopant, or combinations thereof. In some embodiments, doped regions in substrate 206 (including fin portions 206') include a combination of p-type dopants and n-type dopants. The various doped regions can be formed directly on and/or in substrate 206, for example, providing a p-well structure, an n-well structure, a dual-well structure, a raised structure, or combinations thereof. An ion implantation process, a diffusion process, and/or other suitable doping process can be performed to form the various doped regions.

Each semiconductor layer stack 210 is disposed over a respective fin portion 206' of substrate 206 and includes semiconductor layers 215 and semiconductor layers 220 stacked vertically (e.g., along the z-direction) in an interleaving and/or alternating configuration from a top surface of substrate 206. A composition of semiconductor layers 215 is different than a composition of semiconductor layers 220 to achieve etching selectivity and/or different oxidation rates during subsequent processing. In some embodiments, semiconductor layers 215 have a first etch rate to an etchant and semiconductor layers 220 have a second etch rate to the etchant, where the second etch rate is different than the first etch rate. In some embodiments, semiconductor layers 215 have a first oxidation rate and semiconductor layers 220 have a second oxidation rate, where the second oxidation rate is different than the first oxidation rate. In the depicted embodiment, semiconductor layers 215 and semiconductor layers 220 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 215 include silicon germanium and semiconductor layers 220 include silicon, a silicon etch rate of semiconductor layers 220 is less than a silicon germanium etch rate of semiconductor layers 215. In some embodiments, semiconductor layers 215 and semiconductor layers 220 include the same material but with different constituent atomic percentages to achieve the etching selectivity and/or different oxidation rates. For example, semiconductor layers 215 and semiconductor layers 220 can include silicon germanium, where semiconductor layers 215 have a first silicon atomic percent and/or a first germanium atomic percent and semiconductor layers 220 have a second, different silicon atomic percent and/or a second, different germanium atomic percent. The present disclosure contemplates that semiconductor layers 215 and semiconductor layers 220 include any combination of semiconductor materials that provides desired etching selectivity, desired oxidation rate differences, and/or desired performance characteristics (e.g., materials that maximize current flow), including any of the semiconductor materials disclosed herein.

As described further below, semiconductor layers 220 or portions thereof form channel regions of multigate device 200. In the depicted embodiment, each semiconductor layer stack 210 includes three semiconductor layers 215 and three semiconductor layers 220 configured to form three semiconductor layer pairs disposed over substrate 206, each semiconductor layer pair having a respective semiconductor layer 215 and a respective semiconductor layer 220. After undergoing subsequent processing, such configuration will result in multigate device 200 having three channels. However, the present disclosure contemplates embodiments where semiconductor layer stack 210 includes more or less semiconductor layers, for example, depending on a number of channels desired for multigate device 200 and/or design requirements of multigate device 200. For example, semiconductor layer stacks 210 can include two to ten semiconductor layers 215 and two to ten semiconductor layers 220. In furtherance of the depicted embodiment, semiconductor layers 215 have a thickness t1 and semiconductor layers 220 have a thickness t2, where thickness t1 and thickness t2 are chosen based on fabrication and/or device performance considerations for multigate device 200. For example, thickness t1 can be configured to provide a desired distance (or gap) between adjacent channels of multigate device 200 (e.g., between semiconductor layers 220), thickness t2 can be configured to provide desired thickness of channels of multigate device 200, and thickness t1 and thickness t2 can be configured to optimize performance of multigate device 200. In some embodiments, semiconductor layers 220 include n-type dopants and/or p-type dopants depending on their corresponding transistor region. In some embodiments, semiconductor layers 220 in first transistor region 202A can include p-type dopants and semiconductor layers 220 in second transistor region 202B can include n-type dopants, or vice versa.

Figure 3:
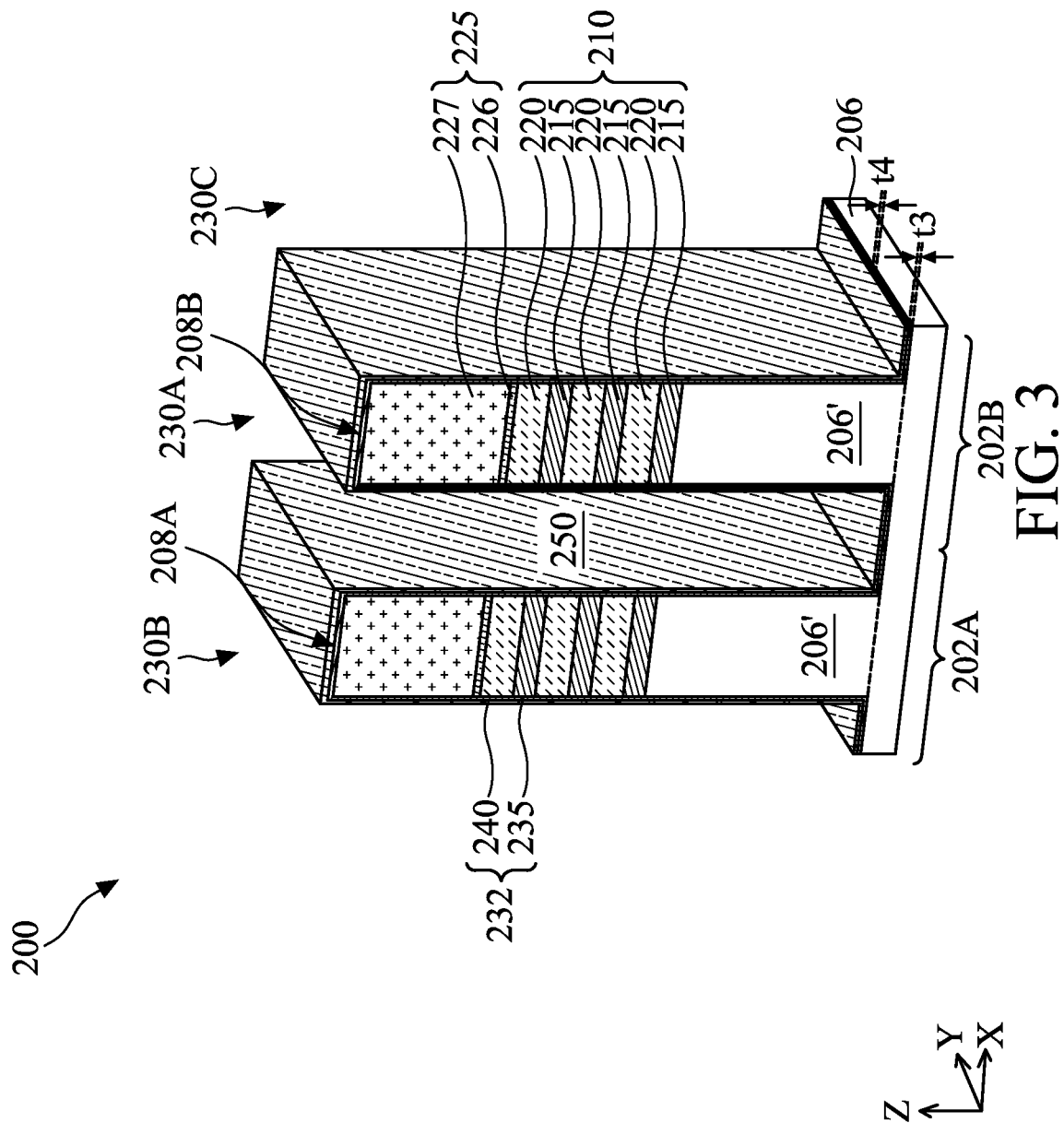

Fin 208A is disposed between a trench 230A and a trench 230B, and fin 208B is disposed between trench 230A and a trench 230C. Trench 230A is formed between fin 208A and fin 208B. For example, trench 230A has a sidewall formed by fin 208A, a sidewall formed by fin 208B, and a bottom formed by substrate 206 that extends between the sidewalls. Turning to FIG. 3, a liner layer 232 that partially fills trenches 230A-230C is formed over multigate device 200. For example, a dielectric liner 235 is formed over fins 208A, 208B and substrate 206, and a silicon liner 240 is formed over dielectric liner 235, where dielectric liner 235 and silicon liner 240 form liner layer 232 partially filling trenches 230A-230C. Dielectric liner 235 and silicon liner 240 cover substrate 206 and fins 208A, 208B, such that dielectric liner 235 and silicon liner 240 cover sidewalls and bottoms of trenches 230A-230C. In some embodiments, fabrication includes depositing dielectric liner 235 having a thickness t3 over multigate device 200 by atomic layer deposition (ALD) and depositing silicon liner 240 having a thickness t4 over dielectric liner 235 by ALD. In some embodiments, thickness t3 and thickness t4 are substantially uniform over various surfaces of multigate device 200. For example, thickness t3 and thickness t4 along sidewalls of trenches 230A-230C (i.e., over sidewalls of fins 208A, 208B) are, respectively, substantially the same as thickness t3 and thickness t4 along bottoms of trenches 230A-230C (i.e., over top surfaces of substrate 206) and thickness t3 and thickness t4 along top surfaces of fins 208A, 208B. In some embodiments, thickness t3 is about 0.5 nm to about 2.5 nm. In some embodiments, thickness t4 is about 1 nm to about 4.5 nm. In some embodiments, dielectric liner 235 and/or silicon liner 240 is formed by CVD, physical vapor deposition (PVD), high density plasma CVD (HDPCVD), MOCVD, remote plasma CVD (RPCVD), plasma enhanced CVD (PECVD), low-pressure CVD (LPCVD), atomic layer CVD (ALCVD), atmospheric pressure CVD (APCVD), sub-atmospheric vapor deposition (SAVCD), other suitable methods, or combinations thereof. In some embodiments, dielectric liner 235 includes an oxygen-comprising dielectric material, such as a dielectric material that includes oxygen in combination with silicon, carbon, and/or nitrogen, and thus can be referred to as an oxide liner. For example, dielectric liner 235 includes silicon oxide (e.g., $SiO_2$), silicon oxynitride (SiON), and/or silicon oxycarbonitride (SiOCN). In some embodiments, dielectric liner 235 and/or silicon liner 240 includes n-type dopants and/or p-type dopants.

Figure 4:
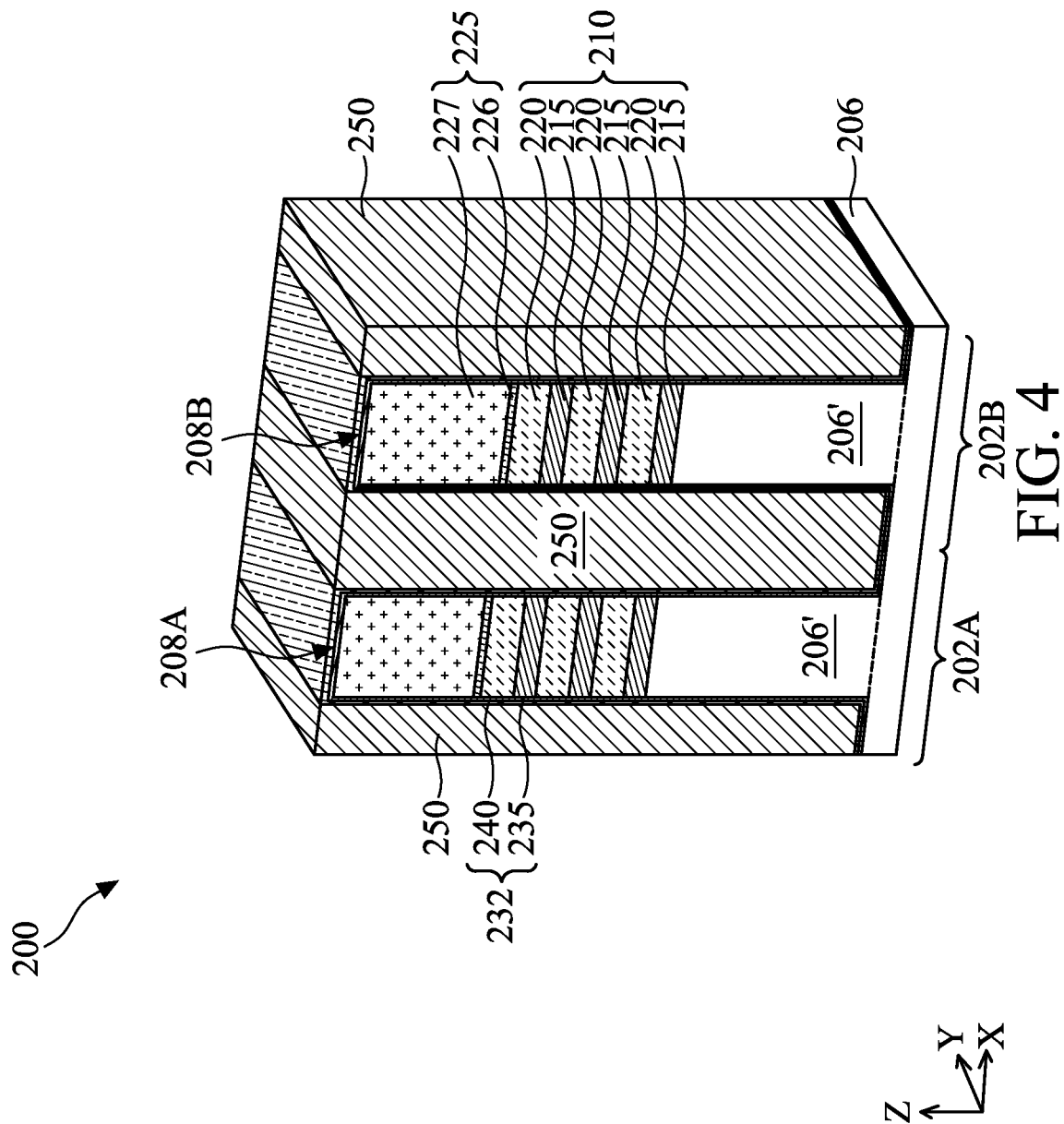

Turning to FIG. 4, remainders of trenches 230A-230C are filled with oxide layers 250. For example, a deposition process and a planarization process are performed to form oxide layers 250 over silicon liner 240 and fill remainders of trenches 230A-230C. In some embodiments, forming oxide layers 250 includes depositing an oxide material over multigate device 200, where the oxide material overfills trenches 230A-230C (e.g., a thickness of the oxide material is greater than a height of fins 208A, 208B), and performing a planarization process on the oxide material, such as a chemical mechanical polishing (CMP) process, to reduce the thickness of the oxide material. In some embodiments, silicon liner 240 functions as a planarization (e.g., CMP) stop layer, such that the planarization process is performed until reaching and exposing portions of silicon liner 240 disposed over top surfaces of fins 208A, 208B. Accordingly, after the planarization process, the thickness of the oxide material is substantially equal to a sum of a height of fins 208A, 208B, thickness t3 of dielectric liner 235 disposed over top surfaces of fins 208A, 208B, and thickness t4 of silicon liner 240 disposed over the top surfaces of fins 208A, 208B. The planarization process thus removes any oxide material disposed over the top surfaces of fins 208A-208D. In some embodiments, top surfaces of oxide layers 250 and silicon liner 240 are substantially planar after the planarization process. In some embodiments, the oxide material is deposited by flowable CVD (FCVD), which can include depositing a flowable oxide material (for example, in a liquid state) over multigate device 200 and converting the flowable oxide material into a solid oxide material by an annealing process. The flowable oxide material can flow into trenches 230A-230C and conform to exposed surfaces of multigate device 200, enabling void free filling of trenches 230A-230C. In some embodiments, the flowable oxide material is a flowable silicon-and-oxygen comprising material, and the annealing process converts the flowable silicon-and-oxygen material into a silicon-and-oxygen containing layer, such as a silicon oxide layer. Oxide layers 250 may thus be referred to as silicon oxide layers. In some embodiments, the annealing process is a thermal annealing that heats multigate device 200 to a temperature that facilitates conversion of the flowable oxide material into the solid oxide material. In some embodiments, the annealing process exposes the flowable oxide material to UV radiation. In some embodiments, oxide material is deposited by a high aspect ratio deposition (HARP) process. In some embodiments, oxide material is deposited by HDPCVD. In some embodiments, an annealing process is performed after the planarization process to further cure and/or densify oxide layers 250.

Figure 5:
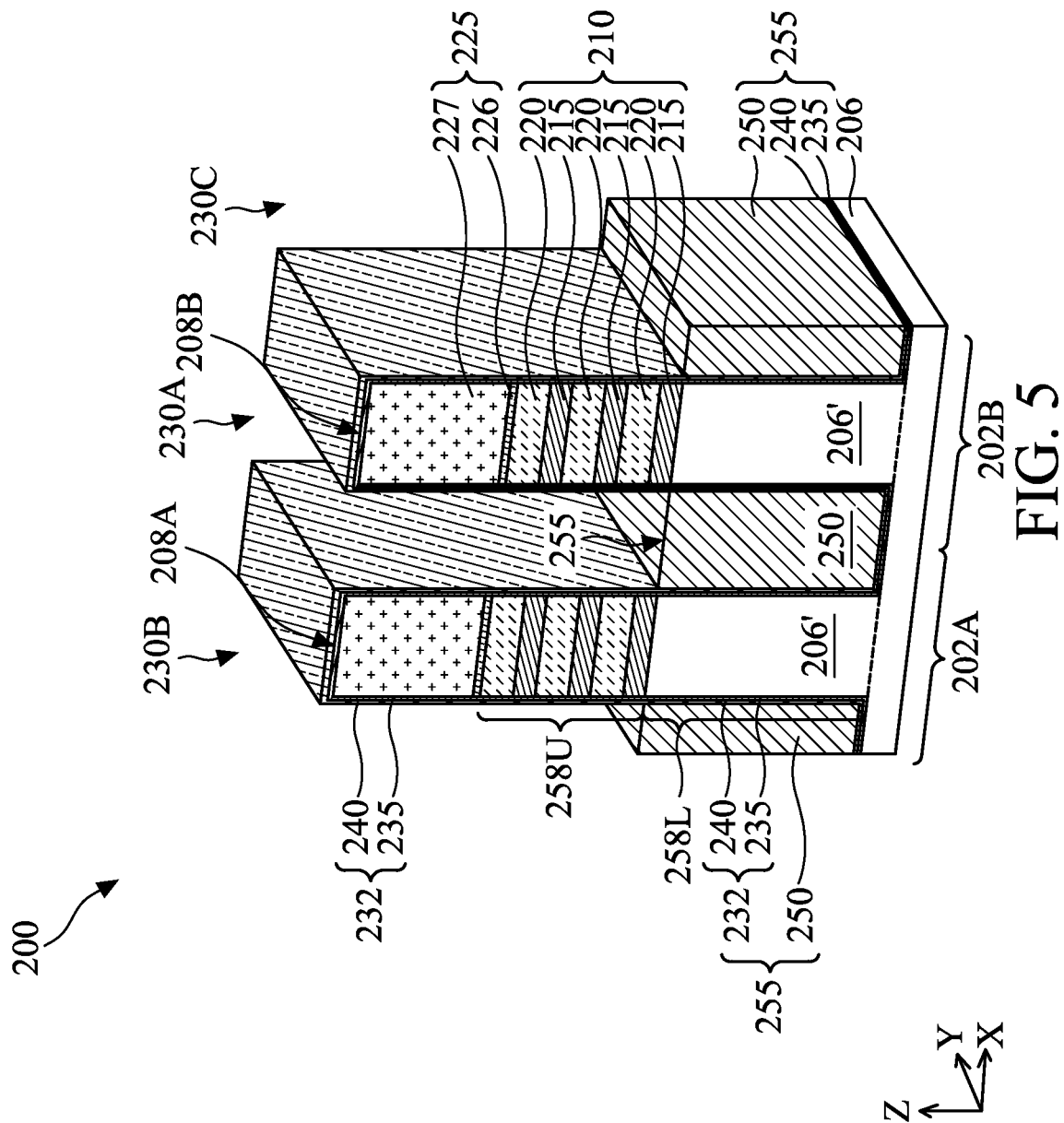

Turning to FIG. 5, oxide layers 250 are recessed (for example, by an etching process) to form isolation features 255, such that fins 208A, 208B extend (protrude) from oxide layers 250. In the depicted embodiment, oxide layers 250 surround a bottom portion of fins 208A, 208B, thereby providing fins 208A, 208B with upper fin active regions 258U (e.g., portions of fins 208A, 208B that extend from top surfaces of oxide layers 250) and lower fin active regions 258L (e.g., portions of fins 208A, 208B surrounded by oxide layers 250). In some embodiments, an etching process selectively removes oxide layers 250 with respect to silicon liner 240. In other words, the etching process substantially removes oxide layers 250 but does not remove, or does not substantially remove, silicon liner 240. For example, an etchant is selected for the etch process that etches silicon oxide (i.e., oxide layers 250) at a higher rate than silicon (i.e., silicon liner 240) (i.e., the etchant has a high etch selectivity with respect to silicon oxide). The etching process is a dry etch, a wet etch, other suitable etching process, or combinations thereof. In some embodiments, the etching process uses a patterned mask layer as an etch mask, where the patterned mask layer covers silicon liner 240 but exposes oxide layers 250.

After recessing oxide layers 250, lower portions of trenches 230A-230C are filled with oxide layers 250, silicon liner 240, and dielectric liner 235 while upper portions of trenches 230A-230C are partially filled with silicon liner 240 and dielectric liner 235. Isolation features 255 are formed from oxide layers 250, silicon liner 240, and dielectric liner 235, where oxide layers 250 are disposed on silicon liner 240, silicon liner 240 is disposed on dielectric liner 235, and dielectric liner 235 is disposed on sidewalls of lower fin active regions 258L. Oxide layers 250 can be referred to as oxide layers, bulk dielectrics, and/or bulk dielectric layers of isolation features 255. Isolation features 255 electrically isolate active device regions and/or passive device regions of multigate device 200 from each other, such as first transistor region 202A and second transistor region 202B, first transistor region 202A from other active device regions and/or passive device regions, and second transistor region 202B from other active device regions and/or passive device regions. Various dimensions and/or characteristics of isolation features 255 can be configured during the processing associated with FIGS. 2-5 to achieve shallow trench isolation (STI) structures, deep trench isolation (DTI) structures, local oxidation of silicon (LOCOS) structures, other suitable isolation structures, or combinations thereof. In the depicted embodiment, isolation features 255 are STIs. In some embodiments, an etching process recesses oxide layers 250 until achieving a target height of upper fin active regions 258U. For example, the etching process proceeds until reaching fin portions 206' of fins 208A, 208B, such that semiconductor layer stacks 210 form upper fin active regions 258U. In some embodiments, such as depicted, top surfaces of fin portions 206' are substantially planar with top surfaces of oxide layers 250 after the etching process. In some embodiments, fin portions 206' are partially exposed by the etching process, such that top surfaces of fin portions 206' are higher than top surfaces of oxide layers 250 relative to the top surface of substrate 206 after the etching process. In some embodiments, semiconductor layer stacks 210 are partially, instead of fully, exposed by the etching process, such that top surfaces of fin portions 206' are lower than top surfaces of oxide layers 250 relative to the top surface of substrate 206 after the etching process.

Figure 6:
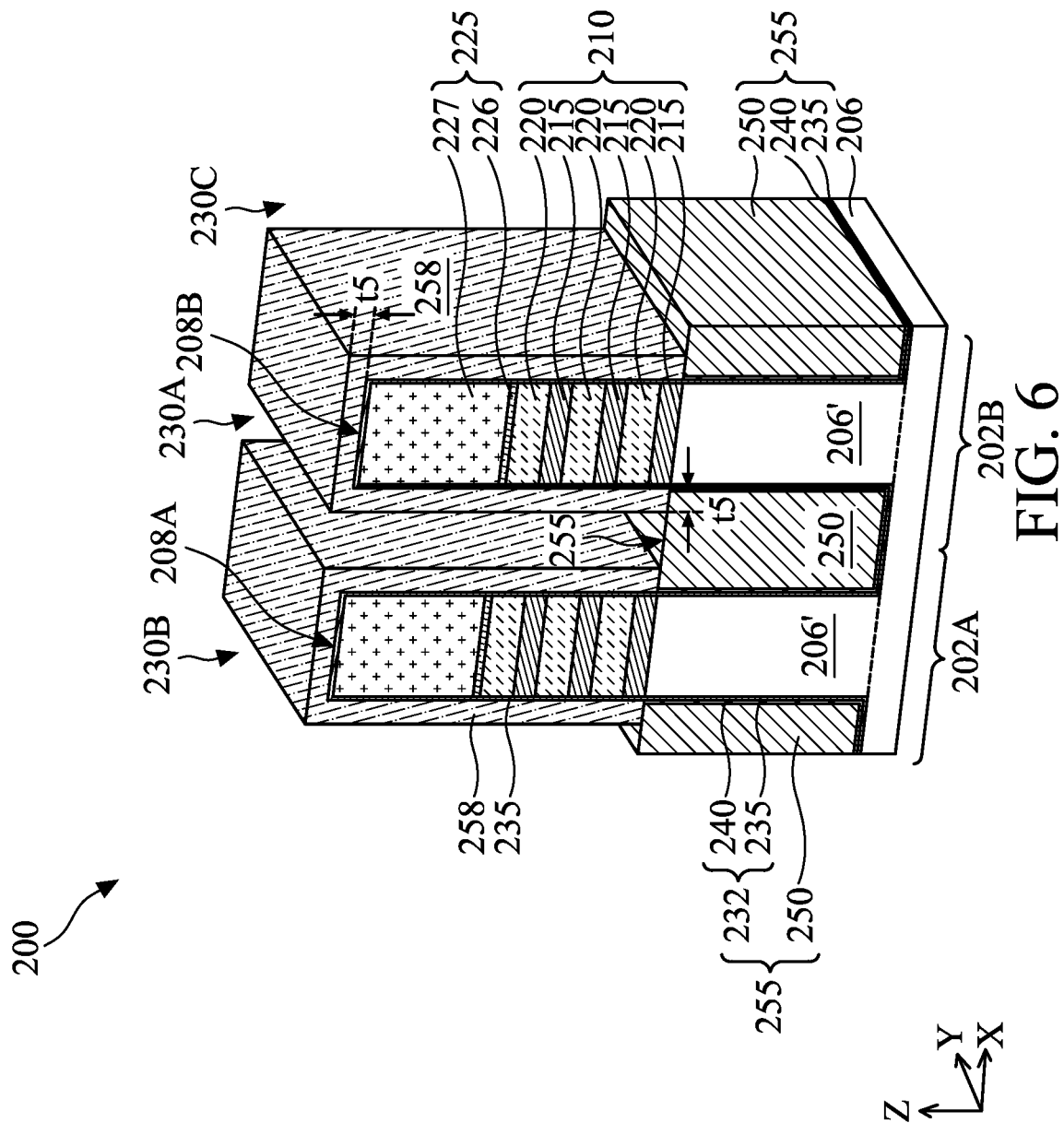

Turning to FIG. 6, silicon germanium sacrificial layers 258 are formed over fins 208A, 208B. In the depicted embodiment, silicon germanium sacrificial layers 258 are formed over top surfaces and sidewalls of upper fin active regions 258U of fins 208A, 208B, such that silicon germanium sacrificial layers 258 wrap upper fin active regions 258U. In furtherance of the depicted embodiment, upper portions of trenches 230A-230C are partially filled with silicon germanium sacrificial layers 258, which have a thickness t5. In some embodiments, thickness t5 is about 3.5 nm to about 12 nm. Thickness t5 may be selected depending on desired inner spacer thicknesses of multigate device 200. In some embodiments, exposed portions of silicon liner 240 are converted into silicon germanium sacrificial layers 258. For example, a deposition process is performed that selectively grows silicon germanium layers over exposed portions of silicon liner 240 (i.e., semiconductor surfaces) without growing the silicon germanium layers on exposed portions of oxide layers 250 (i.e., dielectric surfaces), and an annealing process is performed that drives (diffuses) germanium from the silicon germanium layers into the exposed portions of silicon liner 240, thereby causing the exposed portions of the silicon liner 240 to become a part of the silicon germanium layers. In some embodiments, the deposition process is an epitaxy process that uses CVD deposition techniques (for example, LPCVD, VPE, and/or UHV-CVD), MBE, other suitable epitaxial growth processes, or combinations thereof. The epitaxy process can use gaseous precursors and/or liquid precursors (e.g., a silane precursor and a germanium precursor), which interact with the composition of silicon liner 240. In some embodiments, the silicon germanium layers can be exposed to an oxidizing ambient (e.g., oxygen), where silicon from the silicon germanium layers reacts with oxygen to form a thin outer silicon oxide layer and germanium from the silicon germanium layers diffuses into and reacts with silicon in the exposed portions of silicon liner 240, thereby causing the exposed portions of the silicon liner 240 to become a part of the silicon germanium layers. Such process can be referred to as a silicon germanium condensation process. A suitable cleaning process and/or etching process can be implemented to remove the thin silicon oxide layer. Silicon germanium sacrificial layers 258 can also be referred to as silicon germanium cladding layers, silicon germanium helmets, and/or a silicon germanium protection layers.

Figure 7:
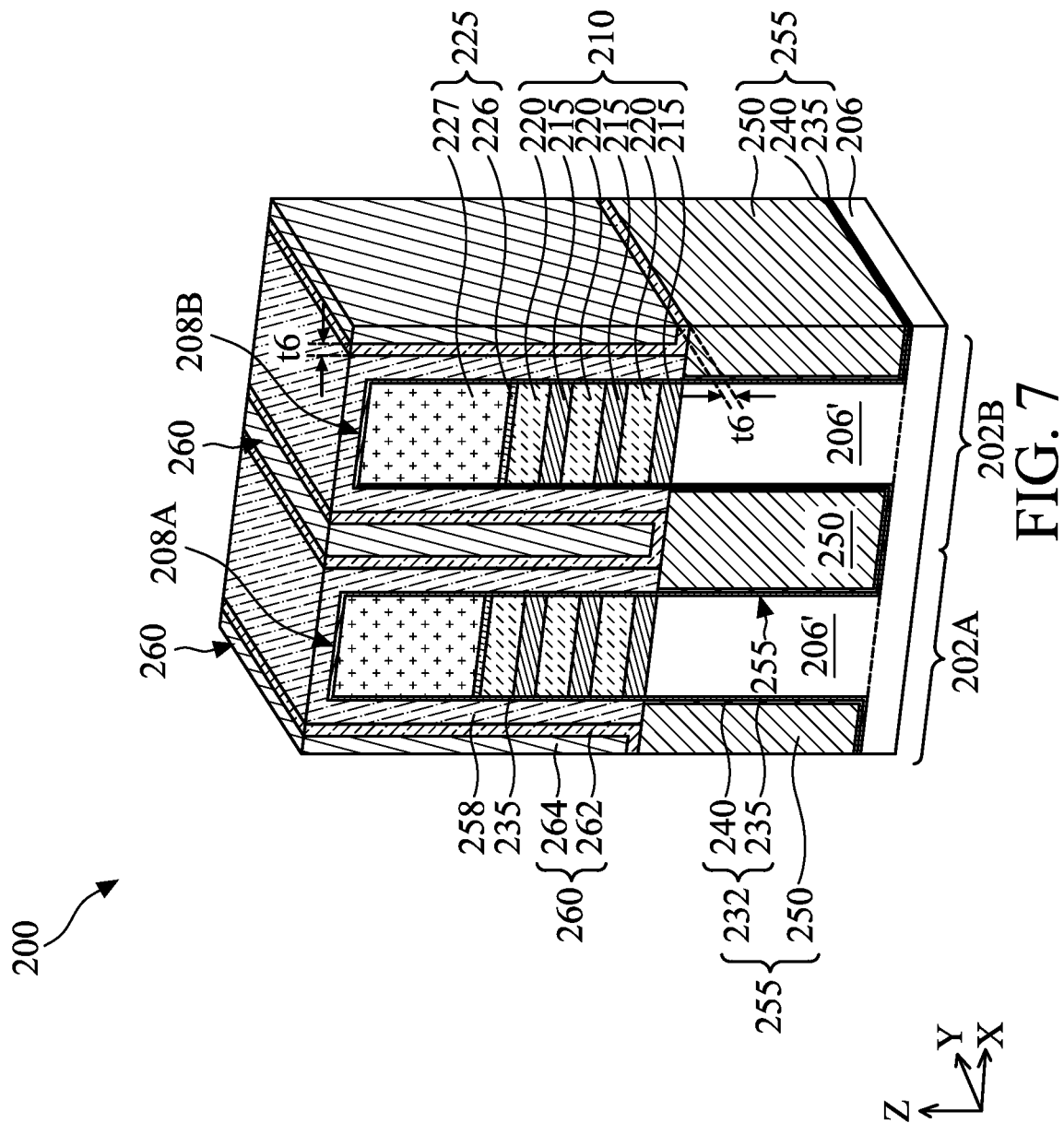

Turning to FIG. 7, remainders of upper portions of trenches 230A-230C are filled with dielectric features 260, each of which includes a dielectric liner 262 and an oxide layer 264 disposed over dielectric liner 262. In the depicted embodiment, dielectric liners 262 include a dielectric material having a dielectric constant that is less than about 7.0 (k≤7.0). For purposes of the present disclosure, such dielectric materials are referred to as low-k dielectric materials, and dielectric liners 262 can be referred to as low-k dielectric liners. In some embodiments, dielectric liners 262 include a dielectric material having a dielectric constant of about 3.0 to about 7.0. In some embodiments, dielectric liners 262 include a silicon-comprising dielectric material, such as a dielectric material that includes silicon in combination with oxygen, carbon, and/or nitrogen. For example, dielectric liners 262 include silicon oxide, silicon nitride, silicon carbide, silicon carbonitride, silicon oxynitride, silicon oxycarbide, silicon oxycarbonitride, or combinations thereof. In some embodiments, dielectric liners 262 include n-type dopants and/or p-type dopants. For example, dielectric liners 262 can be boron-doped nitride liners. In some embodiments, dielectric liners 262 include a dielectric material having a dielectric constant that is less than a dielectric constant of silicon dioxide ($SiO_2$) (k≈3.9), such as fluorine-doped silicon oxide (often referred to as fluorosilicate glass (FSG)), carbon-doped silicon oxide (often referred to as carbon-doped FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other low-k dielectric material, or combinations thereof. In some embodiments, dielectric liners 262 include boron silicate glass (BSG), phosphosilicate glass (PSG), and/or boron-doped phosphosilicate glass (BPSG). In some embodiments, oxide layers 264 are similar to oxide layers 250. For example, oxide layers 264 include silicon and oxygen, such as silicon oxide layers.

In some embodiments, dielectric features 260 are formed over isolation features 255 by depositing a dielectric layer over multigate device 200, where the dielectric layer partially fills upper portions of trenches 230A-230C; depositing an oxide material over the dielectric layer, where the oxide material fills remainders of upper portions of trenches 230A-230C; and performing a planarization process, such as CMP, to remove the oxide material and/or the dielectric layer disposed over top surfaces of silicon germanium sacrificial layers 258. In such embodiments, silicon germanium sacrificial layers 258 function as a planarization (e.g., CMP) stop layer, such that the planarization process is performed until reaching and exposing silicon germanium sacrificial layers 258. A remainder of the oxide material and the dielectric layer form dielectric liners 262 and oxide layers 264, which form dielectric features 260, as depicted in FIG. 7. Accordingly, dielectric features 260, silicon germanium sacrificial layers 258, and dielectric liner 235 combine to fill upper portions of trenches 230A-230C, and isolation features 255 fill lower portions of trenches 230A-230C. In the depicted embodiment, dielectric liners 262 have u-shaped cross-sectional profiles, such that dielectric liners 262 wrap oxide layers 264. For example, dielectric liners 262 are disposed along sidewalls and bottoms of oxide layers 264 and separate oxide layers 264 from silicon germanium sacrificial layers 258 and isolation features 255. Dielectric liners 262 have a thickness t6. In some embodiments, thickness t6 is about 2.5 nm to about 7 nm. In some embodiments, thickness t6 is substantially uniform over various surfaces of multigate device 200. For example, thickness t6 along sidewalls of upper portions of trenches 230A-230C (i.e., over sidewalls of silicon germanium sacrificial layers 258) is substantially the same as thickness t6 along bottoms of upper portions of trenches 230A-230C (i.e., over top surfaces of isolation features 255). In some embodiments, the dielectric layer is deposited by ALD. In some embodiments, the dielectric layer is deposited by LPCVD. In some embodiments, the dielectric layer is formed by CVD, PVD, HDPCVD, MOCVD, RPCVD, PECVD, APCVD, SAVCD, other suitable deposition processes, or combinations thereof. In some embodiments, the oxide material is deposited by FCVD, HPCVD, HARP, CVD, other suitable deposition process, or combinations thereof. In the depicted embodiment, the oxide material is deposited by FCVD to minimize void formation within oxide layers 264.

Figure 8:
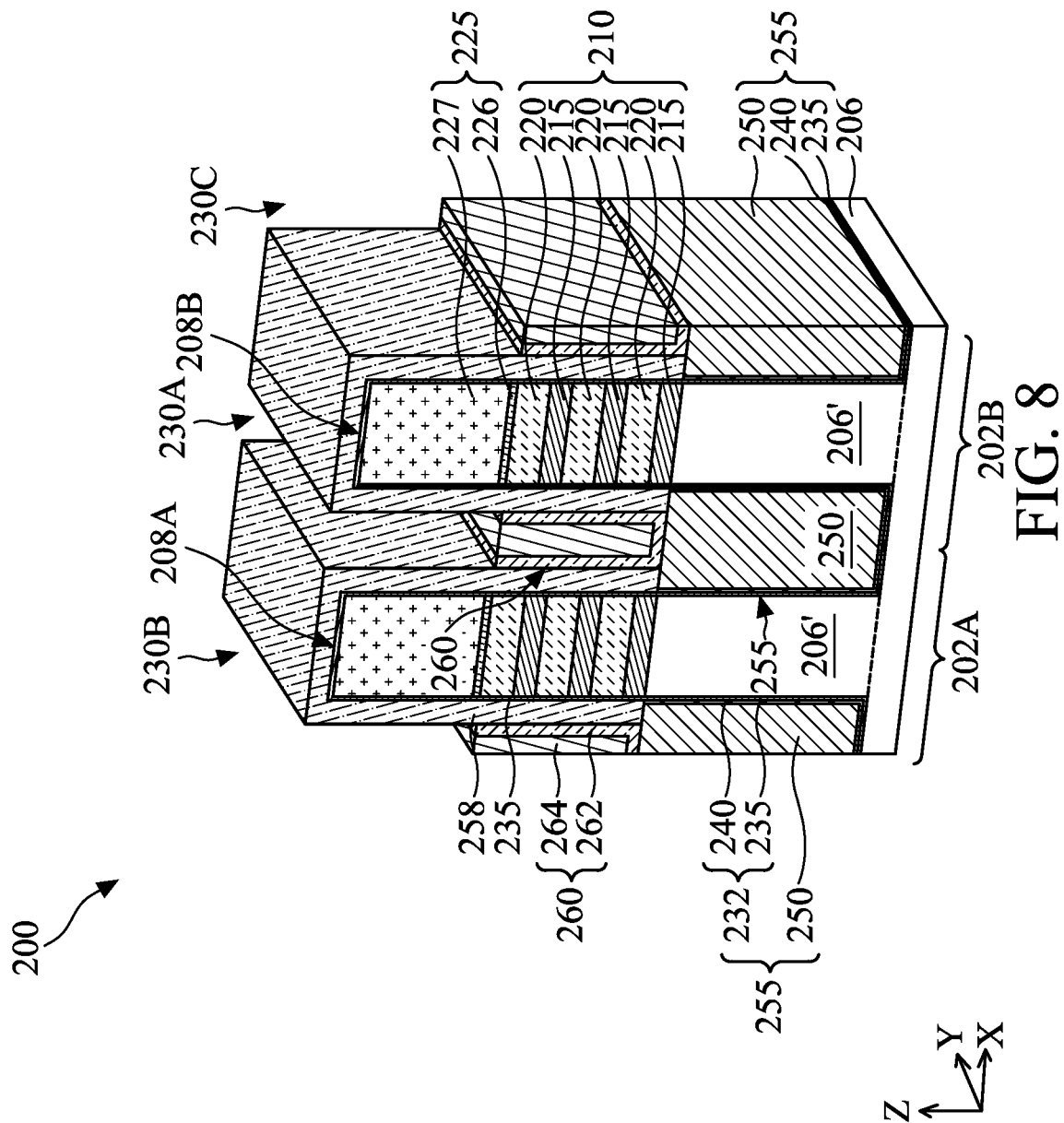

Turning to FIG. 8, dielectric features 260 are partially removed from trenches 230A-230C. For example, dielectric features 260 are recessed to expose portions of silicon germanium sacrificial layers 258 that cover patterning layer 225, such as top surfaces and sidewalls of patterning layer 225. After recessing, dielectric features 260 partially fill upper portions of trenches 230A-230C (i.e., fill lower portions of upper portions of trenches 230A-230C). In some embodiments, an etching process recesses dielectric features 260 until reaching semiconductor layer stacks 210 of fins 208A, 208B. For example, top surfaces of semiconductor layer stacks 210 (i.e., top surfaces of topmost semiconductor layers 220) are substantially planar with top surfaces of dielectric features 260 after the etching process. In some embodiments, the etching process recesses dielectric features 260 beyond semiconductor layer stacks 210, such that top surfaces of dielectric features 260 are lower than top surfaces of semiconductor layer stacks 210 relative to the top surface of substrate 206. The etching process selectively removes dielectric liners 262 and oxide layers 264 with respect to silicon germanium sacrificial layers 258. In other words, the etching process substantially removes dielectric liners 262 and oxide layers 264 but does not remove, or does not substantially remove, silicon germanium sacrificial layers 258. For example, an etchant is selected for the etch process that etches silicon-comprising dielectric materials (i.e., dielectric liners 262 and oxide layers 264) at a higher rate than silicon germanium (i.e., silicon germanium sacrificial layers 258) (i.e., the etchant has a high etch selectivity with respect to silicon-comprising dielectric materials). The etching process is a dry etch, a wet etch, other suitable etching process, or combinations thereof. In some embodiments, a dry etch uses an etch gas that includes $CF_4$ and $H_2$ to selectively etch silicon-comprising dielectric materials (i.e., dielectric liners 262 and oxide layers 264) with respect to silicon germanium (i.e., silicon germanium sacrificial layers 258). In some embodiments, the dry etch uses a carrier gas to deliver the etch gas. The carrier gas includes nitrogen, argon, helium, xenon, other suitable carrier gas constituent, or combinations thereof. In some embodiments, the etching process includes multiple steps, such as a first etch step that uses a first etchant to recess oxide layers 264 and a second etch step that uses a second etchant to recess dielectric liners 262. In some embodiments, the etching process uses a patterned mask layer as an etch mask, where the patterned mask layer covers silicon germanium sacrificial layers 258 but has openings therein that expose dielectric liners 262 and oxide layers 264.

Figure 9:
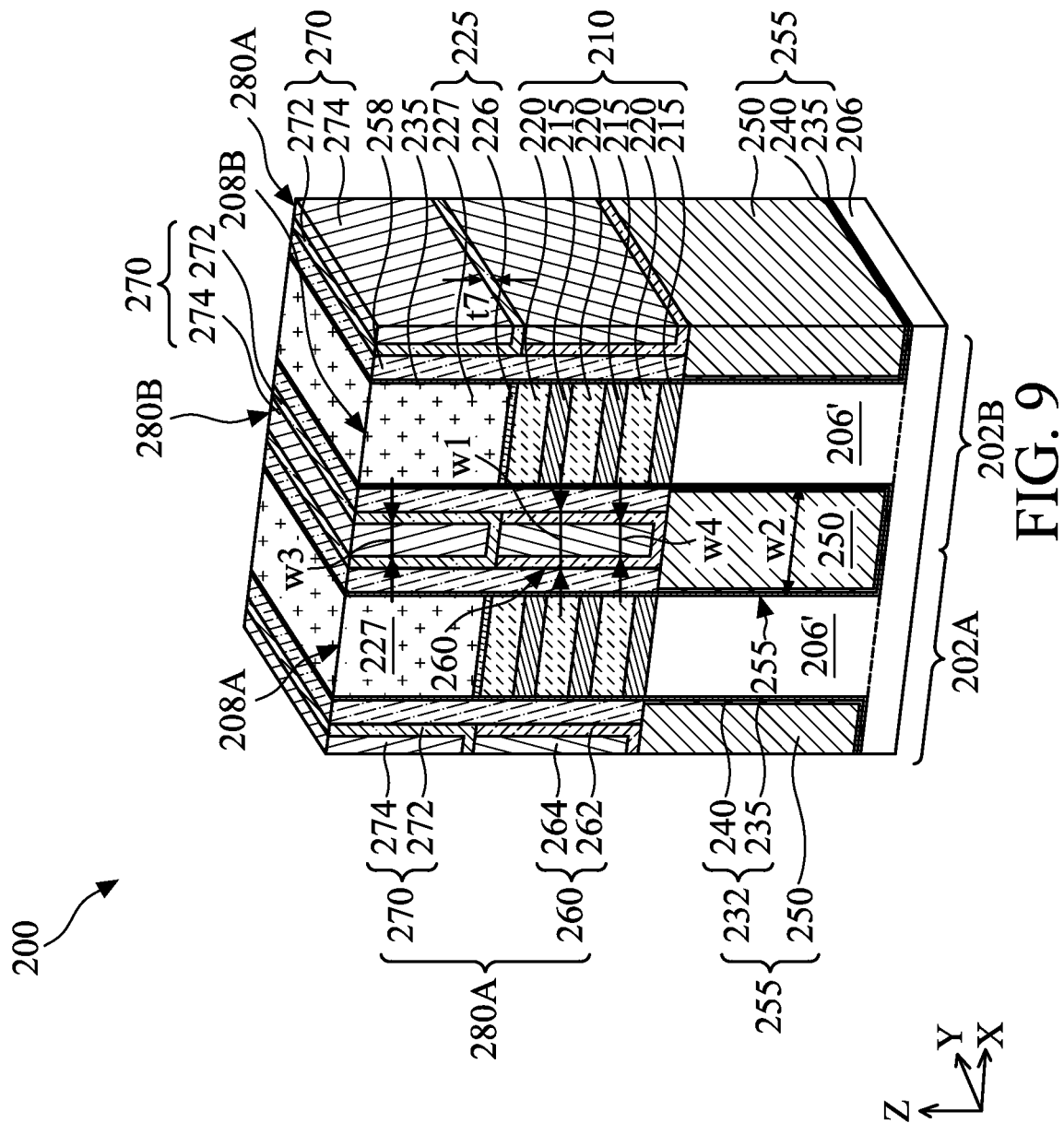

Turning to FIG. 9, dielectric features 270 are formed over dielectric features 260 to fill remainders of upper portions of trenches 230A-230C. Each of dielectric features 270 includes a dielectric liner 272 and a dielectric layer 274. Dielectric liners 272 have u-shaped cross-sectional profiles, such that dielectric liners 272 wrap dielectric layers 274. For example, dielectric liners 272 are disposed along sidewalls and bottoms of dielectric layers 274 and separate dielectric layers 274 from silicon germanium sacrificial layers 258 and dielectric features 260. Dielectric liners 272 have a thickness t7. In some embodiments, thickness t7 is about 1 nm to about 6 nm. In some embodiments, thickness t7 is substantially uniform. For example, thickness t7 along sidewalls of dielectric layers 264 is substantially the same as thickness t7 along bottoms of dielectric layers 264. In some embodiments, thickness t7 along sidewalls of dielectric layers 264 may be different than thickness t7 along bottoms of dielectric layers 264. In some embodiments, thickness t7 is substantially the same as thickness t6 of dielectric liners 262. In some embodiments, thickness t7 is greater than thickness t6. In some embodiments, thickness t7 is less than thickness t6. In some embodiments, dielectric features 270 are formed over dielectric features 260 by depositing a first dielectric layer having a first dielectric constant over multigate device 200, where the first dielectric layer partially fills remainders of upper portions of trenches 230A-230C; depositing a second dielectric layer having a second dielectric constant over the first dielectric layer, where the second dielectric layer fills remainders of upper portions of trenches 230A-230C and the second dielectric constant is less than the first dielectric constant; and performing a planarization process, such as CMP, to remove portions of the second dielectric layer, the first dielectric layer, and/or silicon germanium sacrificial layers 258 that are disposed over top surfaces of fins 208A, 208B. For example, patterning layers 225 can function as a planarization stop layer, such that the planarization process is performed until reaching and exposing patterning layers 225 of fins 208A, 208B. In such embodiments, top surfaces of dielectric features 270 (for example, top surfaces of dielectric liners 272 and dielectric layers 274), top surfaces of patterning layers 225, and top surfaces of silicon germanium sacrificial layers 258 may be substantially planar. A remainder of the second dielectric layer and the first dielectric layer forms dielectric liners 272 and dielectric layers 274, respectively, as depicted in FIG. 9. In some embodiments, the first dielectric layer and/or the second dielectric layer are formed by ALD, CVD, PVD, HDPCVD, MOCVD, RPCVD, PECVD, APCVD, SAVCD, other suitable deposition processes, or combinations thereof. In some embodiments, the second dielectric layer (i.e., dielectric layers 274) is formed by FCVD, where a flowable low-k dielectric material (for example, in a liquid state) is formed over multigate device 200 and flowable low-k dielectric material is converted into a solid flowable low-k dielectric material by an annealing process. The flowable low-k dielectric material can flow into the remainders of upper portions of trenches 230A-230C, enabling void free filling of the remainders of upper portions of trenches 230A-230C. Reducing (and, in some embodiments, preventing) voids in dielectric features 270 enhances performance of multigate device 200.

In the depicted embodiment, dielectric liners 272 include a dielectric material having a dielectric constant that is greater than about 7.0 (k≥7.0), and dielectric layers 274 include a dielectric material having a dielectric constant that is less than a dielectric constant of the dielectric material of dielectric liners 272, such as a dielectric constant that is less than about 7.0 (k≤7.0). For purposes of the present disclosure, dielectric materials having a dielectric constant that is greater than about 7.0 (k≥7.0) are referred to as high-k dielectric materials, such that dielectric liners 272 can be referred to as high-k dielectric layers, and dielectric layers 274 can be referred to as low-k dielectric layers. In some embodiments, dielectric liners 272 include a dielectric material having a dielectric constant of about 7.0 to about 30.0, and dielectric layers 274 include a dielectric material having a dielectric constant of about 3.0 to about 7.0. In some embodiments, dielectric liners 272 include a metal-and-oxygen-comprising dielectric material having, for example, a dielectric constant of about 7.0 to about 30.0, such as a dielectric material that includes oxygen in combination with hafnium, aluminum, and/or zirconium. In such embodiments, dielectric liners 272 can also be referred to as metal oxide layers. For example, dielectric liners 272 include hafnium oxide (e.g., HfO$_x$), aluminum oxide (AlO$_x$), zirconium oxide (ZrO$_x$), or combinations thereof, where x is a number of oxygen atoms in the dielectric material of dielectric liners 272. In some embodiments, dielectric liners 272 include n-type dopants and/or p-type dopants. In some embodiments, dielectric liners 272 include HfO$_2$, HfSiO$_x$ (e.g, HfSiO or HfSiO$_4$), HfSiON, HfLaO, HfTaO, HfTiO, HfZrO, HfAlO$_x$, ZrO, ZrO$_2$, ZrSiO$_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$, (Ba,Sr)TiO$_3$, HfO$_2$—Al$_2$O$_3$, other suitable high-k dielectric material, or combinations thereof. In some embodiments, dielectric layers 274 include a silicon-comprising dielectric material, such as a dielectric material that includes silicon in combination with oxygen, carbon, and/or nitrogen. For example, dielectric layers 274 include silicon oxide, silicon nitride, silicon carbide, silicon carbonitride, silicon oxycarbide, silicon oxycarbonitride, or combinations thereof. In some embodiments, dielectric layers 274 include n-type dopants and/or p-type dopants. For example, dielectric layers 274 can be boron-doped nitride layers. In some embodiments, dielectric layers 274 include a dielectric material having a dielectric constant that is less than a dielectric constant of silicon dioxide, such as FSG, carbon-doped FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other low-k dielectric material, or combinations thereof. In some embodiments, dielectric layers 274 include BSG, PSG, and/or BPSG.

Dielectric features 270 and dielectric features 260 combine to provide a gate isolation fins 280A and a gate isolation fin 280B over isolation features 255. Each of gate isolation fins 280A, 280B includes a respective dielectric feature 270 disposed over a respective dielectric feature 260. In some embodiments, dielectric features 270 are referred to as gate isolation end caps. In the depicted embodiment, gate isolation fins 280A separate and/or isolate device features and/or transistor features within a transistor region from one another. For example, where first transistor region 202A includes a first CMOS transistor and second transistor region 202B includes a second CMOS transistor, leftmost gate isolation fin 280A in first transistor region 202A may separate and/or isolate a gate of a p-type transistor of the first CMOS transistor from a gate of an n-type transistor of the first CMOS transistor, while rightmost gate isolation fin 280A in second transistor region 202B may separate and/or isolate a gate of a p-type transistor of the second CMOS transistor from a gate of an n-type transistor of the second CMOS transistor. Gate isolation fin 280B separates and isolates device features and/or transistor features in different transistor regions from one another. For example, where first transistor region 202A includes a first transistor and second transistor region 202B includes a second transistor, gate isolation fin 280B may separate and/or isolate a gate of the first transistor in first transistor region 202A from a gate of the second transistor in second transistor region 202B. Gate isolation fin 280B spans a transistor interface region, which includes an interface between first transistor region 202A and second transistor region 202B, a portion of first transistor region 202A adjacent to the interface, and a portion of second transistor region 202B adjacent to the interface. In the depicted embodiment, silicon germanium sacrificial layers 258 and dielectric liners 235 are disposed between gate isolation fins 280A, 280B and fins 208A, 208B, such that sidewalls of fins 208A, 208B do not physically contact gate isolation fins 280A, 280B. Further, because trenches 230A-230C are partially filled with silicon germanium sacrificial layers 258, a width w1 of gate isolation fins 280A, 280B along the x-direction is less than a width w2 of isolation features 255 along the x-direction. In some embodiments, width w1 is about 10 nm to about 25 nm. In some embodiments, width w2 is about 25 nm to about 50 nm. In the depicted embodiment, dielectric features 260 and dielectric features 270 each have width w2, dielectric layers 274 have a width w3, and oxide layers 264 have a width w4. In some embodiments, width w3 is about 8 nm to about 30 nm. In some embodiments, width w4 is about 8 nm to about 30 nm. Width w3 is greater than, less than, or substantially equal to width w4.

Figure 10:
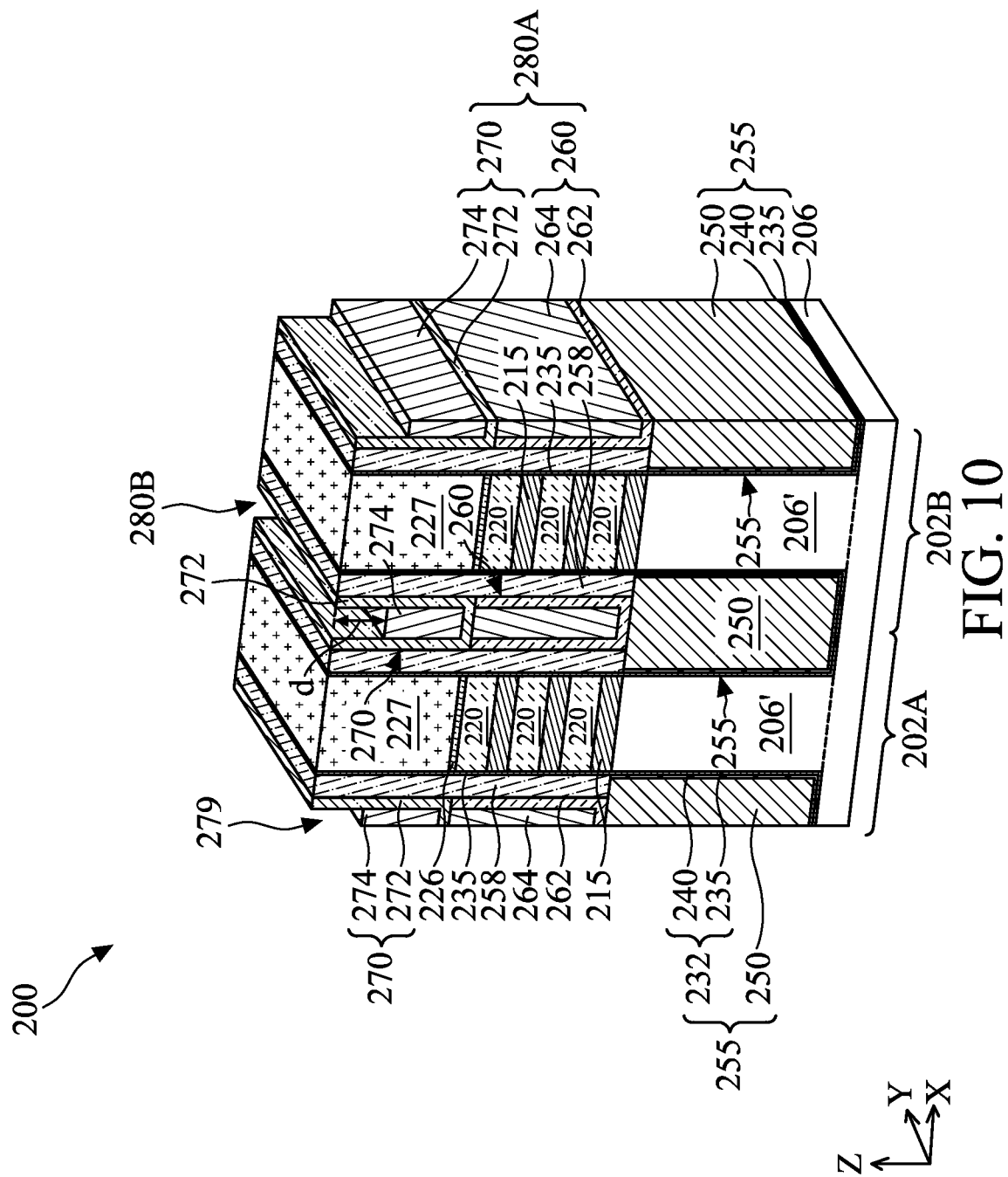
Figure 11:
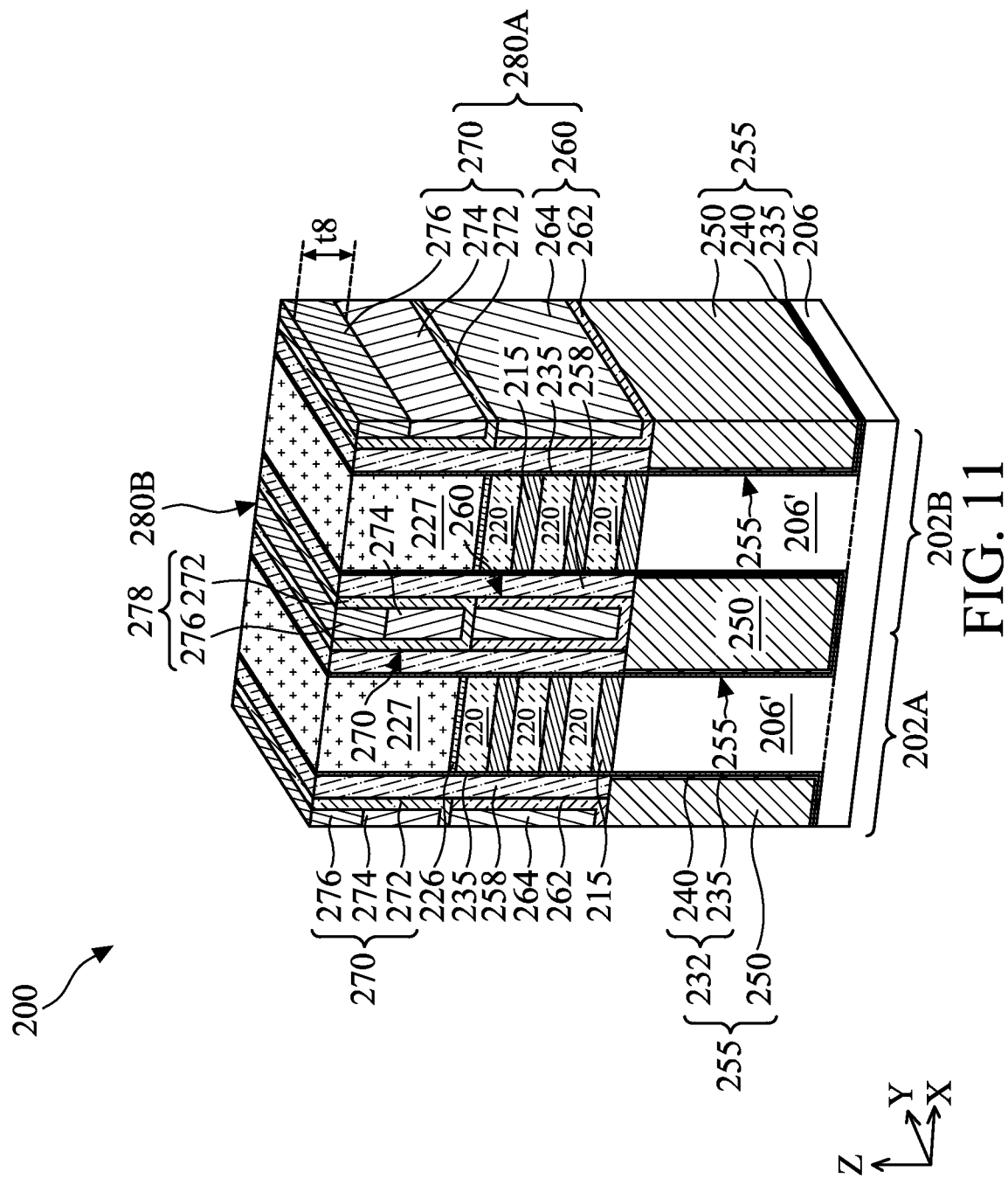

Turning to FIG. 10 and FIG. 11, processing proceeds with forming dielectric cap layers 276 of dielectric features 270. Dielectric cap layers 276 include a dielectric material having a dielectric constant that is greater than a dielectric constant of dielectric layers 274, such that dielectric layers 274 are surrounded by dielectric materials having a higher dielectric constant. Accordingly, each dielectric feature 270 has a low-k dielectric core (a respective dielectric layer 274) surrounded or enclosed by a high-k dielectric shell 278 (which collectively refers to a respective dielectric liner 272 and a respective dielectric cap layer 276). As described further below, such configuration of dielectric feature 270 of gate isolation fin 280B can improve performance of multigate device 200, for example, by reducing (and, in some embodiments, eliminating) leakage paths between subsequently formed metal gates and subsequently formed source/drain contacts of multigate device 200, which can arise from voids that may form in dielectric features having only high-k dielectric materials. In the depicted embodiment, dielectric cap layers 276 include a dielectric material having a dielectric constant that is greater than about 7.0 (k≥7.0) and thus can be referred to as high-k dielectric layers. In some embodiments, dielectric cap layers 276 include a dielectric material having a dielectric constant of about 7.0 to about 30.0. In some embodiments, dielectric cap layers 276 include a metal-and-oxygen-comprising dielectric material having, for example, a dielectric constant of about 7.0 to about 30.0, such as a dielectric material that includes oxygen in combination with hafnium, aluminum, and/or zirconium. In such embodiments, dielectric cap layers 276 can also be referred to as metal oxide layers. For example, dielectric cap layers 276 include HfO$_x$, AlO$_x$, ZrO$_x$, or combinations thereof, where x is a number of oxygen atoms in the dielectric material of dielectric cap layers 276. In some embodiments, dielectric cap layers 276 include n-type dopants and/or p-type dopants. In some embodiments, dielectric cap layers 276 include HfO$_2$, HfSiO$_x$ (e.g, HfSiO or HfSiO$_4$), HfSiON, HfLaO, HfTaO, HfTiO, HfZrO, HfAlO$_x$, ZrO, ZrO$_2$, ZrSiO$_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$, (Ba,Sr)TiO$_3$, HfO$_2$—Al$_2$O$_3$, other suitable high-k dielectric material, or combinations thereof. In the depicted embodiment, dielectric cap layers 276 and dielectric liners 272 include the same dielectric material, such as a metal-and-oxygen comprising dielectric material. In some embodiments, dielectric cap layers 276 and dielectric liners 272 include different dielectric materials, so long as dielectric constants of the dielectric materials of dielectric cap layers 276 and dielectric liners 272 are greater than the dielectric constant of dielectric layers 274.

In FIG. 10, dielectric layers 274 are recessed (for example, etched back) to a depth d, thereby forming openings 279 having sidewalls formed by dielectric liners 272 and bottoms formed by top surfaces of dielectric layers 274. Depth d is greater than thickness t7. In some embodiments, depth d is about 3 nm to about 15 nm. In some embodiments, an etching process recesses dielectric layers 274. The etching process selectively removes dielectric layers 274 with respect to dielectric liners 272. In other words, the etching process substantially removes dielectric layers 274 but does not remove, or does not substantially remove, dielectric liners 272. In some embodiments, an etchant is selected for the etch process that etches low-k dielectric materials (i.e., dielectric layers 274) at a higher rate than high-k dielectric materials (i.e., dielectric liners 272) (i.e., the etchant has a high etch selectivity with respect to low-k dielectric materials). In some embodiments, an etchant is selected for the etch process that etches silicon-comprising dielectric materials (i.e., dielectric layers 274) at a higher rate than metal-and-oxygen comprising dielectric materials (i.e., dielectric liners 272) (i.e., the etchant has a high etch selectivity with respect to silicon-comprising dielectric materials). In some embodiments, the etching process also selectively removes dielectric layers 274 with respect to patterning layers 225 of fins 208A, 208B, silicon germanium sacrificial layers 258, and/or dielectric liners 235. The etching process is a dry etch, a wet etch, other suitable etching process, or combinations thereof. In some embodiments, a dry etch uses an etch gas that includes HF, NF (e.g., $NH_4F$), NH (e.g., $NH_3$), and/or BCl (e.g., $BCl_3$) to achieve selective etching of silicon-comprising dielectric materials (i.e., dielectric layers 274) with respect to metal-and-oxygen comprising dielectric materials (i.e., dielectric liners 272). In some embodiments, the dry etch can use a carrier gas to deliver the etch gas. The carrier gas includes nitrogen, argon, helium, xenon, other suitable carrier gas constituent, or combinations thereof. In some embodiments, the etching process uses a patterned mask layer as an etch mask, where the patterned mask layer covers fins 208A, 208B and silicon germanium sacrificial layers 258 but has openings therein that expose dielectric features 270. In some embodiments, the patterned mask layer also covers dielectric liners 272, such that openings in the patterned mask layer expose dielectric layers 274, but not dielectric liners 272, of dielectric features 270.

In FIG. 11, dielectric cap layers 276 are formed in openings 279 over dielectric layers 274. Dielectric cap layers 276 are disposed between sidewall portions of dielectric liners 272. Dielectric cap layers 276 have a thickness t8 that is greater than thickness t7. In some embodiments, thickness t8 is substantially the same as depth d. In some embodiments, thickness t8 is about 5 nm to about 15 nm. In some embodiments, dielectric cap layers 276 are formed by depositing a dielectric layer having a third dielectric constant over multigate device 200, where the dielectric layer fills openings 279 and the third dielectric constant is greater than the second dielectric constant of dielectric layers 274, and performing a planarization process, such as CMP, to remove portions of the dielectric layer that are disposed over top surfaces of fins 208A, 208B. For example, patterning layers 225 can function as a planarization stop layer, such that the planarization process is performed until reaching and exposing patterning layers 225 of fins 208A, 208B. In such embodiments, top surfaces of dielectric features 270 (for example, top surfaces of dielectric liners 272 and top surfaces of dielectric cap layers 276), top surfaces of patterning layers 225, and top surfaces of silicon germanium sacrificial layers 258 may be substantially planar. In some embodiments, the dielectric layer is formed by CVD, PVD, ALD, RPCVD, PECVD, HDPCVD, FCVD, HARP, LPCVD, ALCVD, APCVD, SACVD, MOCVD, other suitable deposition processes, or combinations thereof.

Figure 12:
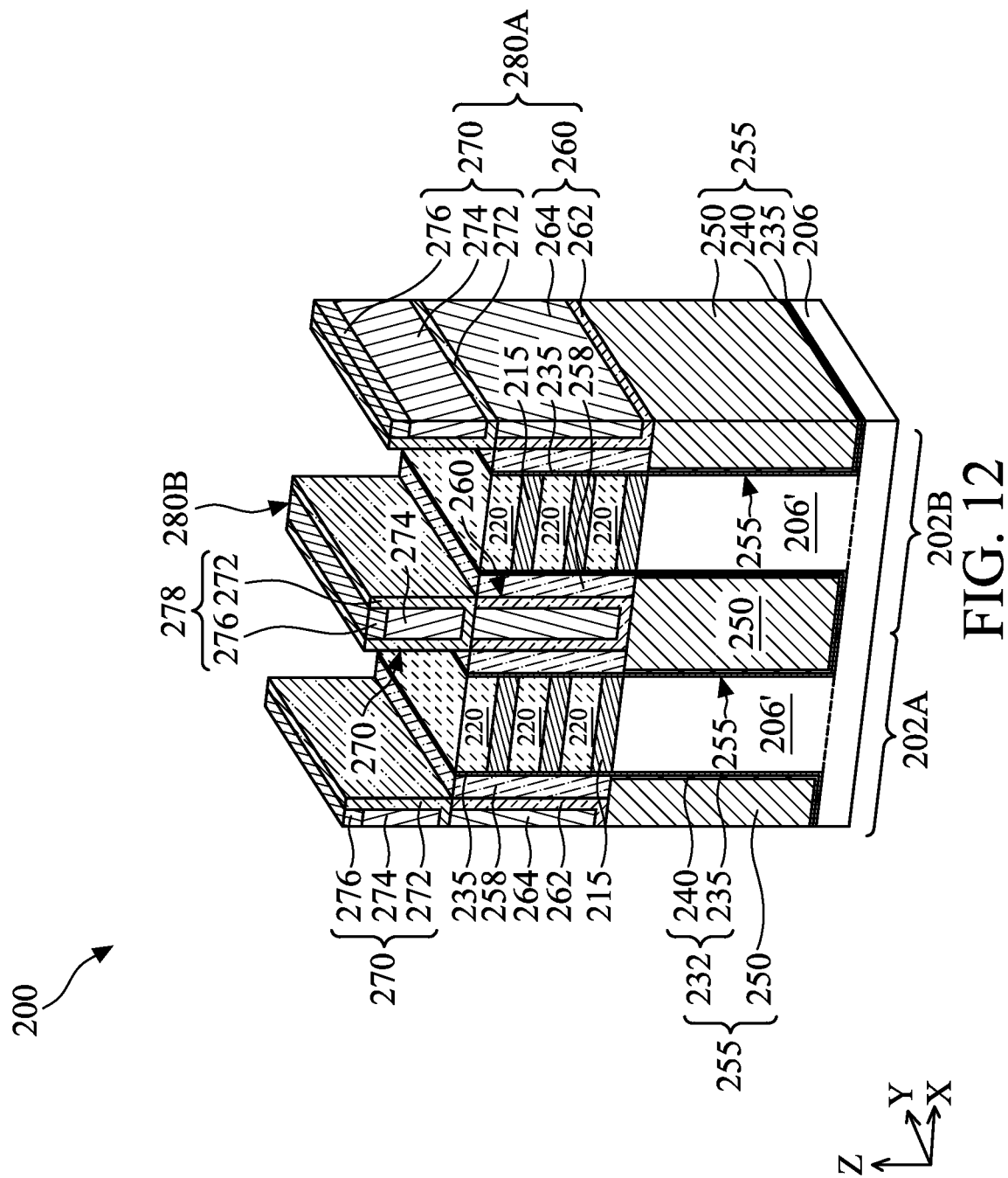

Turning to FIG. 12, an etching process is performed to remove patterning layers 225 from fins 208A, 208B and portions of silicon germanium sacrificial layers 258 disposed along sidewalls of patterning layers 225, thereby forming openings 285 (formed between dielectric features 270) that expose semiconductor layer stacks 210 of fins 208A, 208B. The etching process selectively removes patterning layers 225 and silicon germanium sacrificial layers 258 with respect to dielectric shells 278 and semiconductor layers 220 of semiconductor layer stacks 210. In other words, the etching process substantially removes patterning layers 225 and silicon germanium sacrificial layers 258 (in particular, portions of silicon germanium sacrificial layers 258 disposed along sidewalls of patterning layers 225) but does not remove, or does not substantially remove, dielectric shells 278 and semiconductor layers 220. For example, an etchant is selected for the etch process that etches silicon nitride (i.e., patterning layers 225) and silicon germanium (i.e., silicon germanium sacrificial layers 258) at a higher rate than metal-and-oxygen comprising material (i.e., dielectric shells 278) and silicon (i.e., semiconductor layers 220) (i.e., the etchant has a high etch selectivity with respect to silicon nitride and silicon germanium). The etching process is a dry etch, a wet etch, other suitable etching process, or combinations thereof. In some embodiments, a dry etch uses a fluorine-comprising etch gas to selectively etch silicon nitride (i.e., patterning layer 225) and silicon germanium (i.e., silicon germanium sacrificial layers 258) with respect to metal-and-oxygen comprising dielectric materials (i.e., dielectric shells 278) and silicon (i.e., semiconductor layers 220). In some embodiments, the etch process includes multiple steps, such as a first etch step that selectively etches patterning layers 225 and a second etch step that selectively etches silicon germanium sacrificial layers 258 (e.g., the first etch step and the second etch step implement different etchants). In some embodiments, the etching process uses a patterned mask layer as an etch mask, where the patterned mask layer covers dielectric features 270 but has openings therein that expose patterning layers 225 and, in some embodiments, portions of silicon germanium sacrificial layers 258 disposed along sidewalls of patterning layers 225.

Figure 13:
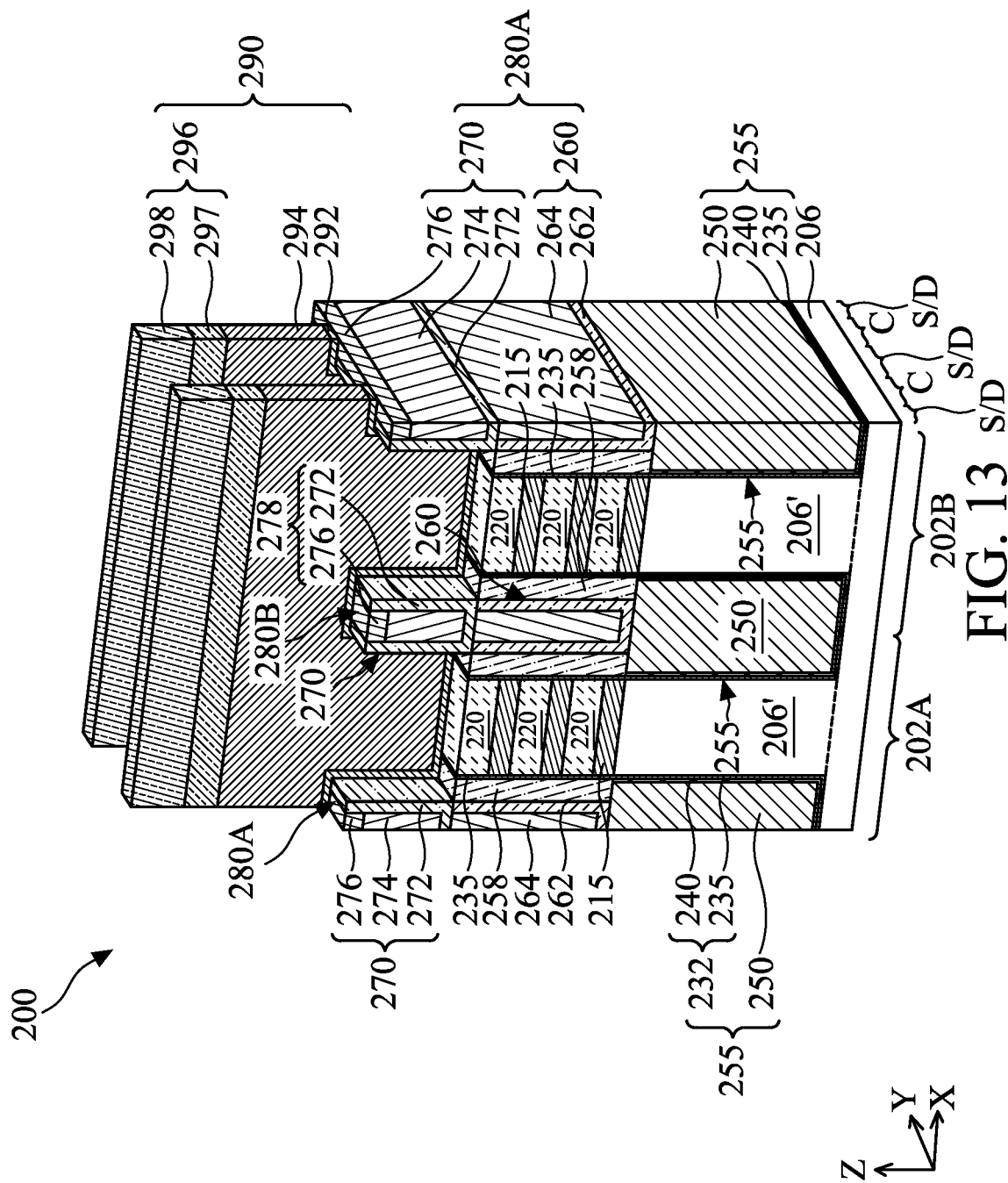

Turning to FIG. 13, dummy gate stacks 290 are formed over portions of fins 208A, 208B and gate isolation fins 280A, 280B. Dummy gate stacks 290 fill portions of openings 285. Dummy gate stacks 290 extend lengthwise in a direction that is different than (e.g., orthogonal to) the lengthwise direction of fins 208A, 208B. For example, dummy gate stacks 290 extend substantially parallel to one another along the x-direction, having a length in the x-direction, a width in the y-direction, and a height in the z-direction. Dummy gate stacks 290 are disposed over channel regions (C) of multigate device 200 and between source/drain regions (S/D) of multigate device 200. In the X-Z plane, dummy gate stacks 290 are disposed on top surfaces of fins 208A, 208B (in particular, top surfaces of semiconductor layer stacks 210), top surfaces of dielectric features 270 of gate isolation fins 280A, 280B, and sidewall surfaces of dielectric features 270 of gate isolation fins 280A, 280B, such that dummy gate stacks 290 wrap dielectric features 270 of gate isolation fins 280A, 280B in channel regions of multigate device 200. In the Y-Z plane, dummy gate stacks 290 are disposed over top surfaces of respective channel regions of fins 208A, 208B, such that dummy gate stacks 290 interpose respective source/drain regions of fins 208A, 208B. Each dummy gate stack 290 includes a dummy gate dielectric 292, a dummy gate electrode 294, and a hard mask 296 (including, for example, a first mask layer 297 and a second mask layer 298). Dummy gate dielectric 292 includes a dielectric material, such as silicon oxide, a high-k dielectric material, other suitable dielectric material, or combinations thereof. In some embodiments, dummy gate dielectric 292 includes an interfacial layer (including, for example, silicon oxide) and a high-k dielectric layer disposed over the interfacial layer. Dummy gate electrode 294 includes a suitable dummy gate material, such as polysilicon. In some embodiments, dummy gate stacks 290 include numerous other layers, for example, capping layers, interface layers, diffusion layers, barrier layers, or combinations thereof. Dummy gate stacks 290 are formed by deposition processes, lithography processes, etching processes, other suitable processes, or combinations thereof. For example, a first deposition process forms a dummy gate dielectric layer over multigate device 200, a second deposition process forms a dummy gate electrode layer over the dummy gate dielectric layer, and a third deposition process forms a hard mask layer over the dummy gate electrode layer. The deposition processes include CVD, PVD, ALD, RPCVD, PECVD, HDPCVD, FCVD, HARP, LPCVD, ALCVD, APCVD, SACVD, MOCVD, plating, other suitable methods, or combinations thereof. A lithography patterning process and an etching process, such as those described herein, are then performed to pattern the hard mask layer, the dummy gate electrode layer, and the dummy gate dielectric layer to form dummy gate stacks 290, as depicted in FIG. 13.

Figure 14:
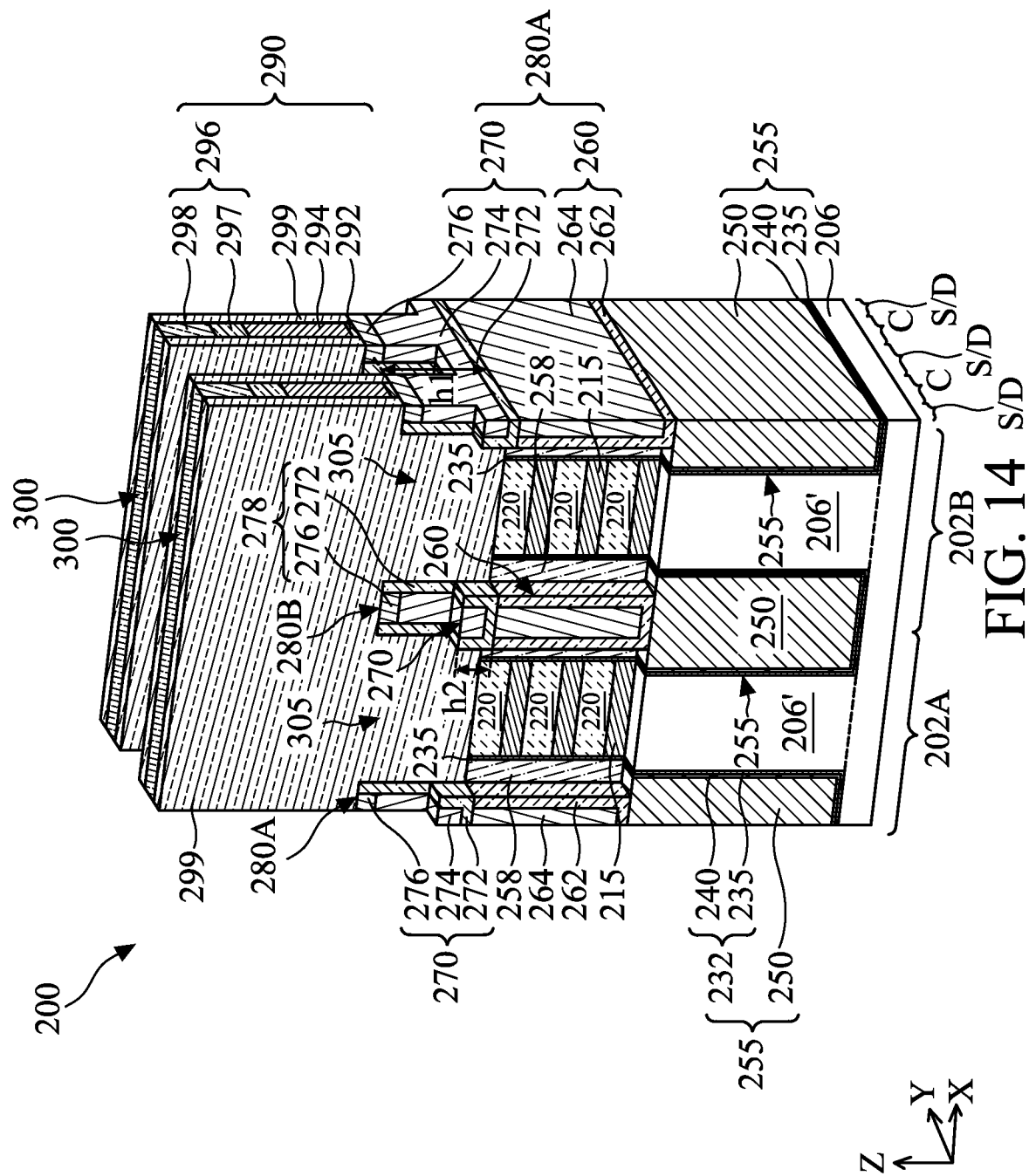

Turning to FIG. 14, gate spacers 299 are formed along sidewalls of dummy gate stacks 290, thereby forming gate structures 300 (which collectively refers to dummy gate stacks 290 and gate spacers 299). In FIG. 14, portions of fins 208A, 208B in source/drain regions of multigate device 200 (i.e., source/drain regions of fins 208A, 208B that are not covered by gate structures 300) are also at least partially removed to form source/drain recesses (trenches) 305. Processing associated with forming gate spacers 299 and/or source/drain recesses 305 reduces a height of exposed portions of dielectric features 270 of gate isolation fins 280A, 280B (e.g., portions of dielectric features 270 in source/drain regions of multigate device 200) relative to unexposed portions of dielectric features 270 of gate isolation fins 280A, 280B (e.g., portions of dielectric features 270 in channel regions of multigate device 200). For example, dielectric features 270 have a height h1, and etching processes implemented to form gate spacers 299 and/or source/drain recesses 305 reduce, intentionally or unintentionally, a height of exposed portions of dielectric features 270 from height h1 to a height h2. In some embodiments, height h1 is about 5 nm to about 30 nm, and height h2 is about 0 nm to about 15 nm (in other words, in some embodiments, dielectric features 270 may be completely removed from source/drain regions of multigate device 200). Accordingly, portions of dielectric features 270 disposed in channel regions of multigate device 200 under gate structures 300 have height h1 while portions of dielectric features 270 disposed in source/drain regions of multigate device 200 and not disposed under gate structures 300 have height h2. Further, dielectric cap layers 276 are removed from source/drain regions of multigate device 200, such that dielectric features 270 disposed in channel regions of multigate device 200 have dielectric shells 278 surrounding dielectric layers (cores) 274 while dielectric features 270 disposed in source/drain regions of multigate device 200 have dielectric liners 272 wrapping dielectric layers 274. In some embodiments, height h1 is a distance between topmost surfaces of gate isolation fins 280A, 280B and top surfaces of topmost semiconductor layers 220 (which become topmost channel layers). In such embodiments, height h1 may be about 6 nm to about 15 nm.

Gate spacers 299 are disposed adjacent to (i.e., along sidewalls of) dummy gate stacks 290. Gate spacers 299 are formed by any suitable process and include a dielectric material, which can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonitride). For example, a dielectric layer including silicon and nitrogen, such as a silicon nitride layer, is deposited over multigate device 200 and etched to form gate spacers 299. In some embodiments, gate spacers 299 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 290. In such embodiments, the various sets of spacers can include different materials, for example, having different etch rates. For example, a silicon oxide layer can be deposited and etched to form a first spacer set of gate spacers 299 adjacent to sidewalls of dummy gate stacks 290, and a silicon nitride layer can be deposited and etched to form a second spacer set of gate spacers 299 adjacent to the first spacer set.

In the depicted embodiment, an etching process completely removes semiconductor layer stacks 210 in source/drain regions of multigate device 200, thereby exposing fin portions 206' in source/drain regions of multigate device 200. The etching process also completely removes portions of silicon germanium sacrificial layers 258 and portions of dielectric liner 235 that are disposed along sidewalls of semiconductor layer stacks 210 in source/drain regions of multigate device 200. Accordingly, each source/drain recess 305 has a sidewall formed by a respective first one of gate isolation fins 280A, a sidewall formed by gate isolation fin 280B, and a sidewall (or sidewalls) formed by remaining portions of semiconductor layer stacks 210, remaining portions of silicon germanium sacrificial layers 258, and remaining portions of dielectric liner 235 disposed in channel regions of multigate device 200 (and, in particular, disposed under gate structures 300). Each source/drain recess 305 further has a bottom formed by a respective fin portion 206' and respective isolation features 255. In some embodiments, the etching process removes some, but not all, of semiconductor layer stacks 210, such that source/drain recesses 305 have bottoms formed by respective semiconductor layers 215 or semiconductor layer 220. In some embodiments, the etching process further removes some, but not all, of fin portions 206', such that source/drain recesses 305 extend below top surfaces of isolation features 255. The etching process can include a dry etch, a wet etch, other suitable etching process, or combinations thereof. In some embodiments, the etching process is a multi-step etch process. For example, the etching process may alternate etchants to separately and alternately remove semiconductor layers 215, semiconductor layers 220, silicon germanium layers 258, and/or dielectric liner 235. In some embodiments, parameters of the etching process are configured to selectively etch semiconductor layer stacks 210 with minimal (to no) etching of gate structures 300 (i.e., dummy gate stacks 290 and gate spacers 299), gate isolation fins 280A, 280B, and/or isolation features 255. In some embodiments, a lithography process, such as those described herein, is performed to form a patterned mask layer that covers gate structures 300 and/or gate isolation fins 280A, 280B, and the etching process uses the patterned mask layer as an etch mask. In such embodiments, thicknesses of dielectric features 270 are not reduced in the source/drain regions of multigate device 200, such that dielectric features 270 have a height h1 in both channel regions and source/drain regions of multigate device 200.

Figure 15:
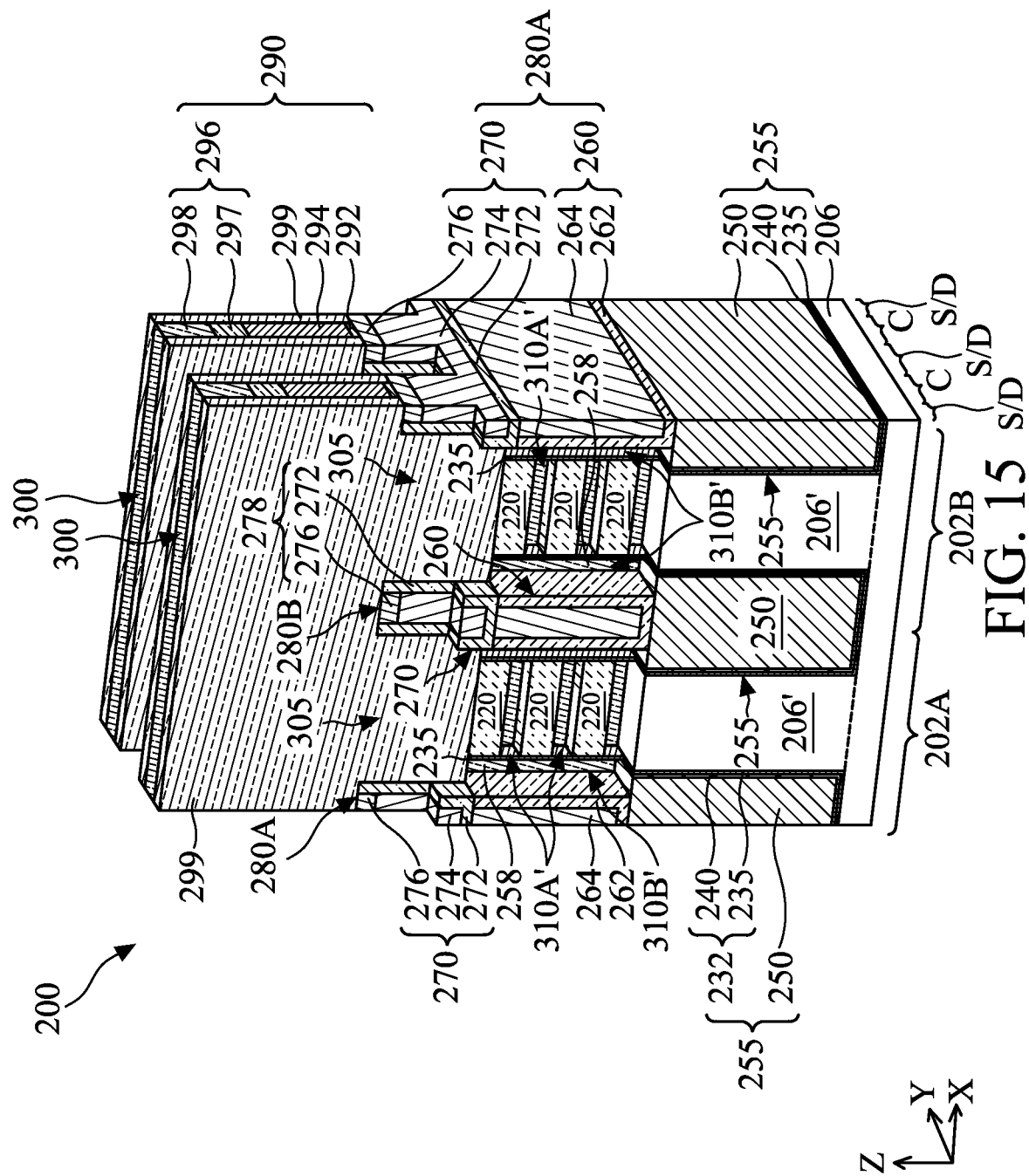
Figure 16:
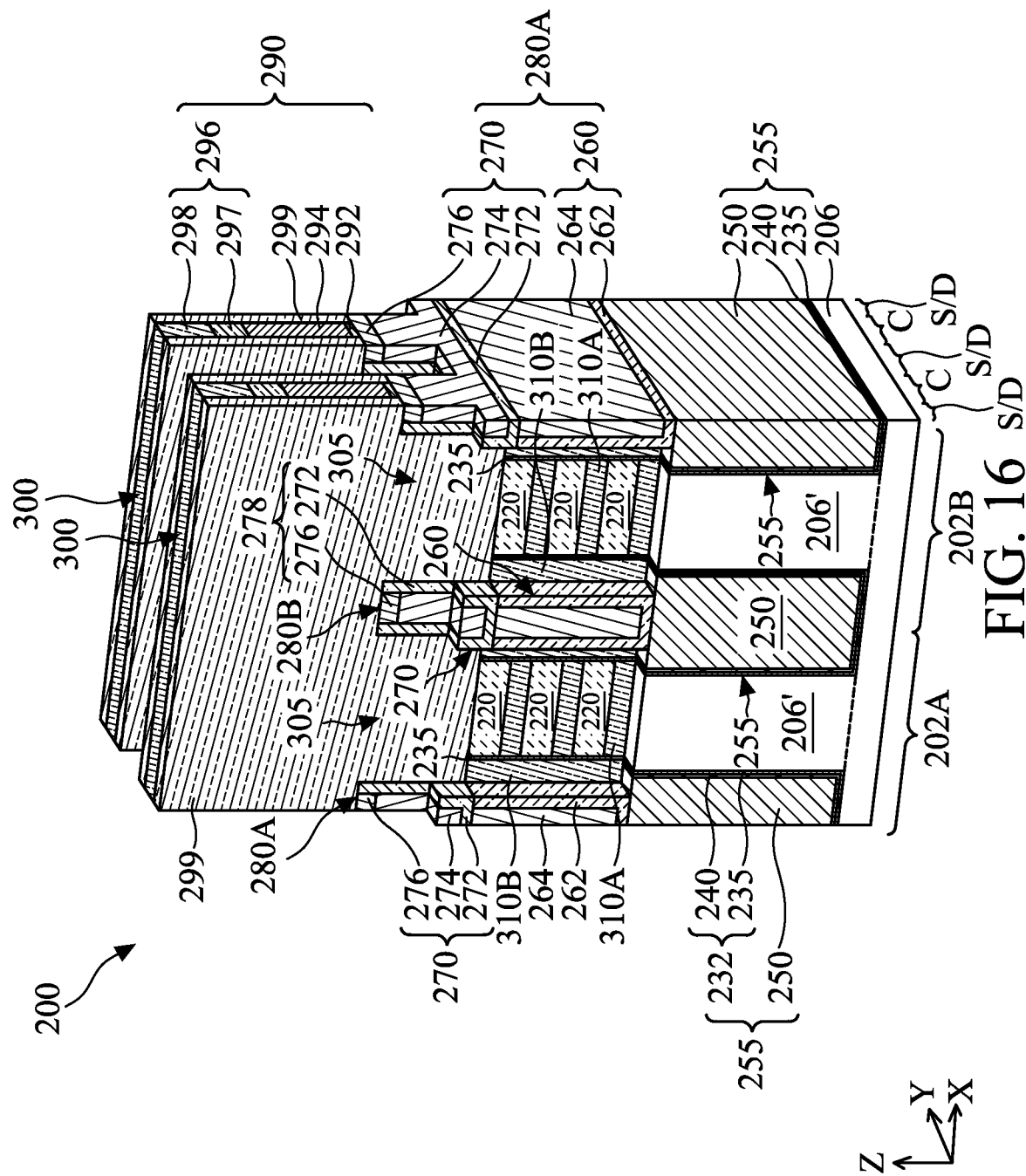

Turning to FIG. 15 and FIG. 16, inner spacers 310A and inner spacers 310B are formed under gate structures 300 (in particular, under gate spacers 299) along sidewalls of semiconductor layers 220 and semiconductor layers 215 under dummy gate stacks 290. Inner spacers 310A separate semiconductor layers 220 from one another and bottommost semiconductor layers 220 from fin portions 206', while inner spacers 310B separate dielectric liners 235, sidewalls of semiconductor layers 220, and sidewalls of semiconductor layers 215 from gate isolation fins 280A, 280B. In the X-Z plane, under gate spacers 299, dielectric liners 235 extend along and physically contact first sidewalls of semiconductor layers 220 and inner spacers 310A and second sidewalls of semiconductor layers 220 and inner spacers 310A (where top surfaces and bottom surfaces of semiconductor layers 220 and inner spacers 310A extend between the first sidewalls and the second sidewalls), such that dielectric liners 235 separate first sidewalls and second sidewalls of semiconductor layers 220 and inner spacers 310A from inner spacers 310B. In FIG. 15, a first etching process is performed that selectively etches semiconductor layers 215 exposed by source/drain recesses 305 with minimal (to no) etching of semiconductor layers 220, fin portions 206', dielectric liners 235, isolation features 255, gate isolation fins 280A, 280B, and gate structures 300, such that gaps 310A' are formed between semiconductor layers 220 and between fin portions 206' and semiconductor layers 220. The first etching process further selectively etches silicon germanium sacrificial layers 258 that are exposed by source/drain recesses 305, such that gaps 310B' are formed between dielectric liners 235 and gate isolation fins 280A, 280B. Gaps 310A' and gaps 310B' are under gate spacers 299. Semiconductor layers 220 are thus suspended under gate spacers 299, separated from one another by gaps 310A' and separated from gate isolation fins 280A, 280B by dielectric liners 235 and gaps 310B'. In some embodiments, gaps 310A' and/or gaps 310B' extend at least partially under dummy gate stacks 290. The first etching process is configured to laterally etch (e.g., along the y-direction) semiconductor layers 215 and silicon germanium sacrificial layers 258, thereby reducing a length of semiconductor layers 215 along the y-direction. The first etching process is a dry etch, a wet etch, other suitable etching process, or combinations thereof.

In FIG. 16, a deposition process then forms a spacer layer over gate structures 300 and over features forming source/drain recesses 305 (e.g., semiconductor layers 215, semiconductor layers 220, fin portions 206', gate isolation fins 280A, 280B, isolation features 255, silicon germanium sacrificial layers 258, and/or dielectric liners 235), such as CVD, PVD, ALD, HDPCVD, MOCVD, RPCVD, PECVD, LPCVD, ALCVD, APCVD, plating, other suitable methods, or combinations thereof. The spacer layer partially (and, in some embodiments, completely) fills source/drain recesses 305, and the deposition process is configured to ensure that the spacer layer fills gaps 310A' and gaps 310B'. A second etching process is then performed that selectively etches the spacer layer to form inner spacers 310A, which fill gaps 310A', and inner spacers 310B, which fill gaps 310B', with minimal (to no) etching of semiconductor layers 220, fin portions 206', dielectric liners 235, isolation features 255, gate isolation fins 280A, 280B, and gate structures 300. The spacer layer (and thus inner spacers 310A and inner spacers 310B) includes a material that is different than a material of semiconductor layers 220, a material of fin portions 206', a material of isolation features 255, a material of gate isolation fins 280A, 280B, and/or materials of gate structures 300 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, the spacer layer includes a low-k dielectric material, such as those described herein. In some embodiments, dopants (for example, p-type dopants, n-type dopants, or combinations thereof) are introduced into the dielectric material, such that the spacer layer includes a doped dielectric material.

Figure 17:
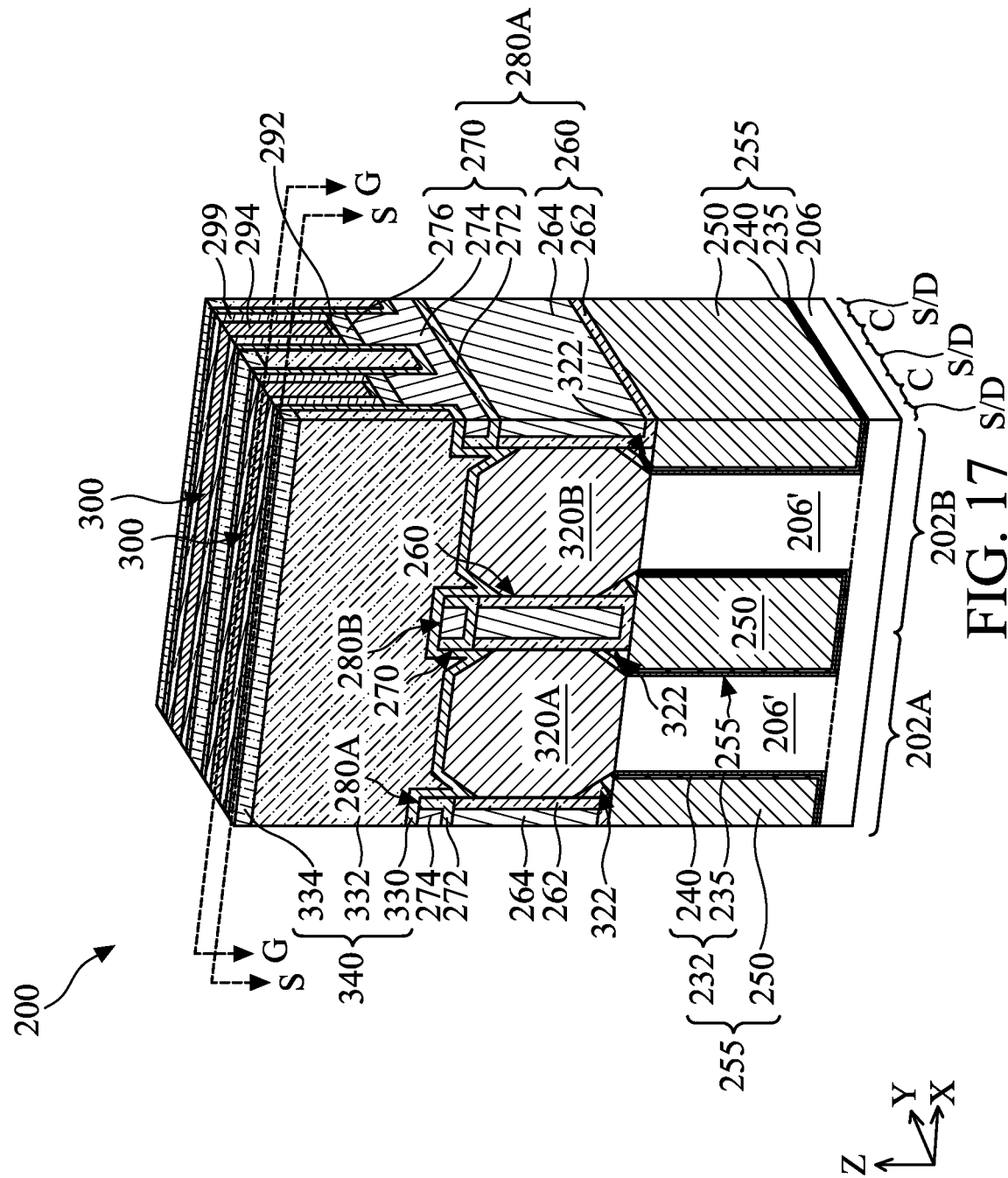

Turning to FIG. 17, epitaxial source/drain features are formed in source/drain recesses 305. For example, a semiconductor material is epitaxially grown from fin portions 206' of substrate 206 and semiconductor layers 220 exposed by source/drain recesses 305, thereby forming epitaxial source/drain features 320A in first transistor region 202A and epitaxial source/drain features 320B in second transistor region 202B. In some embodiments, because semiconductor material may not grow from dielectric surfaces during an epitaxial growth process used to form epitaxial source/drain features 320A, 320B, air gaps 322 may be formed between epitaxial source/drain features 320A, 320B, gate isolation fins 280A, 280B, and isolation features 255. In some embodiments, such as depicted, epitaxial source/drain features 320A, 320B do not completely fill source/drain recesses 305, such that top surfaces of epitaxial source/drain features 320A, 320B are lower than top surfaces of dielectric features 270 of gate isolation fins 280A, 280B. In some embodiments, epitaxial source/drain features 320A, 320B completely fill source/drain recesses 305, such that top surfaces of epitaxial source/drain features 320A, 320B are substantially planar with top surfaces of dielectric features 270 or higher than top surfaces of dielectric features 270. An epitaxy process can use CVD deposition techniques (for example, LPCVD, VPE, and/or UHV-CVD), MBE, other suitable epitaxial growth processes, or combinations thereof. The epitaxy process can use gaseous precursors and/or liquid precursors, which interact with the composition of fin portions 206' and/or semiconductor layers 220. Epitaxial source/drain features 320A, 320B are doped with n-type dopants and/or p-type dopants. In some embodiments, for n-type transistors, epitaxial source/drain features 320A, 320B include silicon, which can be doped with carbon, phosphorous, arsenic, other n-type dopant, or combinations thereof (for example, Si:C epitaxial source/drain features, Si:P epitaxial source/drain features, or Si:C:P epitaxial source/drain features). In some embodiments, for p-type transistors, epitaxial source/drain features 320A, 320B include silicon germanium or germanium, which can be doped with boron, other p-type dopant, or combinations thereof (for example, Si:Ge:B epitaxial source/drain features). In some embodiments, epitaxial source/drain features 320A, 320B include more than one epitaxial semiconductor layer, where the epitaxial semiconductor layers can include the same or different materials and/or the same or different dopant concentrations. In some embodiments, epitaxial source/drain features 320A, 320B include materials and/or dopants that achieve desired tensile stress and/or compressive stress in respective channel regions of the n-type transistors and/or the p-type transistors. In some embodiments, epitaxial source/drain features 320A, 320B are doped during deposition by adding impurities to a source material of the epitaxy process (i.e., in-situ). In some embodiments, epitaxial source/drain features 320A, 320B are doped by an ion implantation process subsequent to a deposition process. In some embodiments, annealing processes (e.g., rapid thermal annealing and/or laser annealing) are performed to activate dopants in epitaxial source/drain features 320A, 320B and/or other source/drain regions (for example, heavily doped source/drain (HDD) regions and/or lightly doped source/drain (LDD) regions). In some embodiments, epitaxial source/drain features 320A, 320B are formed in separate processing sequences, for example, by masking second transistor region 202B when forming epitaxial source/drain features 320A in first transistor region 202A and masking first transistor region 202A when forming epitaxial source/drain features 320B in second transistor region 202B.

In some embodiments, after forming epitaxial source/drain features 320A, 320B, a contact etch stop layer (CESL) 330 is formed over multigate device 200, an interlayer dielectric (ILD) layer 332 is formed over CESL 330, an ILD protection layer 334 is formed over ILD layer 332, and a CMP and/or other planarization process is performed until reaching (exposing) top portions (or top surfaces) of dummy gate stacks 290. CESL 330 and ILD layer 332 are disposed over epitaxial source/drain features 320A, 320B and gate isolation fins 280A, 280B in source/drain regions of multigate device 200, and in the depicted embodiment, CESL 330 and ILD layer 332 fill remainders of source/drain recesses 305. CESL 330, ILD layer 332, and ILD protection layer 334 are disposed between adjacent gate structures 300. In some embodiments, CESL 330 and/or ILD layer 332 are disposed on and physically contact facets of epitaxial source/drain features 320A, 320B that extend from gate isolation fins 280A, 280B to top surfaces (facets) of epitaxial source/drain features 320A, 320B, while facets of epitaxial source/drain features 320A, 320B that extend from gate isolation fins 280A, 280B to bottom surfaces (facets) of epitaxial source/drain features 320A, 320B (i.e., surfaces disposed on fin portions 206') do not physically contact any dielectric material because of air gaps 322. CESL 330, ILD layer 332, and ILD protection layer 334 are formed by CVD, PVD, ALD, HDPCVD, HARP, FCVD, MOCVD, RPCVD, PECVD, LPCVD, ALCVD, APCVD, other suitable methods, or combinations thereof. In some embodiments, ILD layer 332 is formed by FCVD, HARP, HDPCVD, or combinations thereof. In some embodiments, the planarization process removes hard masks 296 of dummy gate stacks 290 to expose underlying dummy gate electrodes 294, such as polysilicon gate electrodes. ILD layer 332 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 332 includes a dielectric material having a dielectric constant that is less than a dielectric constant of silicon dioxide. In some embodiments, ILD layer 332 includes a dielectric material having a dielectric constant that is less than about 2.5 (i.e., an extreme low-k (ELK) dielectric material), such as $SiO_2$ (for example, porous silicon oxide), silicon carbide, and/or carbon-doped oxide (for example, a SiCOH-based material (having, for example, Si—$CH_3$ bonds)), each of which is tuned/configured to exhibit a dielectric constant less than about 2.5. ILD layer 332 can include a multilayer structure having multiple dielectric materials. CESL 330 includes a material different than ILD layer 332 and a material different than gate spacers 299, such as a dielectric material that is different than the dielectric material of ILD layer 332 and different than the dielectric material of gate spacers 299. For example, where ILD layer 332 includes a low-k dielectric material (for example, porous silicon oxide) and gate spacers 299 include a dielectric material that includes silicon and oxygen and/or carbon, such as silicon oxide, silicon carbide, and/or silicon oxycarbide, CESL 330 can include silicon and nitrogen, such as silicon nitride, silicon carbonitride, or silicon oxycarbonitride. ILD protection layer 334 includes a material that is different than the material of ILD layer 332 and that provides etching selectivity and/or planarization selectivity needed to fabricate multigate device 200 as described herein. For example, ILD protection layer 334 includes silicon and nitrogen, such as silicon nitride, silicon carbonitride, or silicon oxycarbonitride. In some embodiments, ILD protection layer 334 includes silicon, silicon carbide, silicon oxynitride, silicon oxycarbide, other suitable material, or material, or combinations thereof. CESL 330 and ILD protection layer 334 include the same or different materials depending on etching selectivity needed during subsequent processing.

ILD layer 332, CESL 330, and/or ILD protection layer 334 are a portion of a multilayer interconnect (MLI) feature 340. In some embodiments, ILD layer 332 and CESL 330 form a bottommost layer of MLI feature 340 (e.g., ILD0). MLI feature 340 electrically couples various devices (for example, p-type transistors and/or n-type transistors of multigate device 200, resistors, capacitors, and/or inductors) and/or components (for example, gate electrodes and/or epitaxial source/drain features) of p-type transistors and/or n-type transistors of multigate device 200, such that the various devices and/or components can operate as specified by design requirements of multigate device 200. MLI feature 340 includes a combination of dielectric layers and electrically conductive layers (e.g., metal layers) that combine to form various interconnect structures. For example, the conductive layers form vertical interconnect features, such as device-level contacts and/or vias, and/or horizontal interconnect features, such as conductive lines. Vertical interconnect features typically connect horizontal interconnect features in different levels (or different layers) of MLI feature 340. During operation, the interconnect features route signals between the devices and/or the components of multigate device 200 and/or distribute signals (for example, clock signals, voltage signals, and/or ground signals) to the devices and/or the components of multigate device 200.

Figure 18:
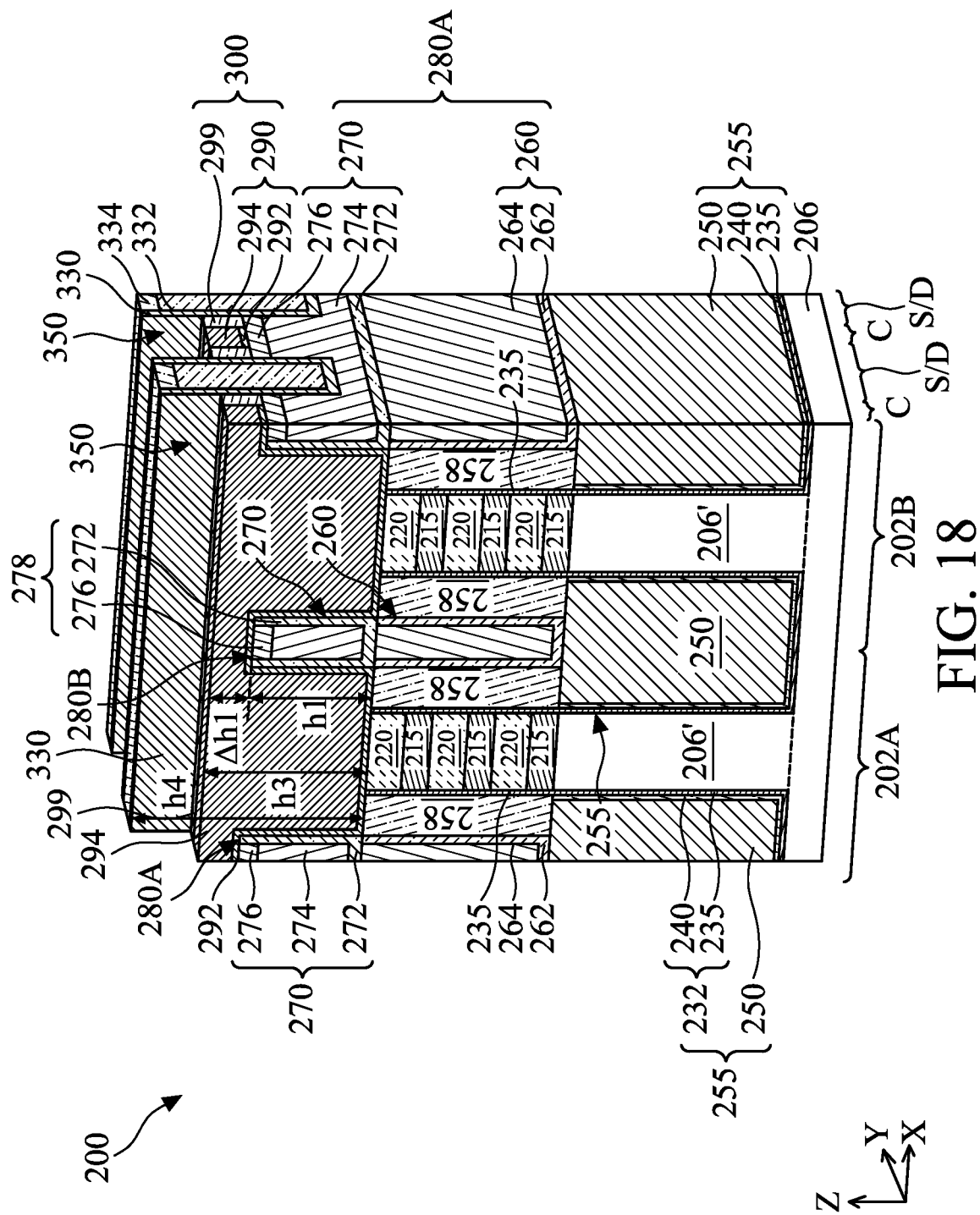

Turning to FIGS. 18-24, a gate replacement process is performed to replace dummy gate stacks 290 with metal gate stacks and a channel release process (see FIG. 23) is performed to form suspended channel layers in channel regions of multigate device 200, where the metal gate stacks at least partially surround the suspended channel layers. For ease of description and understanding, FIGS. 18-24 are taken (cut) through one of gate structures 300 along line G-G in FIG. 17 (and are thus referred to as metal gate cut perspective views). Turning to FIG. 18, gate openings 350 are formed by partially removing dummy gate electrodes 294 and gate spacers 299 of gate structures 300. For example, an etching process recesses dummy gate electrodes 294 and gate spacers 299, such that dummy gate electrodes 294 and gate spacers 299 have a height h3 that is less than a height h4 (i.e., an original height of dummy gate electrodes 294 and gate spacers 299, which is a height of CESL 330 and/or a height of ILD protection layer 334) but greater than height h1. Accordingly, dummy gate electrodes 294 and gate spacers 299 remain over gate isolation fin 280B after the etching process. In some embodiments, height h3 is about 25 nm to about 55 nm. In some embodiments, a height difference Δh1 between top surfaces of dummy gate electrodes 294 (and top surfaces of gate spacers 299) and top surfaces of gate isolation fin 280B in channel regions of multigate device 200 is at least about 5 nm to ensure that gate isolation fin 280B is adequately protected during subsequent etching processes, as described further below. The etching process selectively removes dummy gate electrodes 294 and gate spacers 299 with respect to CESL 330 and ILD protection layer 334. In other words, the etching process substantially removes dummy gate electrodes 294 and gate spacers 299 but does not remove, or does not substantially remove, CESL 330 and ILD protection layer 334. For example, an etchant is selected for the etch process that etches polysilicon (i.e., dummy gate electrodes 294) and silicon-and-carbon comprising dielectric materials (i.e., gate spacers 299) at a higher rate than silicon-and-nitrogen comprising dielectric materials (i.e., CESL 330 and ILD protection layer 334) (i.e., the etchant has a high etch selectivity with respect to polysilicon and silicon-and-carbon comprising dielectric materials (e.g., silicon oxycarbonitride (SiOCN) and/or silicon oxycarbide (SiOC)). In another example, an etchant is selected for the etch process that etches polysilicon (i.e., dummy gate electrodes 294) and silicon-oxygen-and-nitrogen comprising dielectric materials (i.e., gate spacers 299) at a higher rate than silicon-and-nitrogen comprising dielectric materials (i.e., CESL 330 and ILD protection layer 334 including, for example, SiN) (i.e., the etchant has a high etch selectivity with respect to polysilicon and silicon-oxygen-and-nitrogen comprising dielectric materials (e.g., SiON)). The etching process is a dry etch, a wet etch, other suitable etching process, or combinations thereof. In some embodiments, the etch process includes multiple steps, such as a first etch step that selectively etches dummy gate electrodes 294 and a second etch step that selectively etches gate spacers 299 (e.g., the first etch step and the second etch step implement different etchants). In some embodiments, the etching process uses a patterned mask layer as an etch mask, where the patterned mask layer covers CESL 330 and/or ILD protection layer 334 but exposes gate structures 300.

Figure 19:
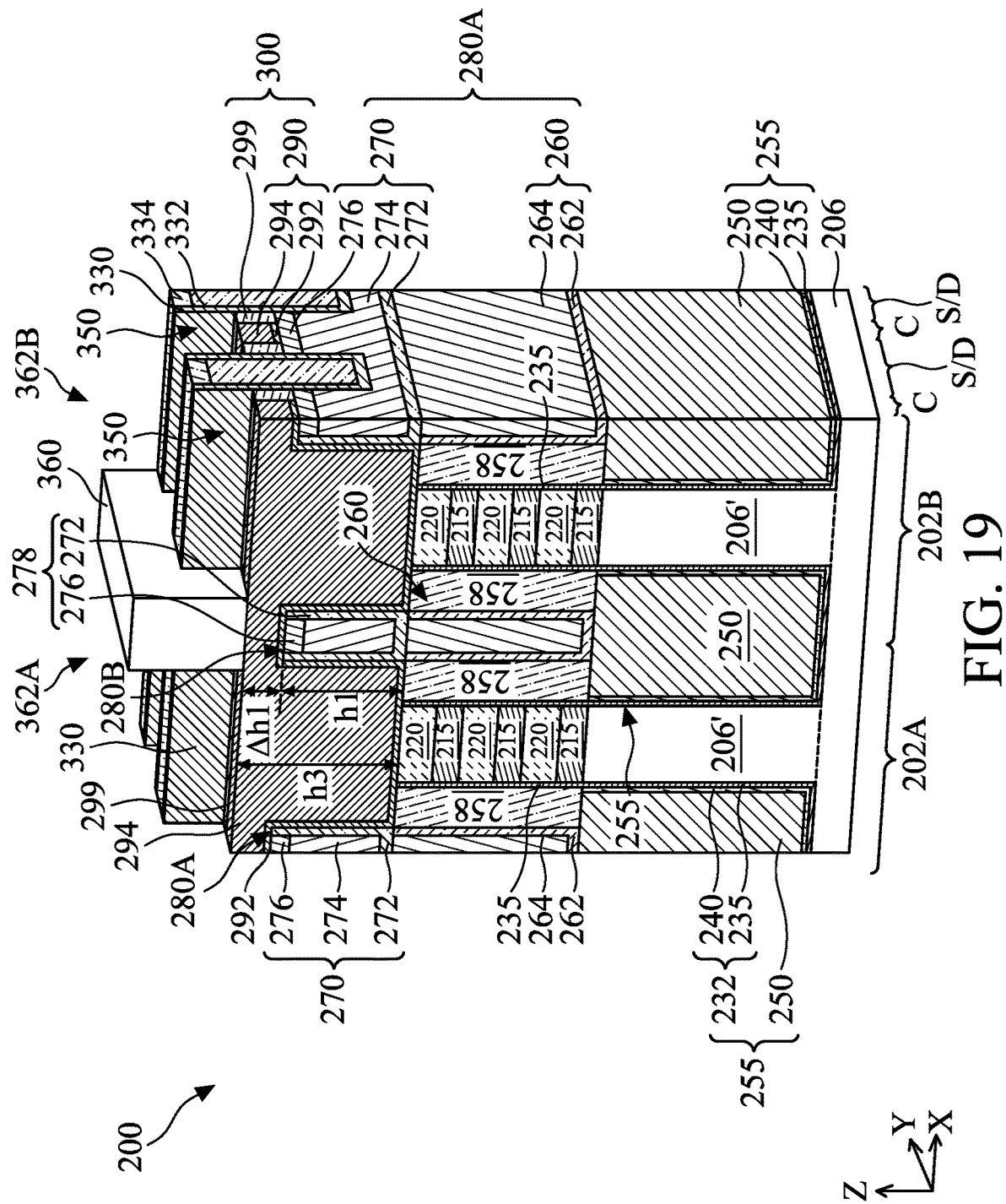
Figure 20:
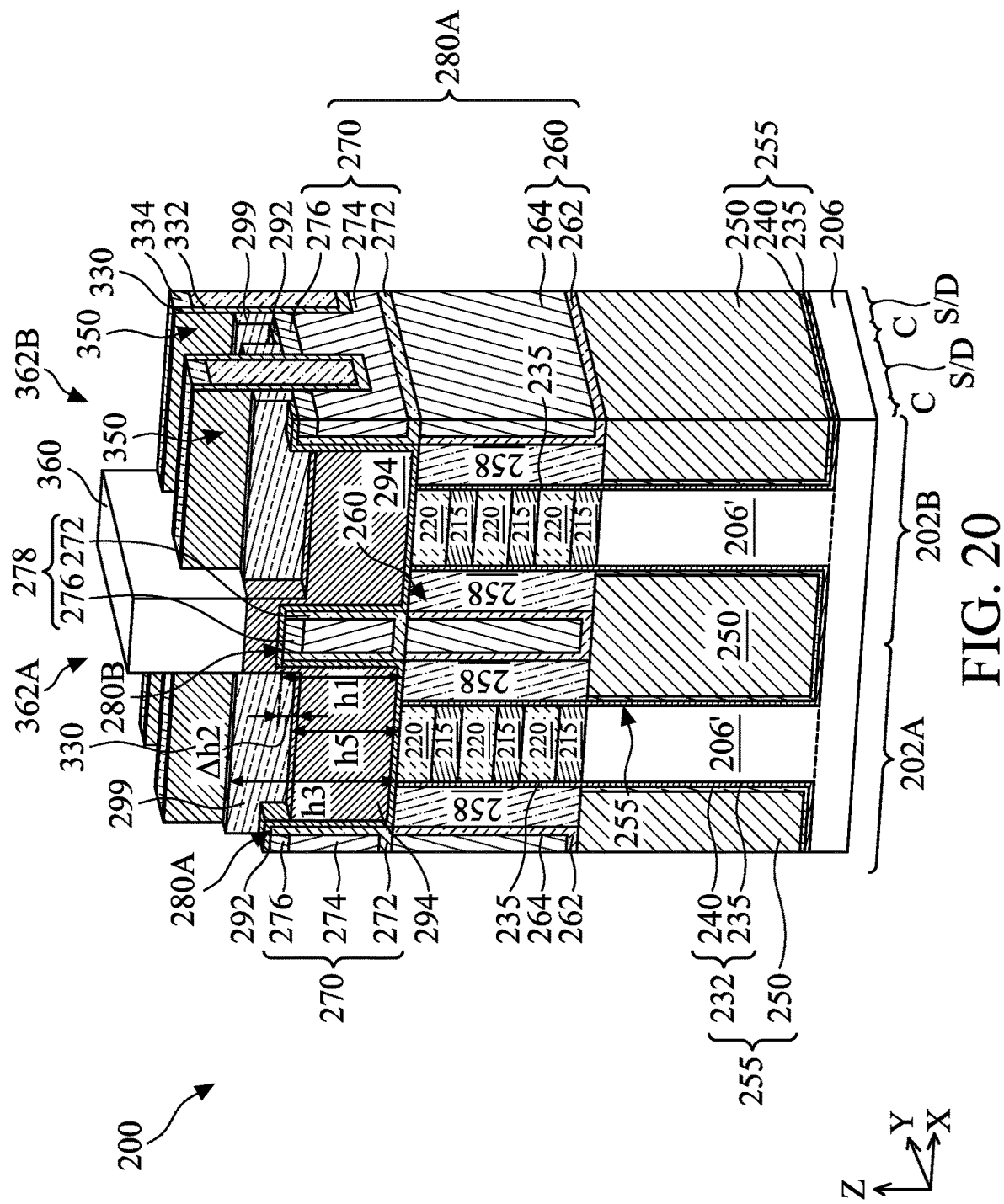
Figure 21:
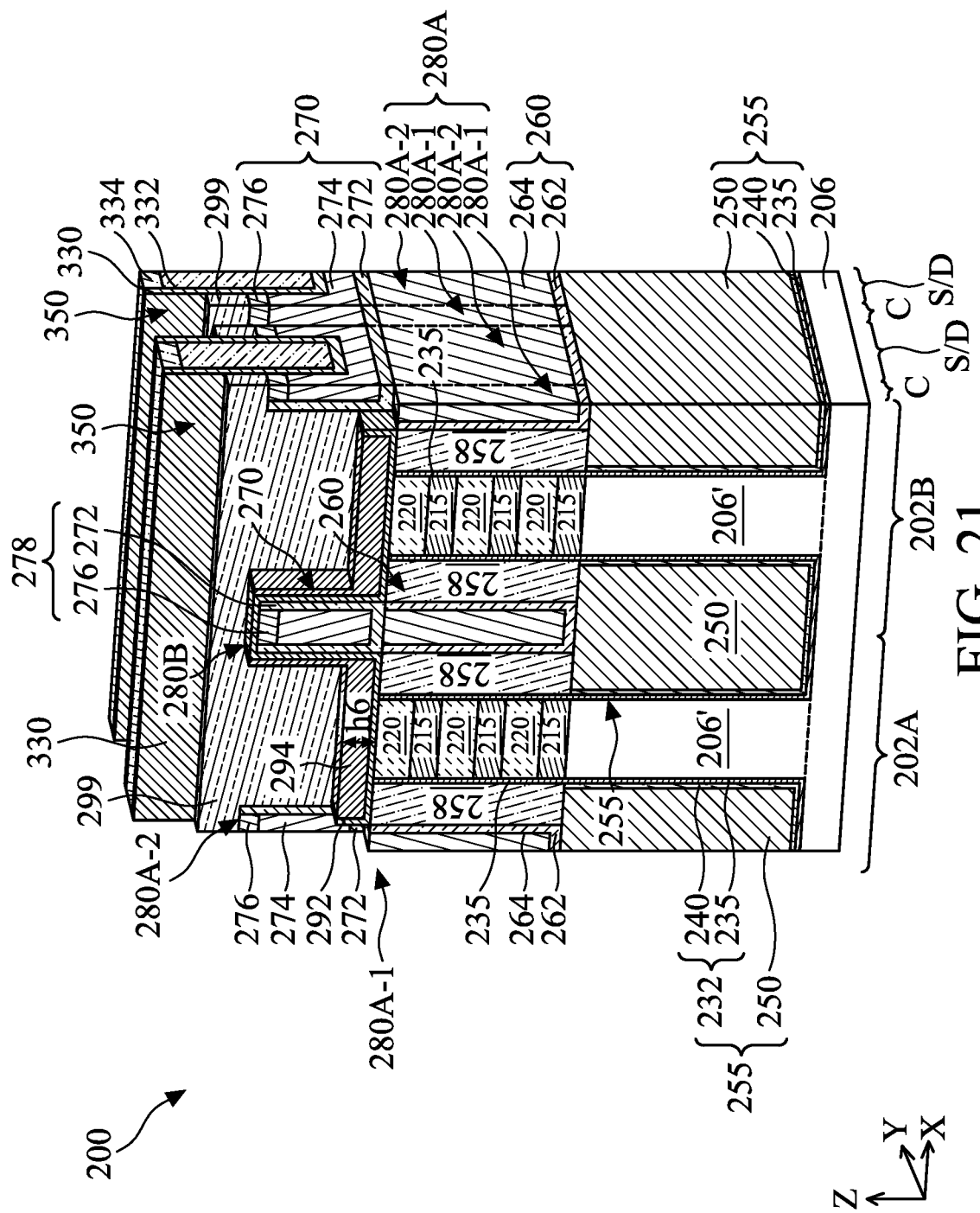

Turning to FIGS. 19-21, dielectric features 270 are removed from gate isolation fins 280A in channel regions of multigate device 200. In FIG. 19, a lithography process, such as those described herein, is performed to form a patterned mask layer 360 having an opening 362A and an opening 362B formed therein. In some embodiments, patterned mask layer 360 is a patterned resist layer. In some embodiments, patterned mask layer 360 is a patterned hard mask layer. In some embodiments, patterned mask layer 360 includes multiple layers, such as a partnered resist layer disposed over a patterned hard mask layer. Patterned mask layer 360 covers dielectric fins that span transistor interface regions, such as gate isolation fin 280B. For example, patterned mask layer 360 covers the transistor interface region between first transistor region 202A and second transistor region 202B, which includes an interface between first transistor region 202A and second transistor region 202B, a portion of first transistor region 202A adjacent to the interface, and a portion of second transistor region 202B adjacent to the interface. In the depicted embodiment, gate isolation fin 280B spans the transistor interface region and thus is covered by patterned mask layer 360. In furtherance of the depicted embodiment, patterned mask layer 360 covers tops and sidewalls of gate isolation fin 280B in channel regions of multigate device 200, including portions of dummy gate dielectrics 292 and dummy gate electrodes 294 disposed thereover. In some embodiments, patterned mask layer 360 covers only tops of gate isolation fin 280B, including portions of dummy gate dielectrics 292 and dummy gate electrodes 294 disposed thereover. Openings 362A, 362B expose dielectric fins that span interface regions between different device features and/or different transistor features within transistor regions, such as gate isolation fins 280A. For example, opening 362A exposes leftmost gate isolation fin 280A in first transistor region 202A, along with portions of gate structures 300 therein, and opening 362B exposes rightmost gate isolation fin 280A in second transistor region 202B, along with portions of gate structures 300 disposed therein.

In FIG. 20, dummy gate electrodes 294, but not gate spacers 299, are further recessed (e.g., etched back) to extend gate openings 350. For example, an etching process further recesses dummy gate electrodes 294, but not gate spacers 299, such that dummy gate electrodes 294 are removed from over top surfaces of gate isolation fins 280A in channel regions of multigate device 200. Patterned mask layer 360 protects gate isolation fin 280B (and portions of dummy gate electrodes 294 thereover) from the etching process. After the etching process, dummy gate electrodes 294 have a height h5 and gate spacers 299 have height h3. Height h5 is less than height h3 and less than height h1, such that top surfaces of portions of dummy gate electrodes 294 disposed over semiconductor layers 220 are lower than top surfaces of gate isolation fins 280A, 280B. In some embodiments, height h5 is about 5 nm to about 20 nm. In some embodiments, a height difference Δh2 between top surfaces of gate isolation fin 280B in channel regions of multigate device 200 and top surfaces of portions of dummy gate electrodes 294 disposed over semiconductor layers 220 is at least about 4 nm to ensure that gate isolation fin 280B is adequately protected during subsequent etching processes, as described further below. The etching process selectively removes dummy gate electrodes 294 with respect to gate spacers 299, CESL 330, ILD protection layer 334, and/or dummy gate dielectrics 232. In other words, the etching process substantially removes dummy gate electrodes 294 but does not remove, or does not substantially remove, gate spacers 299, CESL 330, ILD protection layer 334, and/or dummy gate dielectrics 292. For example, an etchant is selected for the etch process that etches polysilicon (i.e., dummy gate electrodes 294) at a higher rate than dielectric materials (i.e., gate spacers 299, CESL 330, ILD protection layer 334, and/or dummy gate dielectrics 292) (i.e., the etchant has a high etch selectivity with respect to polysilicon). The etching process is a dry etch, a wet etch, other suitable etching process, or combinations thereof. In some embodiments, a dry etch uses an etch gas that includes HBr and/or $Cl_2$ to selectively etch polysilicon (i.e., dummy gate electrodes 294) with respect to dielectric materials (i.e., gate spacers 299, CESL 330, ILD protection layer 334, and/or dummy gate dielectrics 292). In some embodiments, a wet etch uses a tetramethylammonium hydroxide (TMAH) etch solution to selectively etch polysilicon with respect to dielectric materials. In some embodiments, the etching process uses a patterned mask layer as an etch mask, where the patterned mask layer covers gate spacers 299, CESL 330, and/or ILD protection layer 334 but exposes dummy gate electrodes 294.

In FIG. 21, an etching process is performed to remove dielectric features 270 from gate isolation fins 280A in channel regions of multigate device 200, such that gate isolation fins 280A have first portions 280A-1 in channel regions of multigate device 200 and second portions 280A-2 in source/drain regions of multigate device 200. First portions 280A-1 include dielectric features 260, while second portions 280A-2 include both dielectric features 270 (i.e., dielectric liners 272, dielectric layers 274, and dielectric cap layers 276) and dielectric features 260 (i.e., dielectric liners 262 and oxide layers 264). In the depicted embodiment, the etching process selectively etches dielectric features 270 with minimal (to no) etch of gate spacers 299, CESL 330, and/or ILD protection layer 334. In other words, the etching process substantially removes dielectric features 270 but does not remove, or does not substantially remove, gate spacers 299, CESL 330, and/or ILD protection layer 334. For example, an etchant is selected for the etch process that etches high-k dielectric materials (i.e., dielectric liners 272 and dielectric cap layers 276, which may include metal-and-oxygen comprising dielectric materials) and/or low-k dielectric materials (i.e., dielectric layers 274, which may include silicon-and-oxygen comprising dielectric materials configured with low dielectric constants) at a higher rate than other dielectric materials (i.e., gate spacers 299, CESL 330, and/or ILD protection layer 334, which may include silicon-and-nitrogen and/or silicon-and-carbon comprising dielectric materials) (i.e., the etchant has a high etch selectivity with respect to high-k dielectric materials and/or low-k dielectric materials). The etching process is a dry etch, a wet etch, other suitable etching process, or combinations thereof. In some embodiments, the etch process includes multiple steps, such as a first etch step that selectively etches high-k dielectric materials (e.g., dielectric cap layers 276 and dielectric liners 272), a second etch step that selectively etches low-k dielectric materials (e.g., dielectric layers 274), and/or a third etch step that selectively etches high-k dielectric materials (e.g., remainder of dielectric liners 272). In some embodiments, the etchant has a first etch selectivity between dielectric features 270 and gate spacers 299, CESL 330, and/or ILD protection layer 334 (e.g., silicon-and-nitrogen and/or silicon-and-carbon comprising dielectric materials) and a second etch selectivity between dielectric features 270 and dummy gate electrodes 294 (e.g., polysilicon) and/or dummy gate dielectrics 292 (e.g., silicon oxide), where the first etch selectivity is greater than the second etch selectivity. In such embodiments, such as depicted in FIG. 21, the etching process does not remove (or minimally removes) gate spacers 299, CESL 330, and/or ILD protection layer 334, but does remove dummy gate electrodes 294 and/or dummy gate dielectrics 292. For example, the etching process removes portions of dummy gate dielectrics 292 that cover dielectric features 270 of gate isolation fins 280A and partially removes portions of dummy gate electrodes 294 that cover gate isolation fin 280B, semiconductor layers 220, and/or silicon germanium sacrificial layers 258. In some embodiments, patterned mask layer 360 is removed before performing the etching process to remove dielectric features 270 from gate isolation fins 280A, for example, by a resist stripping process, an etching process, other suitable process, or combinations thereof. In some embodiments, patterned mask layer 360 is removed partially, or completely, by the etching process. In such embodiments, a remainder of patterned mask layer 360 can be removed by any suitable process from multigate device 200 after the etching process.

Figure 22:
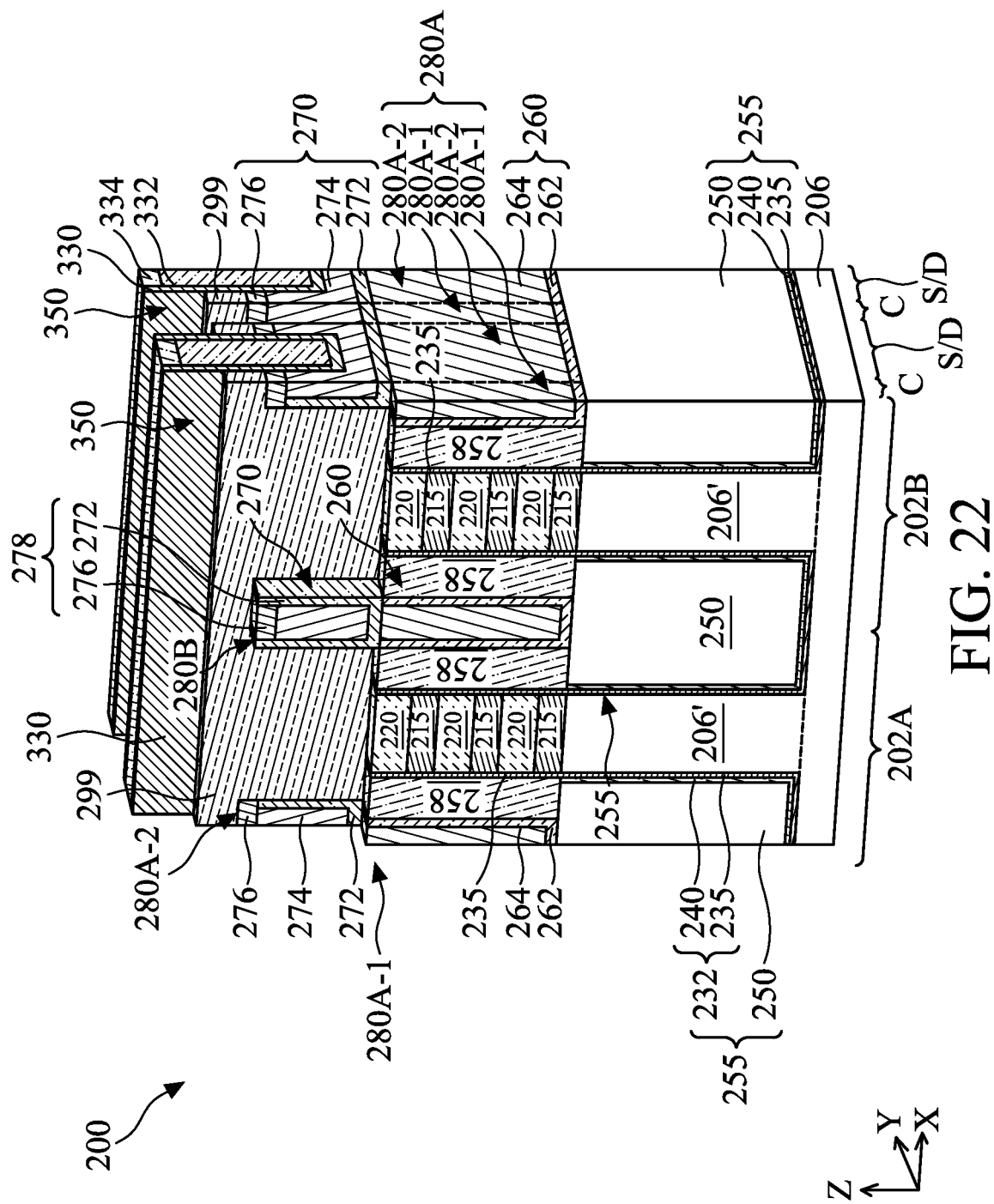

In FIG. 22, a remainder of dummy gate electrodes 294 and dummy gate dielectrics 232 are removed to further extend gate openings 350. For example, an etching process completely removes dummy gate electrodes 294 and dummy gate dielectrics 232 to expose semiconductor layer stacks 210. The etching process is similar to the etching process used to partially remove dummy gate electrodes 294 described above with reference to FIG. 20. For example, the etching process is configured to selectively etch dummy gate electrodes 294 and dummy gate dielectrics 232 with minimal (to no) etching of other features of multigate device 200, such as gate spacers 299, gate isolation fins 280A, 280B, CESL 330, ILD protection layer 334, and/or semiconductor layers 220. The etching process is a dry etch, a wet etch, other suitable etching process, or combinations thereof. In some embodiments, a dry etch uses an etch gas that includes HBr and/or $Cl_2$ to selectively etch polysilicon (i.e., dummy gate electrodes 294) with respect to dielectric materials (i.e., gate spacers 299, CESL 330, ILD protection layer 334, and/or dummy gate dielectrics 292). In some embodiments, a wet etch uses TMAH to selectively etch polysilicon with respect to dielectric materials. In some embodiments, the etch process includes multiple steps. For example, the etching process may alternate etchants to separately remove various layers of dummy gate electrodes 294. In some embodiments, a lithography process, such as those described herein, is performed to form a patterned mask layer that covers ILD layer 332, CESL 330, gate isolation fin 280B, and/or gate spacers 299 during the etching process. In some embodiments, the etching process used to remove the remainder of dummy gate electrodes 294 in FIG. 22 is different than the etching process used to partially remove dummy gate electrodes 294 described above with reference to FIG. 20. For example, the etching process used to remove the remainder of dummy gate electrodes 294 is a wet poly etch, while the etching process used to partially remove dummy gate electrodes 294 described above with reference to FIG. 20 is a dry poly etch, or vice versa. In some embodiments, the etching process used to remove the remainder of dummy gate electrodes 294 in FIG. 22 is the same as the etching process used to partially remove dummy gate electrodes 294 described above with reference to FIG. 20. For example, both etching processes are dry (or wet) poly etches.

Figure 23:
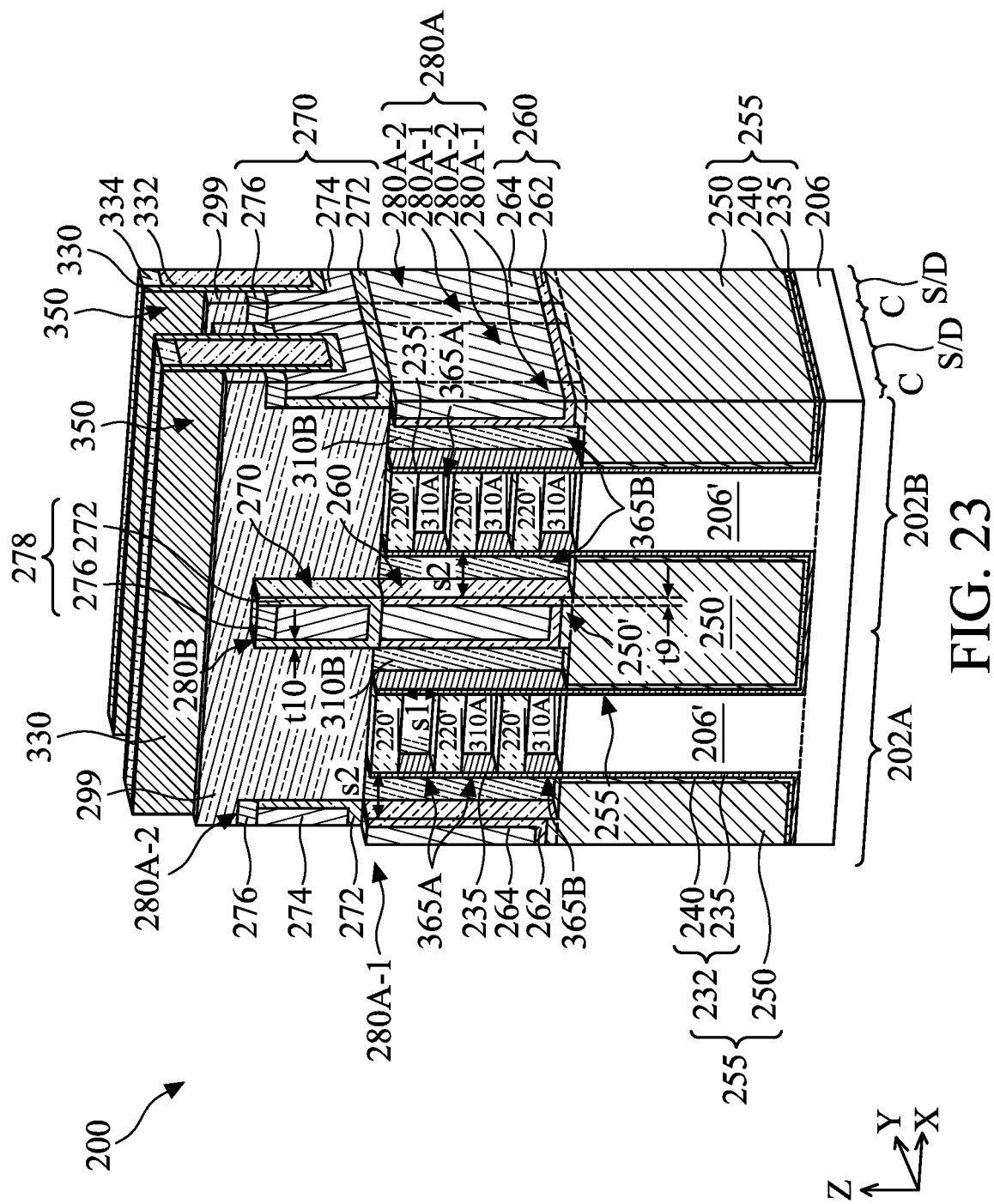

In FIG. 23, a channel release process is performed to form channels for transistors within first transistor region 202A and second transistor region 202B of multigate device 200. For example, semiconductor layers 215 of semiconductor layer stacks 210 exposed by gate openings 350 are selectively removed from channel regions of multigate device 200, thereby forming suspended semiconductor layers 220' separated from one another and/or fin portions 206' by gaps 365A. Silicon germanium sacrificial layers 258 (and dielectric liners 235) are also selectively removed from channel regions of multigate device 200, thereby forming gaps 365B between suspended semiconductor layers 220' and gate isolation fins 280A, 280B. As such, first transistor region 202A and second transistor region 202B each have three suspended semiconductor layers 220' vertically stacked along the z-direction for providing three channels through which current can flow between respective epitaxial source/drain features 320A, 320B during operation of transistors corresponding, respectively, with first transistor region 202A and second transistor region 202B. Suspended semiconductor layers 220' are thus referred to as channel layers 220' hereinafter. In the depicted embodiment, top surfaces of topmost channel layers 220' are lower than top surface of gate isolation fin 280B in channel regions of multigate device 200 (i.e., transistor channel heights are less than heights of gate isolation fin 280B relative to top surface of substrate 206) and substantially planar with top surfaces of gate isolation fins 280A in channel regions of multigate device 200. A spacing s1 is between channel layers 220' along the z-direction, and a spacing s2 is between channel layers 220' and gate isolation fins 280A, 280B along the x-direction. Spacing s1 and spacing s2 correspond with widths of gaps 365A and gaps 365B, respectively. In some embodiments, spacing s1 is about equal to thickness t1 of semiconductor layers 215, and spacing s2 is about equal to a sum of a thickness of silicon germanium sacrificial layers 258 and a thickness of dielectric liners 235. In some embodiments, spacing s1 is about 8 nm to about 15 nm. In some embodiments, spacing s2 is about 8 nm to about 15 nm. In some embodiments, channel layers 220' have nanometer-sized dimensions and can be referred to as "nanostructures," alone or collectively. For example, each channel layer 220' can have a width along the x-direction that is about 8 nm to about 100 nm, a length along the y-direction that is about 8 nm to about 100 nm, and a thickness along the z-direction that is about 3 nm to about 10 nm. Channel layers 220' can have cylindrical-shaped profiles (e.g., nanowires), rectangular-shaped profiles (e.g., nanobars), sheet-shaped profiles (e.g., nanosheets (e.g., dimensions in the X-Y plane are greater than dimensions in the X-Z plane and the Y-Z plane to form sheet-like structures)), or any other suitable shaped profile. In some embodiments, channel layers 220' have sub-nanometer dimensions and/or other suitable dimensions.

In some embodiments, an etching process is performed to selectively etch semiconductor layers 215 and silicon germanium sacrificial layers 258' with minimal (to no) etching of semiconductor layers 220, fin portions 206', isolation features 255, gate isolation fins 280A, 280B, gate spacers 299, inner spacers 310A, inner spacers 310B, CESL 330, and/or ILD protection layer 334. For example, an etchant is selected for the etch process that etches silicon germanium (i.e., semiconductor layers 215 and silicon germanium sacrificial layers 258) at a higher rate than silicon (i.e., semiconductor layers 220 and fin portions 206') and dielectric materials (i.e., isolation features 255, gate isolation fins 280A, 280B, gate spacers 299, inner spacers 310A, inner spacers 310B, CESL 330, and/or ILD protection layer 334) (i.e., the etchant has a high etch selectivity with respect to silicon germanium). The etching process is a dry etch, a wet etch, or combinations thereof. In some embodiments, a dry etch uses a fluorine-containing gas (for example, $SF_6$) to selectively etch semiconductor layers 215 and silicon germanium sacrificial layers 258. In some embodiments, a wet etch uses an etching solution that includes $NH_4OH$ and $H_2O$ to selectively etch semiconductor layers 215 and silicon germanium sacrificial layers 258. In some embodiments, a chemical vapor phase etching process using HCl selectively removes semiconductor layers 215 and silicon germanium sacrificial layers 258. In some embodiments, before the etching process, an oxidation process can be implemented to convert semiconductor layers 215 and/or silicon germanium sacrificial layers 258 into silicon germanium oxide features, where the etching process then removes silicon germanium oxide features. In some embodiments, the etching process uses a patterned mask layer as an etch mask, where the patterned mask layer covers ILD protection layer 334, CESL 330, gate spacers 299, and/or gate isolation fins but has openings therein that expose semiconductor layers 220 and silicon germanium sacrificial layers 258 in channel regions of multigate device 200. In some embodiments, the etching process includes multiple steps. For example, a two-step channel release process can include a first etch for removing silicon germanium sacrificial layers 258 and a second etch for removing semiconductor layers 215 and dielectric liner 235. In some embodiments, after removing semiconductor layers 215 and silicon germanium sacrificial layers 258, an etching process may be performed to modify a profile of channel layers 220' to achieve target dimensions and/or target shapes for channel layers 220'.

In some embodiments, the channel release process partially, but minimally, etches dielectric liners 262 of dielectric features 260 of gate isolation fins 280A, 280B and/or dielectric liners 272 of dielectric features 270 of gate isolation fins 280A, 280B. For example, in FIG. 23, the etching process slightly etches dielectric liners 262 and dielectric liners 272, thereby reducing a thickness of dielectric liners 262 along sidewalls of dielectric features 260 in channel regions of multigate device 200 and reducing a thickness of dielectric liners 272 along sidewalls of dielectric features 270 in channel regions of multigate device 200. In such embodiments, a thickness t9 of sidewall portions of dielectric liners 262 after the channel release process is less than thickness t6 (and, in the depicted embodiment, is less than thickness t6 of bottom portions of dielectric liners 262), and a thickness t10 of sidewall portions of dielectric liners 272 after the channel release process is less than thickness t7 (and, in the depicted embodiment, is less than thickness t7 of bottom portions of dielectric liners 272). In furtherance of such embodiments, sidewall portions of dielectric liners 262 will have thickness t9 in channel regions of multigate device 200 while sidewall portions of dielectric liners 262 will have thickness t6 in source/drain regions of multigate device 200. In furtherance of such embodiments, sidewall portions of dielectric liners 272 will have thickness t10 in channel regions of multigate device 200 while sidewall portions of dielectric liners 272 will have thickness t7 in source/drain regions of multigate device 200. Dielectric liners 262 and dielectric liners 272 can thus protect oxide layers 264 and dielectric layers 274, respectively, from etching during the channel release process. In some embodiments, the channel release process partially, but minimally, etches dielectric cap layers 276 of dielectric features 270 of gate isolation fin 280B. For example, a thickness of dielectric cap layers 276 after the channel release process may be less than thickness t8. In some embodiments, the channel release process partially, but minimally, etches semiconductor layers 220, fin portions 206', and/or isolation features 255. For example, in FIG. 23, the etching process slightly recesses fin portions 206', such that topmost surfaces of fin portions 206' in channel regions of multigate device 200 are lower than topmost surfaces of fin portions 206' in source/drain regions of multigate device 200 relative to a top surface of substrate 206. In furtherance of the example, in FIG. 23, the etching process also slightly recesses portions of isolation features 255 that are exposed by gate openings 350, such as portions of isolation features 255 that are not covered by gate isolation fins 280A, 280B. The etching process does not recess portions of oxide layers 250 disposed under gate isolation fins 280A, 280B, such that isolation features 255 have oxide extensions 250' in channel regions of multigate device 200. In such embodiments, topmost surfaces of fin portions 206' in channel regions of multigate device 200 are lower than topmost surfaces of oxide extensions 250' of isolation features 255 relative to the top surface of substrate 206. In some embodiments, topmost surfaces of recessed portions of isolation features 255 are substantially planar with topmost surfaces of fin portions 206' in channel regions of multigate device 200. In some embodiments, the etching process may reduce widths and/or thicknesses of semiconductor layers 220 along the x-direction and the z-direction, respectively, such that widths and/or thicknesses of channel layers 220' are less than widths and/or thicknesses (e.g., thickness t2) of semiconductor layers 220 before the etching process.

Figure 24:
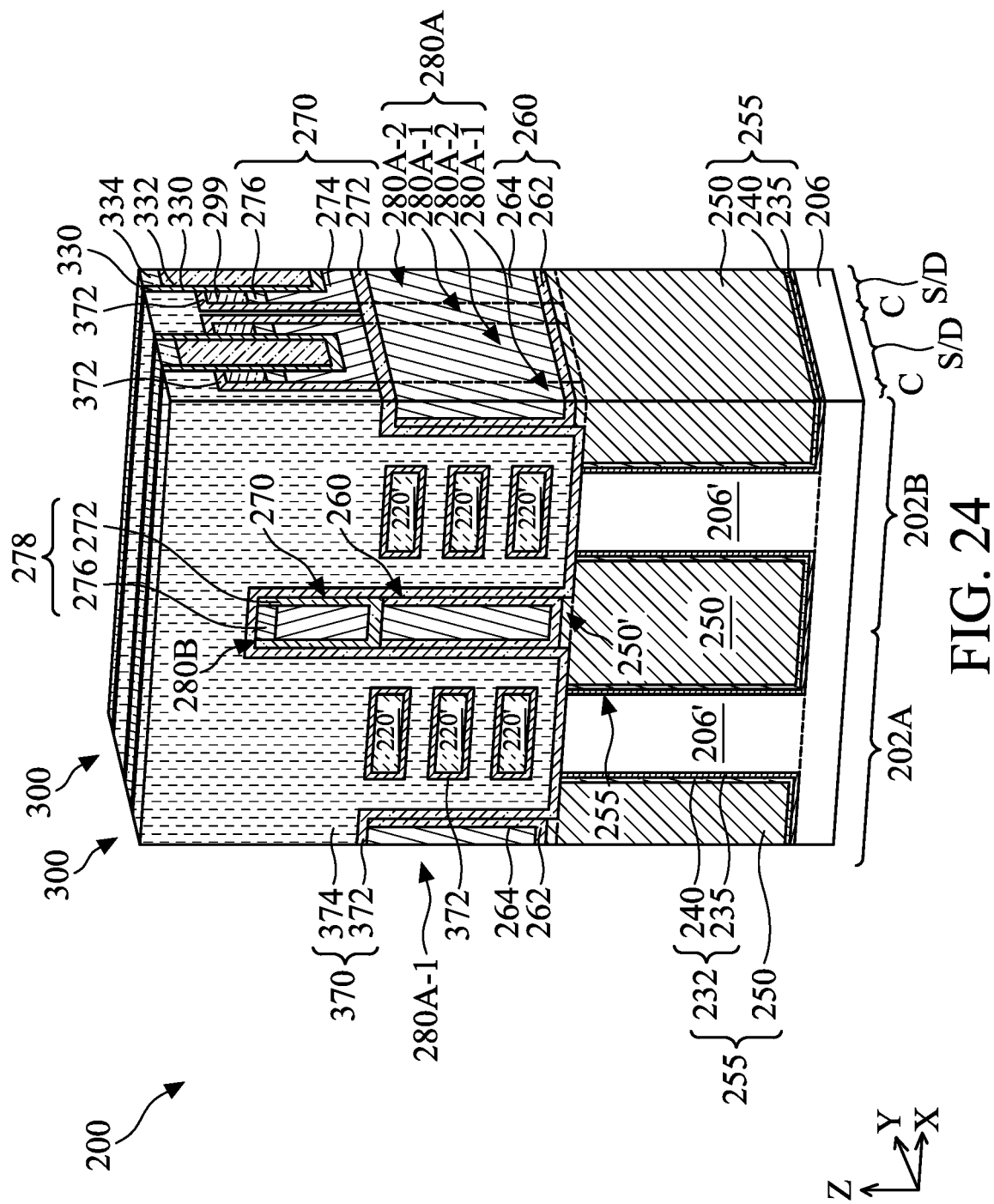

Turning to FIG. 24, metal gates 370 (also referred to as metal gate stacks and/or high-k/metal gates) are formed in gate openings 350. Metal gates 370 are configured to achieve desired functionality according to design requirements of multigate device 200. Each of metal gates 370 includes a gate dielectric 372 (e.g., a gate dielectric layer) and a gate electrode 374 (e.g., a work function layer and a bulk conductive layer). Metal gates 370 may include numerous other layers, such as capping layers, interface layers, diffusion layers, barrier layers, hard mask layers, or combinations thereof. In some embodiments, forming metal gates 370 includes depositing a gate dielectric layer over multigate device 200, where the gate dielectric layer partially fills gate openings 350, depositing a gate electrode layer over the gate dielectric layer, where the gate electrode layer fills remainders of gate openings 350, and performing a planarization process to remove excess gate materials from multigate 200. For example, a CMP process is performed until a top surface of ILD protection layer 334 is reached (exposed), such that top surfaces of gate structures 300 are substantially planar with a top surface of ILD protection layer 334 after the CMP process. Metal gates 370 fill gaps 365A and gaps 365B. Metal gates 370 surround channel layers 220'. Gate dielectrics 372 and gate electrodes 374 extend uninterrupted from first transistor region 202A to second transistor region 202B. Since metal gates 370 span first transistor region 202A and second transistor region 202B, metal gates 370 may have different layers in regions corresponding with first transistor region 202A and second transistor region 202B. For example, a number, configuration, and/or materials of layers of gate dielectrics 372 and/or gate electrodes 374 corresponding with second transistor region 202B may be different than a number, configuration, and/or materials of layers of gate dielectrics 372 and/or gate electrodes 374 corresponding with first transistor region 202A.

Gate dielectrics 372 partially fill gate openings 350 and wrap respective channel layers 220', such that gate dielectrics 372 partially fill gaps 365A and gaps 365B. In the depicted embodiment, gate dielectrics 372 cover top surfaces, bottom surfaces, and sidewalls of channel layers 220'. For example, gate dielectrics 372 surround channel layers 220', such that each channel layer 220' is wrapped and/or surrounded by a respective gate dielectric 372. In some embodiments, gate dielectrics 372 are further disposed over fin portions 206', isolation features 255, first portions 280A-1 of gate isolation fins 280A, and gate isolation fin 280B in channel regions of multigate device 200. In the depicted embodiment, each gate opening 350 is partially filled with a respective gate dielectric 372 that is disposed over fin portions 206', isolation features 255, first portions 280A-1 of gate isolation fins 280A, and gate isolation fin 280B, extending uninterrupted from first transistor region 202A to second transistor region 202B. Gate dielectrics 372 include a high-k dielectric layer, which includes a high-k dielectric material, which for purposes of metal gates 370 refers to a dielectric material having a dielectric constant that is greater than that of silicon dioxide. For example, the high-k dielectric layer includes $HfO_2$, HfSiO, $HfSiO_4$, HfSiON, HfLaO, HfTaO, HfTiO, HfZrO, HfAlO, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, the high-k dielectric layer is deposited by ALD. In some embodiments, the ALD is a conformal deposition process, such that a thickness of the high-k dielectric layer is substantially uniform over the various surfaces of multigate device 200. In some embodiments, gate dielectrics 372 include an interfacial layer disposed between the high-k dielectric layer and channel layers 220'. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof. For example, the interfacial layer is formed by a chemical oxidation process that exposes channel layers 220' to hydrofluoric acid. In some embodiments, the interfacial layer is formed by a thermal oxidation process that exposes channel layers 220' to an oxygen and/or air ambient. In some embodiments, the interfacial layer is formed after forming the high-k dielectric layer. For example, after forming the high-k dielectric layer, multigate device 200 may be annealed in an oxygen and/or nitrogen ambient (e.g., nitrous oxide).

Gate electrodes 374 are formed over gate dielectrics 372, filling remainders of gate openings 350 and wrapping respective channel layers 220', such that gate electrodes 374 fill remainders of gaps 365A and gaps 365B. In the depicted embodiment, gate electrodes 374 are disposed along top surfaces, bottom surfaces, and sidewalls of channel layers 220'. For example, gate electrodes 374 surround channel layers 220'. In some embodiments, gate electrodes 374 are further disposed over fin portions 206', isolation features 255, first portions 280A-1 of gate isolation fins 280A, and gate isolation fin 280B in channel regions of multigate device 200, extending uninterrupted from first transistor region 202A to second transistor region 202B. Gate electrodes 374 include a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes 374 include a work function layer and a bulk conductive layer. The work function layer can be a metal layer tuned to have a desired work function (e.g., an n-type work function or a p-type work function), and the bulk layer can be a bulk metal layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrodes 374 are formed by any of the processes described herein, such as ALD, CVD, PVD, plating, other suitable process, or combinations thereof.

Figure 25:
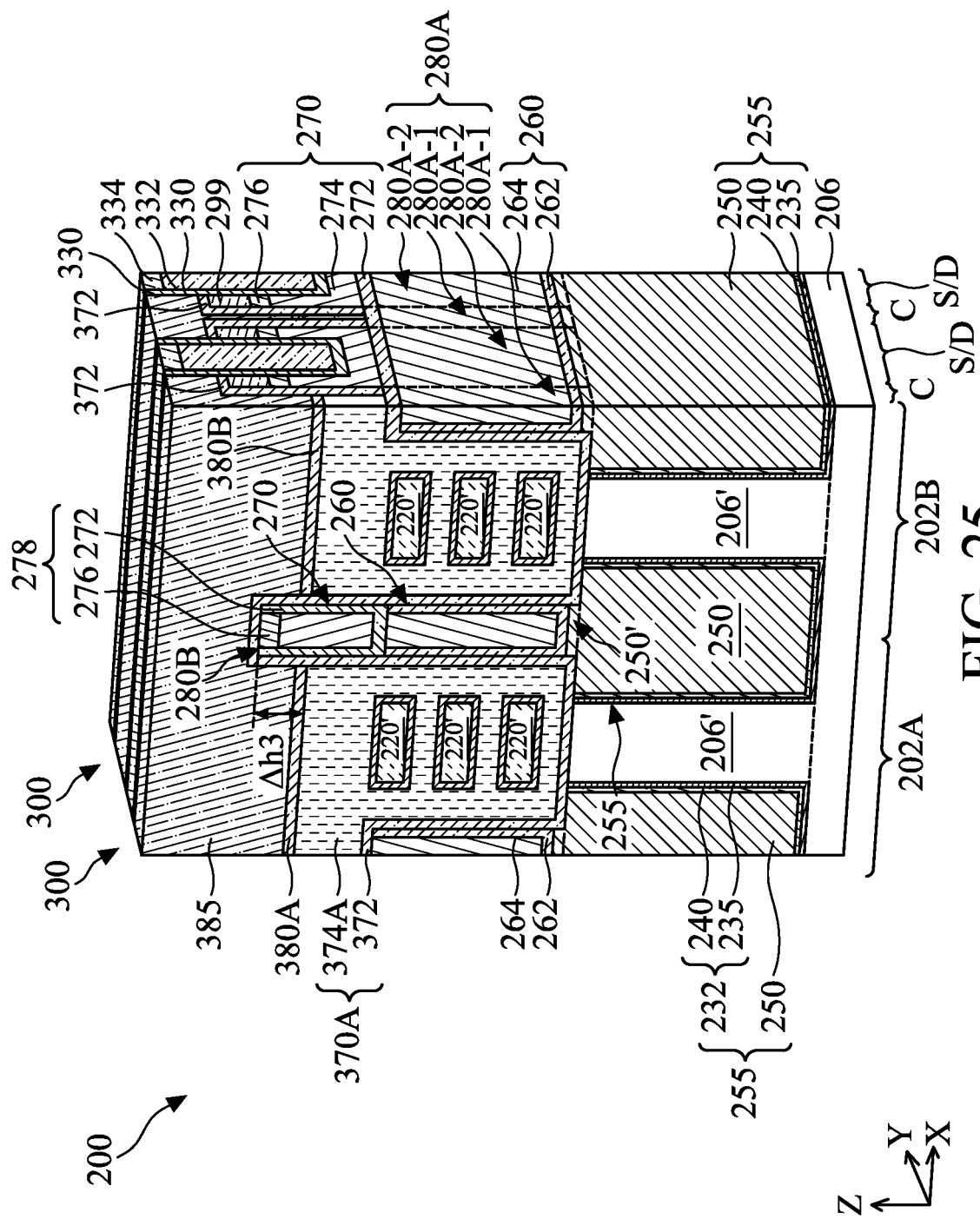

Turning to FIG. 25, a self-aligned metal gate cut process is performed that removes portions of metal gates 370 to form metal gates 370A in first transistor region 202A and metal gates 370B in second transistor region 202B, where gate isolation fin 280B separates and isolates metal gates 370A from metal gates 370B. For example, an etch back process is performed to recess gate electrodes 374 until top surface of gate isolation fin 280B is free of gate electrodes 374 (i.e., gate electrodes 374 are not disposed over and do not extend over top surface of gate isolation fin 280B). The etch back process reopens gate openings 350. After the etch back process, gate electrodes 374 no longer extend uninterrupted from first transistor region 202A to second transistor region 202B, thereby forming gate electrodes 374A in first transistor region 202A and gate electrodes 374B in second transistor region 202B, where gate isolation fin 280B separates gate electrodes 374A and gate electrodes 374B from one another. In some embodiments, such as depicted, the etch back process partially removes portions of gate electrodes 374 disposed over gate isolation fins 280A, such that gate electrodes 374A, 374B remain and extend over gate isolation fins 280A (in particular, first portions 280A-1 of gate isolation fins 280A). In some embodiments, the etch back process also completely removes portions of gate electrodes 374 disposed over gate isolation fins 280B, such that gate electrodes 374A, 374B do not extend over gate isolation fins 280B. In the depicted embodiment, top surfaces of gate electrodes 374A, 374B are lower than top surface of gate isolation fin 280B and higher than top surfaces of gate isolation fins 280A relative to a top surface of substrate 206. For example, a height difference Δh3 between topmost surfaces of gate electrodes 374A, 374B and topmost surface of gate isolation fin 280B (e.g., topmost surface of dielectric layer 276) is about 5 nm to about 20 nm. In some embodiments, top surfaces of gate electrodes 374A, 374B are substantially planar with top surface of gate isolation fin 280B. In some embodiments, top surfaces of gate electrodes 374A, 374B are substantially planar with top surfaces of gate isolation fins 280A. In the furtherance of the depicted embodiment, the etch back process does not, or minimally, etches gate dielectrics 372, such that gate dielectrics 372 still extend uninterrupted from first transistor region 202A to second transistor region 202B and further remain, completely or partially depending on etching amount, along sidewalls of gate spacers 299. Accordingly, metal gates 370A include respective portions of respective gate dielectrics 372 and respective gate electrodes 374A, and metal gates 370B include respective portions of respective gate dielectrics 372 and respective gate electrodes 374B.

The metal gate cut process is referred to as "self-aligned" because gate isolation structures (here, gate isolation fin 280B) are aligned between metal gates 370A and metal gates 370B without having to perform a lithography process after forming metal gates 370. The self-aligned placement of the gate isolation structures provides electrical isolation between different devices, such as transistors, of multigate device 200. The etch back process is configured to selectively remove gate electrodes 374 with respect to gate dielectrics 372, ILD protection layer 334, CESL 330, gate spacers 299, and/or gate isolation fins 280A, 280B. In other words, the etch back process substantially removes gate electrodes 374 but does not remove, or does not substantially remove, gate dielectrics 372, ILD protection layer 334, CESL 330, gate spacers 299, and/or gate isolation fins 280A, 280B. For example, an etchant is selected for the etch process that etches metal materials (e.g., gate electrodes 374) at a higher rate than dielectric materials (e.g., gate dielectrics 372, ILD protection layer 334, CESL 330, gate spacers 299, and/or gate isolation fins 280A, 280B (in particular, dielectric shells 278)) (i.e., the etchant has a high etch selectivity with respect to metal materials). The etch back process is a dry etch, a wet etch, other suitable etching process, or combinations thereof. In some embodiments, the etch back process is a wet etch uses a wet etchant solution that includes $NH_4OH$, $H_2O_2$, and $H_2O$ to remove metal materials without substantially removing dielectric materials. In some embodiments, the etch back process includes multiple steps, such as a first etch step to remove a first layer (or first set of layers) of gate electrodes 374 and a second etch step to remove a second layer (or second set of layers) of gate electrodes 374.

Metal cap layers are then formed in the gate openings over gate electrodes 374A, 374B. For example, metal cap layers 380A are formed over gate electrodes 374A and metal cap layers 380B are formed over gate electrodes 374B. Metal cap layers 380A, 380B have a thickness t11 that is less than height difference Δh3, such that metal cap layers 380A, 380B are disposed below top surface of gate isolation fin 280B and partially fill gate openings 350. In some embodiments, thickness t11 is about 2 nm to about 6 nm. Metal cap layers 380A, 380B include tungsten, tungsten alloy, ruthenium, ruthenium alloy, cobalt, cobalt alloy, copper, copper alloy, aluminum, aluminum alloy, iridium, iridium alloy, palladium, palladium alloy, platinum, platinum alloy, nickel, nickel alloy, titanium, titanium alloy (e.g., TiN), tantalum, tantalum alloy (e.g., TaN), other low resistivity metal constituent and/or alloys thereof, or combinations thereof. In the depicted embodiment, metal cap layers 380A, 380B are tungsten layers, such as fluorine-free tungsten layers. In some embodiments, metal cap layers 380A, 380B are formed by a bottom-up deposition process, which generally refers to a deposition process that fills an opening from bottom to top. In some embodiments, the bottom-up deposition process is selective CVD, where various parameters of the selective CVD are tuned to selectively grow tungsten, ruthenium, cobalt, or alloys thereof from metal cap seed layers while limiting (or preventing) growth of tungsten, ruthenium, cobalt, or alloys thereof from gate isolation fins 280A, 280B, CESL 330, and/or ILD protection layer 334. In some embodiments, metal cap layers 380A, 380B are deposited by another suitable selective deposition process. In some embodiments, metal cap layers 380A, 380B are formed by blanket depositing a metal cap material over multigate device 200 and patterning the metal cap material. In some embodiments, metal cap seed layers are formed over gate electrodes 374A, 374B before forming metal cap layers 380A, 380B, for example, by PVD. In such embodiments, metal cap seed layers are considered a portion of metal cap layers 380A, 380B. The metal cap seed layers include a metal-comprising material that facilitates growth and/or deposition of metal cap layers 380A, 380B and promotes adhesion of metal cap layers 380A, 380B and gate electrodes 374A, 374B. The metal-comprising material can include titanium, titanium alloy, tantalum, tantalum alloy, cobalt, cobalt alloy, ruthenium, ruthenium alloy, molybdenum, molybdenum alloy, palladium, palladium alloy, other suitable constituent, or combinations thereof. For example, the metal cap seed layers include tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In the depicted embodiment, where metal cap layers 380A, 380B are tungsten layers, metal cap seed layers can be titanium nitride layers disposed between metal cap layers 380A, 380B and gate electrodes 374A, 374B. In some embodiments, a thickness of the metal cap seed layers is less than about 2 nm.

Dielectric cap layers are then formed in the gate openings over metal cap layers 380A, 380B. For example, dielectric cap layers 385 are formed over metal cap layers 380A, 380B. Dielectric cap layers 385 fill remainders of the gate openings and can improve lithography process windows (e.g., increase overlay margins) associated with forming source/drain contacts to epitaxial source/drain features 320A, 320B. Along the x-direction, dielectric cap layers 385 span first transistor region 202A and second transistor region 202B, and dielectric cap layers 385 extend over and wrap a top portion of gate isolation fin 280B. Along the y-direction, dielectric cap layers 385 are disposed between and physically contact CESL 330 and gate spacers 299. In some embodiments, such as depicted, widths of dielectric cap layers 385 between CESL 330 are greater than widths of dielectric cap layers 385 between gate spacers 299. Dielectric cap layers 385 include a material that is different than a material of ILD layer 332 to achieve etching selectivity and/or planarization selectivity during subsequent processing. For example, where ILD layer 332 includes a silicon-and-oxygen comprising material, dielectric cap layers 385 can include a silicon-and-nitrogen comprising material, such as silicon nitride, silicon oxynitride, or silicon carbonitride. In some embodiments, dielectric cap layers 385 include silicon, silicon oxide, silicon carbide, silicon oxycarbonitride, silicon oxycarbide, other suitable material, or combinations thereof. In some embodiments, dielectric cap layers 385 include a metal-and-oxygen comprising material and/or a metal-and-nitrogen comprising material, such as aluminum oxide (e.g., AlO or $Al_2O_3$), aluminum nitride (e.g., AlN), aluminum oxynitride (e.g., AlON), zirconium oxide (e.g., Zr or $ZrO_2$), zirconium nitride (e.g., ZrN), hafnium oxide (e.g., HfO or $HFO_2$), zirconium aluminum oxide (e.g., ZrAlO), other metal oxide, other metal nitride or combinations thereof. In some embodiments, a deposition process and a planarization process are performed to form dielectric capping layers 385 over metal cap layers 380A, 380B. For example, fabrication proceeds with depositing a dielectric cap material over multigate device 200 that fills remainders of the gate openings and performing a planarization process (e.g., CMP) on the dielectric cap material until reaching and exposing ILD layer 332, which function as a planarization stop layer. The planarization process may thus remove ILD protection layer 334 from over multigate device 200. In some embodiments, the planarization process removes portions of CESL 330 extending above top surfaces of ILD layer 332. The dielectric capping material can be formed by CVD, PVD, ALD, HDPCVD, MOCVD, RPCVD, PECVD, LPCVD, ALCVD, APCVD, other suitable methods, or combinations thereof.

Figure 26:
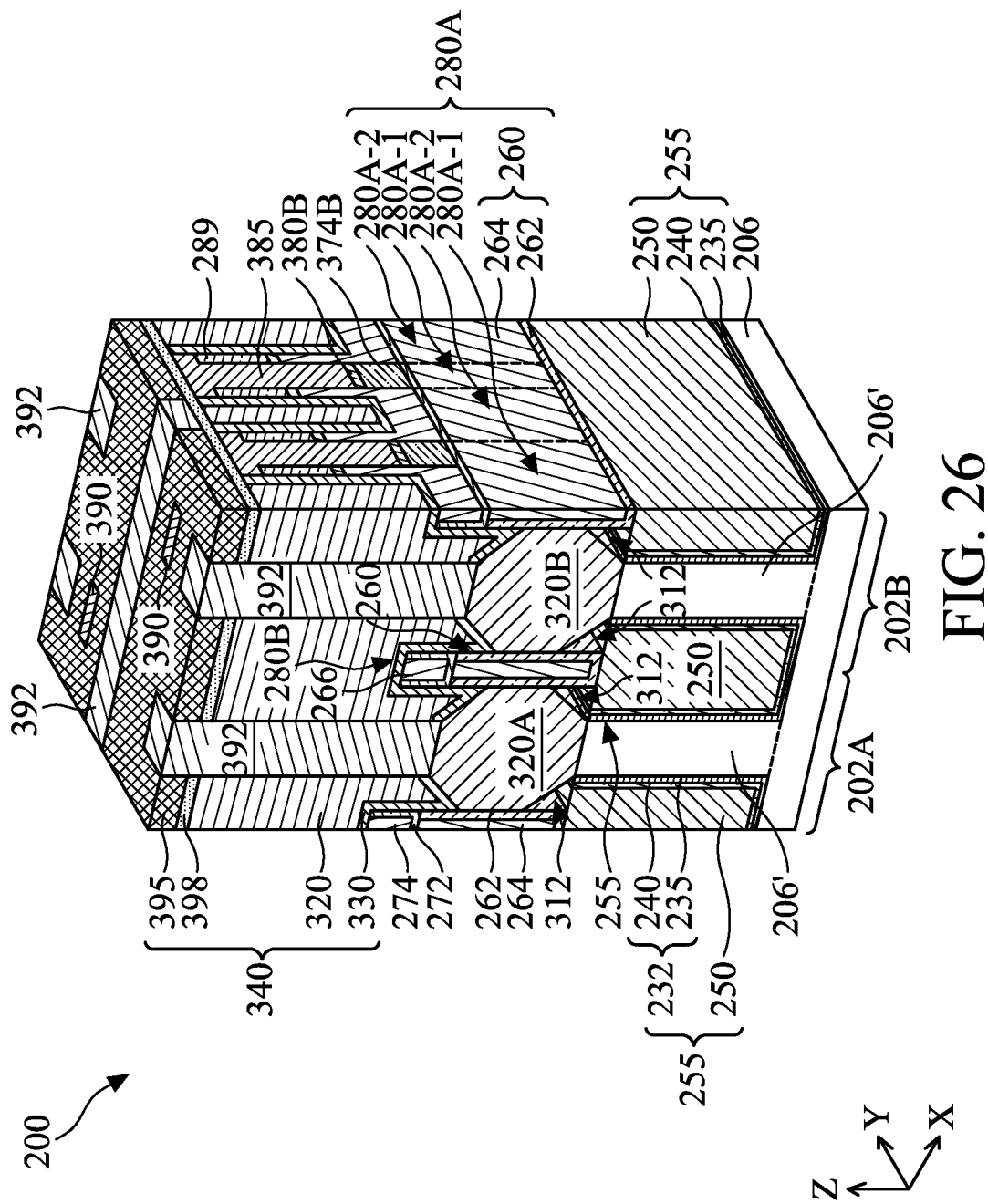
Figure 27A:
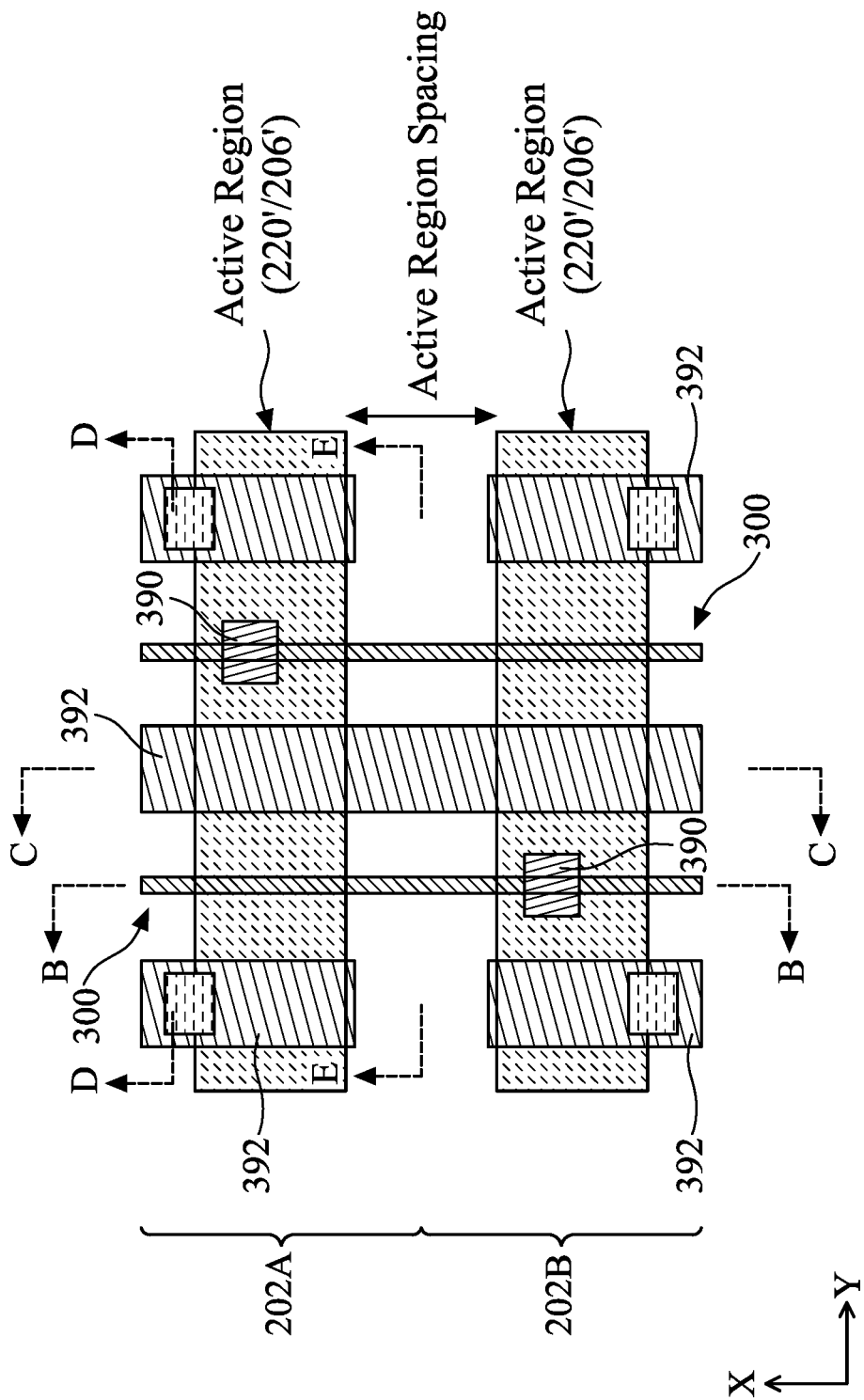
FIG. 27A is a fragmentary top view of the multigate device of FIG. 26, in portion or entirety.
Figure 27B:
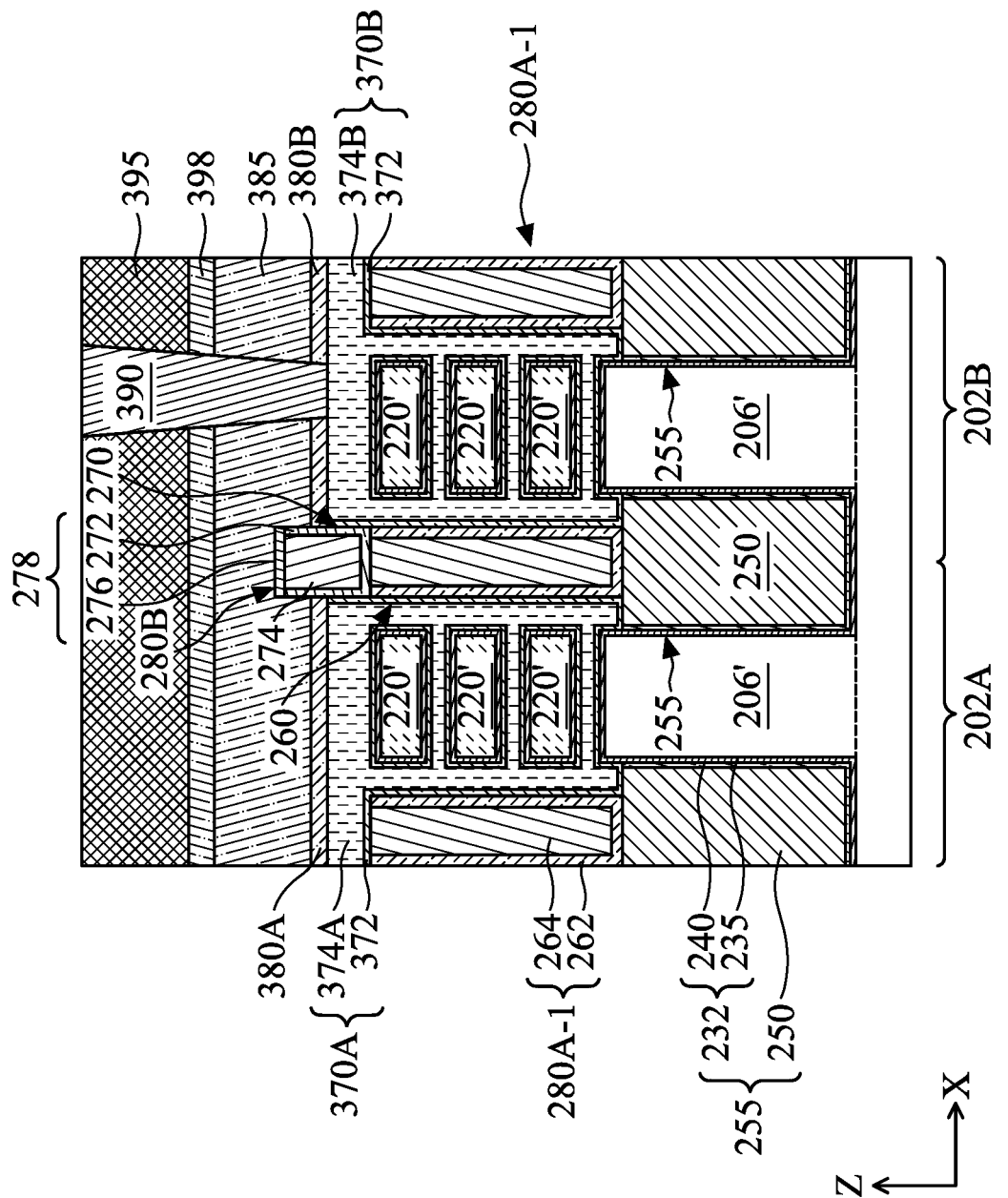
FIGS. 27B-27E are fragmentary cross-sectional views of the multigate device of FIG. 27A, in portion or entirety, according to various aspects of the present disclosure.
Figure 27C:
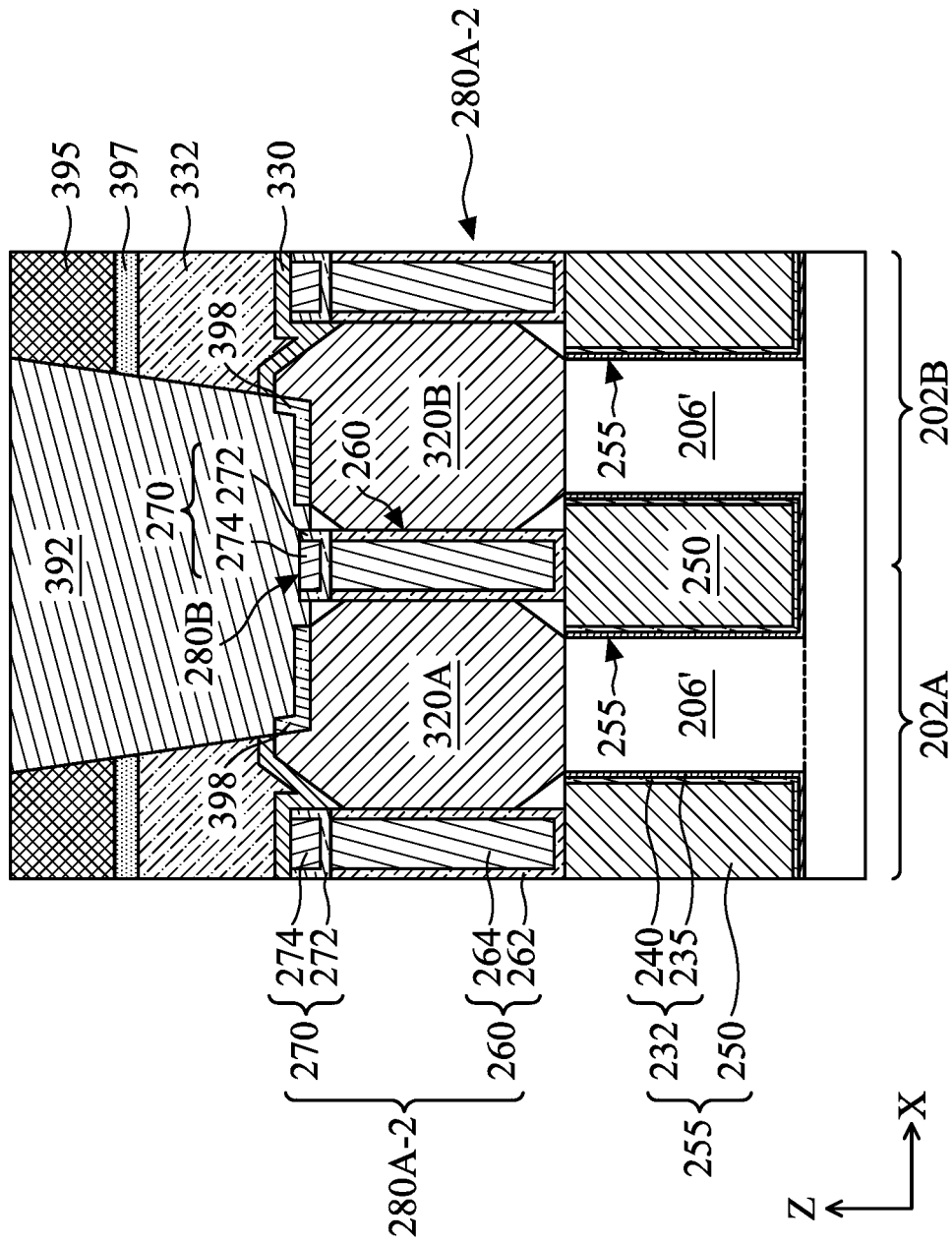
Figure 27D:
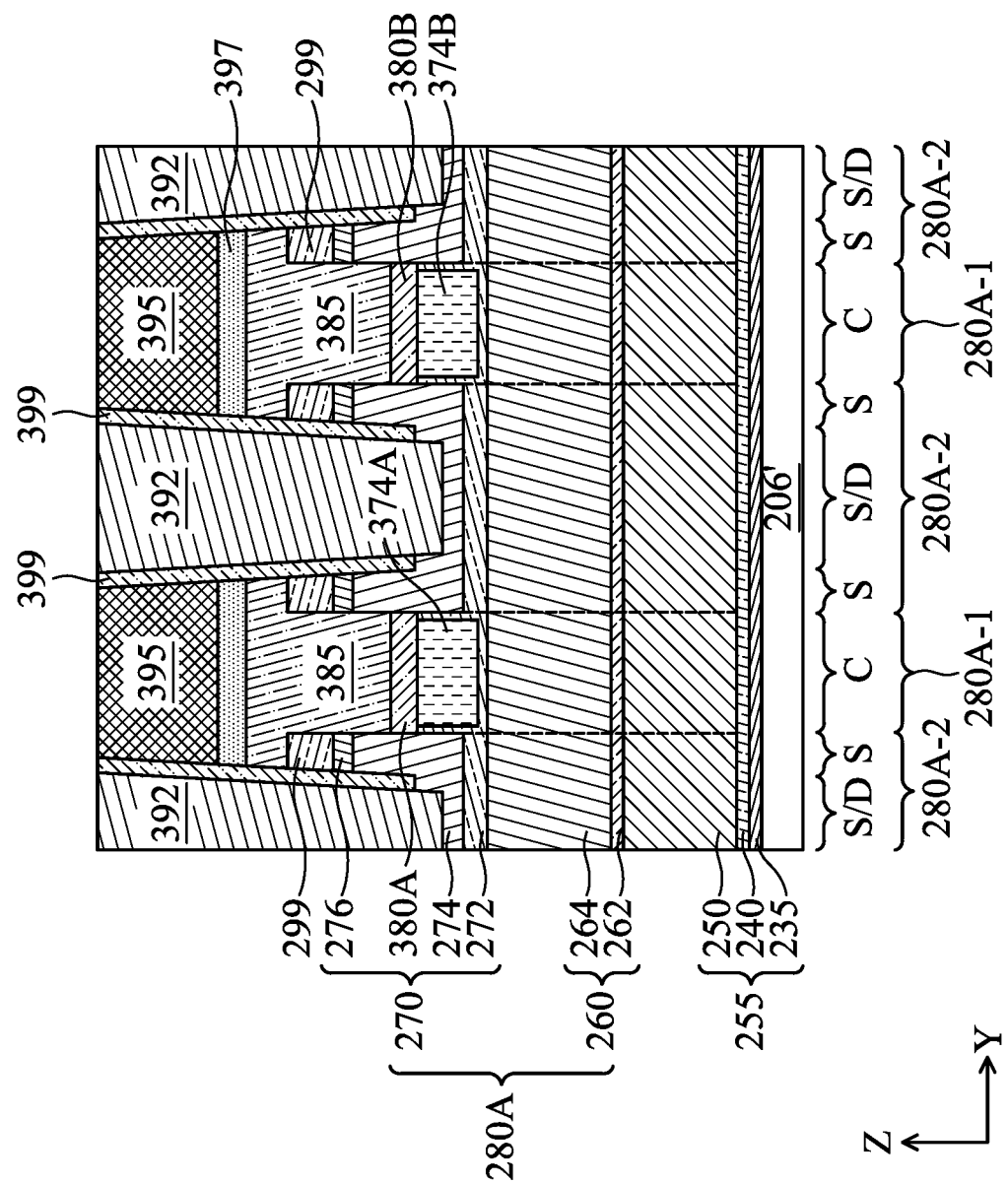
Figure 27E:
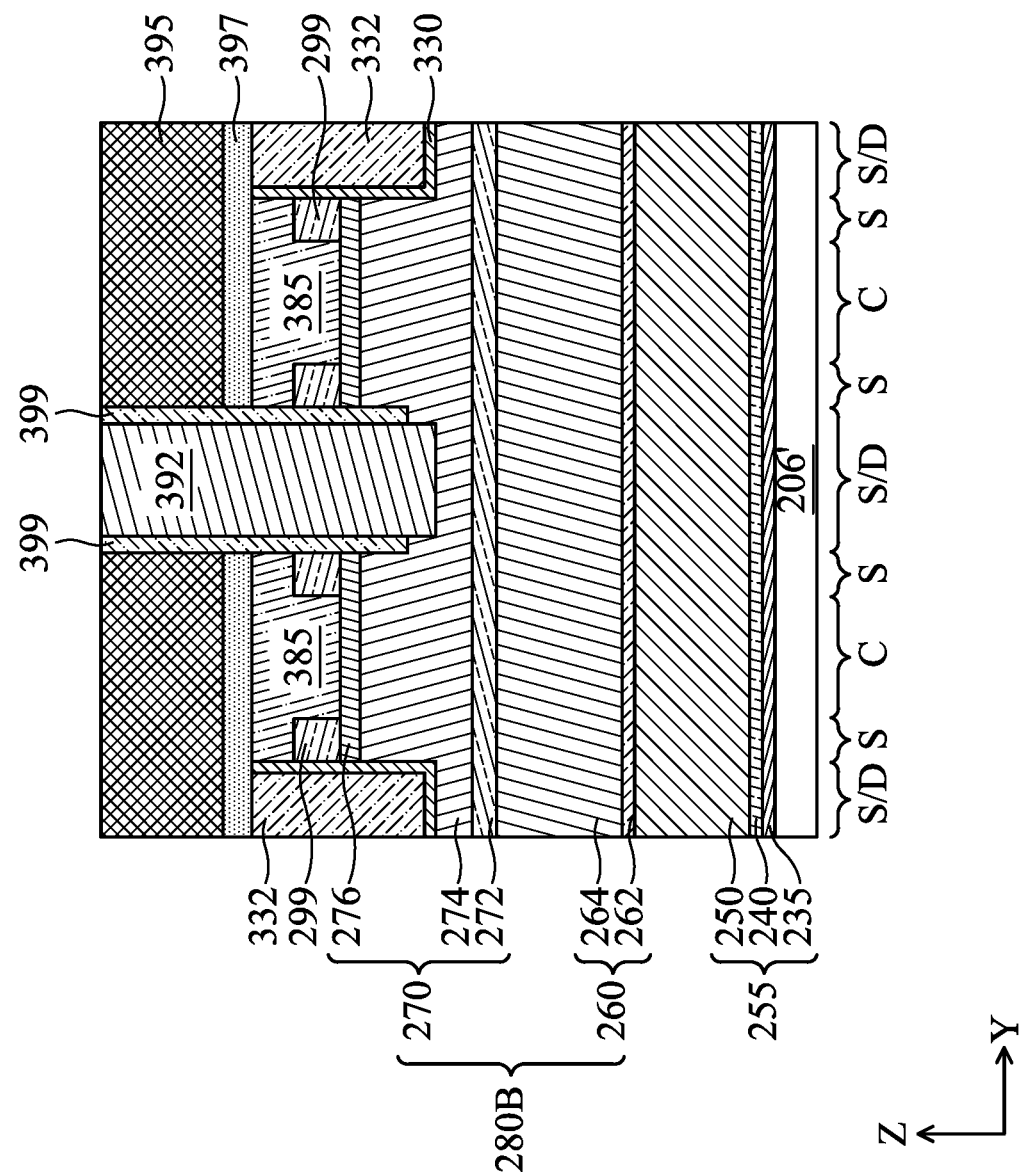

Fabrication can then proceed with forming various contacts, such as gate contacts and source/drain contacts to facilitate operation of transistors of multigate device 200. Turning to FIG. 26 and FIGS. 27A-27E, gate contacts 390 and source/drain contacts 392 are formed to epitaxial source/drain features 320A, 320B, and gate contacts 395 are formed to metal gates 370A, 370B. For ease of description and understanding, FIG. 26 is a perspective view of multigate device 200 after undergoing processing associated with FIGS. 2-26; FIG. 27A is a top view of multigate device 200 after undergoing processing associated with FIGS. 2-26; FIG. 27B is a cross-sectional view along line B-B in FIG. 27A (which is along a lengthwise direction of one of gate structures 300 and can be referred to as a metal gate x-cut cross-sectional view); FIG. 27C is a cross-sectional view along line C-C in FIG. 27A (which is along a lengthwise direction of one of source/drain contacts 392 and can be referred to as a source/drain x-cut cross-sectional view); FIG. 27D is a cross-sectional view along line D-D in FIG. 27A (which is along gate isolation fin 280B having a lengthwise direction substantially parallel to a lengthwise direction of active regions of multigate device 200 (e.g., channels 220'/fin portions 206')); and FIG. 27E is a cross-sectional view along line E-E in FIG. 27A (which is along gate isolation fin 280A having a lengthwise direction substantially parallel to a lengthwise direction of active regions of multigate device 200 (e.g., channels 220'/fin portions 206')). In FIG. 26 and FIGS. 27A-27E, gate contacts 390 and source/drain contacts 392 extend through an ILD layer 395, a CESL 397, dielectric cap layers 385, ILD layer 332, and/or CESL 330 to metal gates 370A, 370B and epitaxial source/drain features 320A, 320B, respectively. In the depicted embodiment, gate contacts 290 further extend through metal cap layers 380A, 380B and physically contact gate electrodes 374A, 374B. Source/drain contacts 392 can physically contact epitaxial source/drain features 320A, epitaxial source/drain features 320B, or both epitaxial source/drain features 320A, epitaxial source/drain features 320B (see FIG. 27C). In some embodiments, gate contacts 390 and/or source/drain contacts 392 are formed by depositing CESL 397 over multigate device 200 (in particular, over dielectric cap layers 385, CESL 330, and ILD layer 332), depositing ILD layer 395 over CESL 397, patterning dielectric layers (e.g., ILD layers 395, 332, CESLs 397, 330, and/or dielectric cap layers 385) to form gate openings and/or source/drain contact openings, and filling the gate openings and/or the source/drain contact openings with a conductive material. Patterning ILD layers 395, 332 and/or CESLs 397, 330 can include lithography processes and/or etching processes. In some embodiments, the lithography processes include forming a resist layer over ILD layer 395, exposing the resist layer to patterned radiation, and developing the exposed resist layer, thereby forming a patterned resist layer that can be used as a masking element for etching the gate openings and/or the source/drain contact openings that extend through ILD layer 395, CESL 397, ILD layer 332, CESL 330, and/or dielectric cap layers 385 to expose metal gates 370A, 370B and/or epitaxial source/drain features 320A, 320B. The etching processes include dry etches, wet etches, other etching processes, or combinations thereof. Thereafter, the gate openings and/or the source/drain contact openings are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some embodiments, gate contacts 390 and/or source/drain contacts 392 include a bulk layer (also referred to as a conductive plug). In some embodiments, gate contacts 390 and/or source/drain contacts 392 include a barrier layer, an adhesion layer, and/or other suitable layer disposed between the bulk layer and surrounding dielectric layers (e.g., ILD layer 395, CESL 397, ILD layer 332, CESL 330, and/or dielectric cap layers 385). In such embodiments, the barrier layer and/or the adhesion layer conform to the gate openings and/or the source/drain contact openings, such that the barrier layer and/or the adhesion layer are disposed on the dielectric layers and the bulk layer is disposed on the barrier layer and/or the adhesion layer. In some embodiments, the barrier layer, the adhesion layer, and/or other suitable layer include titanium, titanium alloy (for example, TiN), tantalum, tantalum alloy (for example, TaN), other suitable constituent, or combinations thereof. Thereafter, any excess conductive material(s) can be removed by a planarization process, such as CMP, thereby planarizing a top surface of ILD layer 395 and top surfaces of gate contacts 390 and/or source/drain contacts 392. In some embodiments, silicide layers 398 are formed over epitaxial source/drain features 320A, 320B before forming source/drain contacts 392 by forming metal layers over epitaxial source/drain features 320A, 320B and heating multigate device 200 to cause constituents of epitaxial source/drain features 320A, 320B to react with metal constituents of the metal layers. Silicide layers 398 can be considered a portion of epitaxial source/drain features 320A, 320B and/or a portion of source/drain contacts 392. In some embodiments, silicide layers 398 include a metal constituent (e.g., nickel, platinum, palladium, vanadium, titanium, cobalt, tantalum, ytterbium, zirconium, other suitable metal, or combinations thereof) and a constituent of epitaxial source/drain features 320A, 320B (e.g., silicon and/or germanium). In some embodiments, contact spacers 399 are formed along sidewalls of source/drain contacts 392. Contact spacers 399 include any suitable dielectric material, such as those described herein.

Accordingly, multigate device 200 includes first transistors in first transistor region 202A and second transistors in second transistor region 202B. The first transistors have metal gates 370A (each of which includes respective portions of a respective gate dielectric 372 and a respective gate electrode 374A), and the second transistors have metal gates 370B (each of which includes respective portions of a respective gate dielectric 372 and a respective gate electrode 374B). Each first transistor further includes respective epitaxial source/drain features 320A, and each second transistor further includes respective epitaxial source/drain features 320B. Each metal gate 370A wraps respective channel layers 220' and is disposed between respective epitaxial source/drain features 320A. Each metal gate 370B wraps respective channel layers 220' and is disposed between respective epitaxial source/drain features 320B. In the metal gate cut view (FIG. 27B), metal gate 370A is disposed between and physically contacts gate isolation fin 280B and a respective gate isolation fin 280A (in particular, first portion 280A-1 of the respective gate isolation fin 280A), and metal gate 370B is disposed between and physically contacts gate isolation fin 280B and a respective gate isolation fin 280A (in particular, first portion 280A-1 of the respective gate isolation fin 280A). Metal gates 370A, 370B are also disposed on and physically contact tops, sidewalls, and bottoms of respective channel layers 220', which tops and bottoms extend between respective sidewalls. Metal gates 370A, 370B thus completely surround their respective channel layers 220', such that the first transistors and the second transistors of multigate device 200 can be referred to as GAA transistors. In the depicted embodiment, metal gates 370A, 370B cover four sides of their respective channel layers 220'. The present disclosure contemplates embodiments where metal gates 370A, 370B cover more or less than four sides of their respective channel layers 220' depending on a configuration of channel layers 220' and/or multigate device 200.

Gate isolation fin 280B separates and isolates transistor regions and gate isolation fins 280A separate and/or isolate device features and/or transistor features within a transistor region from one another. For example, gate isolation fin 280B separates and/or isolates metal gates 370A of the first transistors in first transistor region 202A from metal gates 370B of the second transistors in second transistor region 202B, and gate isolation fins 280A separate and/or isolate metal gates 370A, 370B and/or epitaxial source/drain feature 320A, 320B from other gates and/or source/drain features within their respective first transistor region 202A or second transistor region 202B. In some embodiments, where first transistor region 202A and second transistor region 202B are processed to form first CMOS transistors and second CMOS transistors, respectively, the self-aligned metal gate cut technique separates metal gates 370A of first CMOS transistors from metal gates 370B of second CMOS transistors. Fabricating gate isolation fin 280B using the disclosed self-aligned metal gate cut technique allows for reduced spacing between active regions. The disclosed self-aligned metal gate cut techniques described herein thus do not have to account for lithography process variations, allowing for smaller spacings between active regions of transistors, and thus smaller cell heights, further increasing packing density of transistors and IC pattern density. In some embodiments, the self-aligned metal gate cute techniques described herein can reduce pattern density about 70% to about 85% compared to pattern density achieved by non-self-aligned metal gate cut techniques. In some embodiments, where first transistor region 202A includes a first CMOS transistor and second transistor region 202B includes a second CMOS transistor, leftmost gate isolation fin 280A in first transistor region 202A may separate and/or isolate a gate (e.g., metal gate 370A) and/or source/drain features (e.g., epitaxial source/drain features 320A) of a p-type transistor of the first CMOS transistor from a gate and/or source/drain features of an n-type transistor of the first CMOS transistor in first transistor region 202A, or vice versa, while rightmost gate isolation fin 280A in second transistor region 202B may separate and/or isolate a gate (i.e., e.g., metal gate 370B) and/or source/drain features (e.g., epitaxial source/drain features 320B) of an n-type transistor of the second CMOS transistor from a gate and/or source/drain features of a p-type transistor of the second CMOS transistor in second transistor region 202B, or vice versa.

As noted above, gate isolation fins 280A have different configurations in channel regions and source/drain regions of multigate device 200. For example, gate isolation fins 280A include first portions 280A-1 in channel regions of multigate device 200 (FIG. 27B, FIG. 27D) and second portions 280A-2 in source/drain regions of multigate device 200 (FIG. 27C, FIG. 27D). First portions 280A-1 have dielectric features 260 (e.g., oxide layers 264 disposed over dielectric liners 262), and metal gates 370A, 370B extend over and cover top surfaces of dielectric features 260 in first portions 280A-1 of gate isolation fins 280A. Second portions 280A-2 have dielectric features 270 (e.g., dielectric cap layers 276, dielectric layers 274, and dielectric liners 272) disposed over dielectric features 260. In an X-Z plane (FIG. 27C), dielectric features 270 of second portions 280A-2 have dielectric liners 272 that wrap dielectric layers 274, and CESL 330 wraps dielectric features 270 of second portions 280A-2 (e.g., CESL 330 covers top surfaces and sidewalls of dielectric features 270). In a Y-Z plane (FIG. 27D), dielectric features 270 of second portions 280A-2 have u-shaped portions formed from first portions of dielectric features 270 under gate spacers 299 in spacer regions (S) (which may be considered part of source/drain regions (S/D) and/or channel regions (C)) and second portions of dielectric features 270 in source/drain regions, which are not under gate spacers 299. The first portions have dielectric layers 274 disposed between dielectric liners 272 and dielectric cap layers 276. The second portions have dielectric layers 274 disposed over dielectric liners 272. A thickness of dielectric layers 274 in the first portions is greater than a thickness of dielectric layers 274 in the second portions. With such configuration, source/drain contacts 392 extend through ILD layer 395, CESL 394, and dielectric cap layers 385 to dielectric features 270 of gate isolation fins 280A, and in the depicted embodiment, bottom portions of source/drain contacts 392 are wrapped by the u-shaped portions of dielectric features 270 of second portions 280A-2 of gate isolation fins 280A. Further, gate electrodes 374A, 347B, metal cap layers 380A, 380B, and dielectric cap layers 385 are disposed between dielectric features 270 of second portions 280A-2 and over dielectric features 260 of first portions 280A-1.

Figure 28:
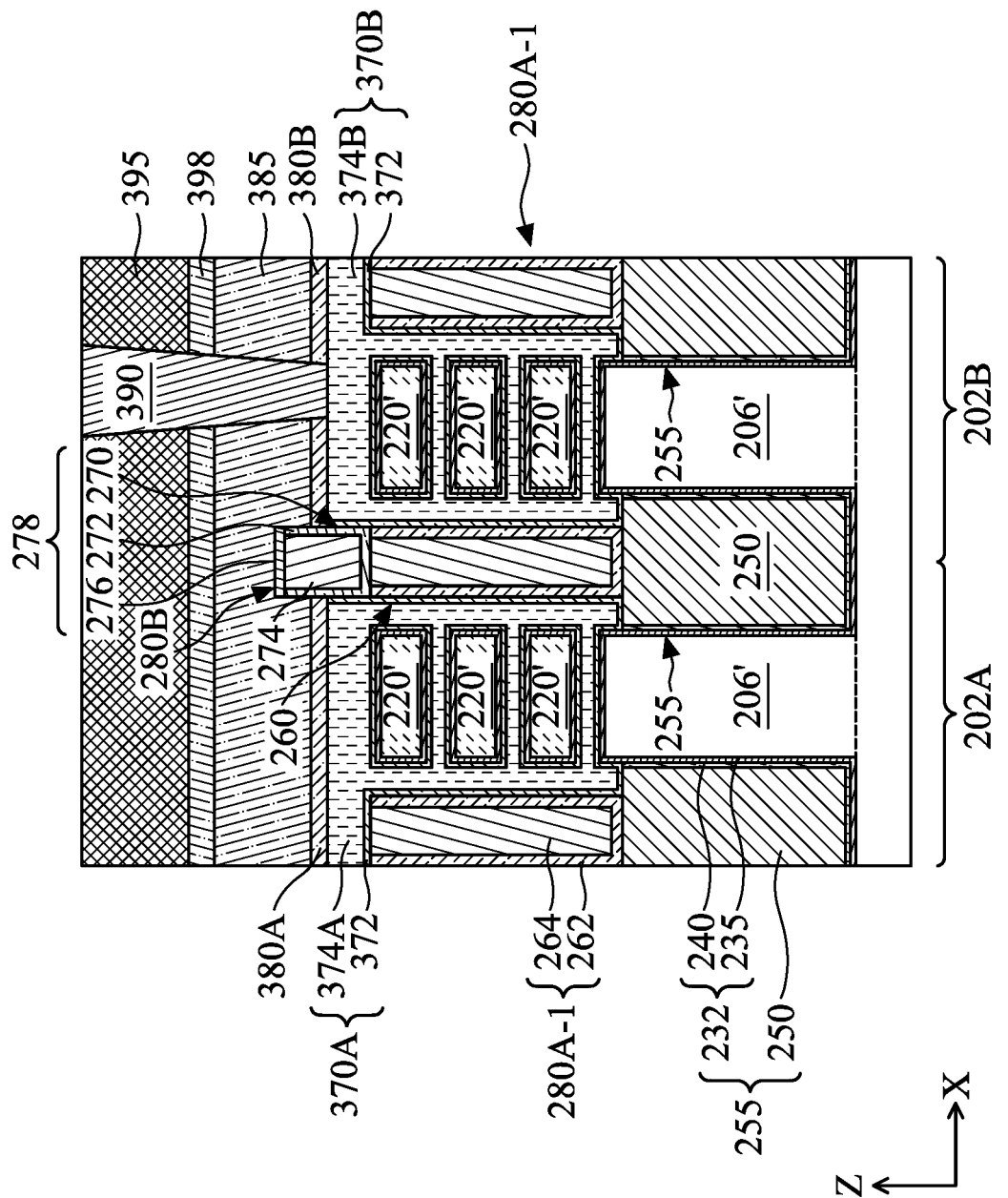
FIG. 28 and FIG. 29 are fragmentary cross-sectional views of a multigate device, in portion or entirety, according to various aspects of the present disclosure.
Figure 29:
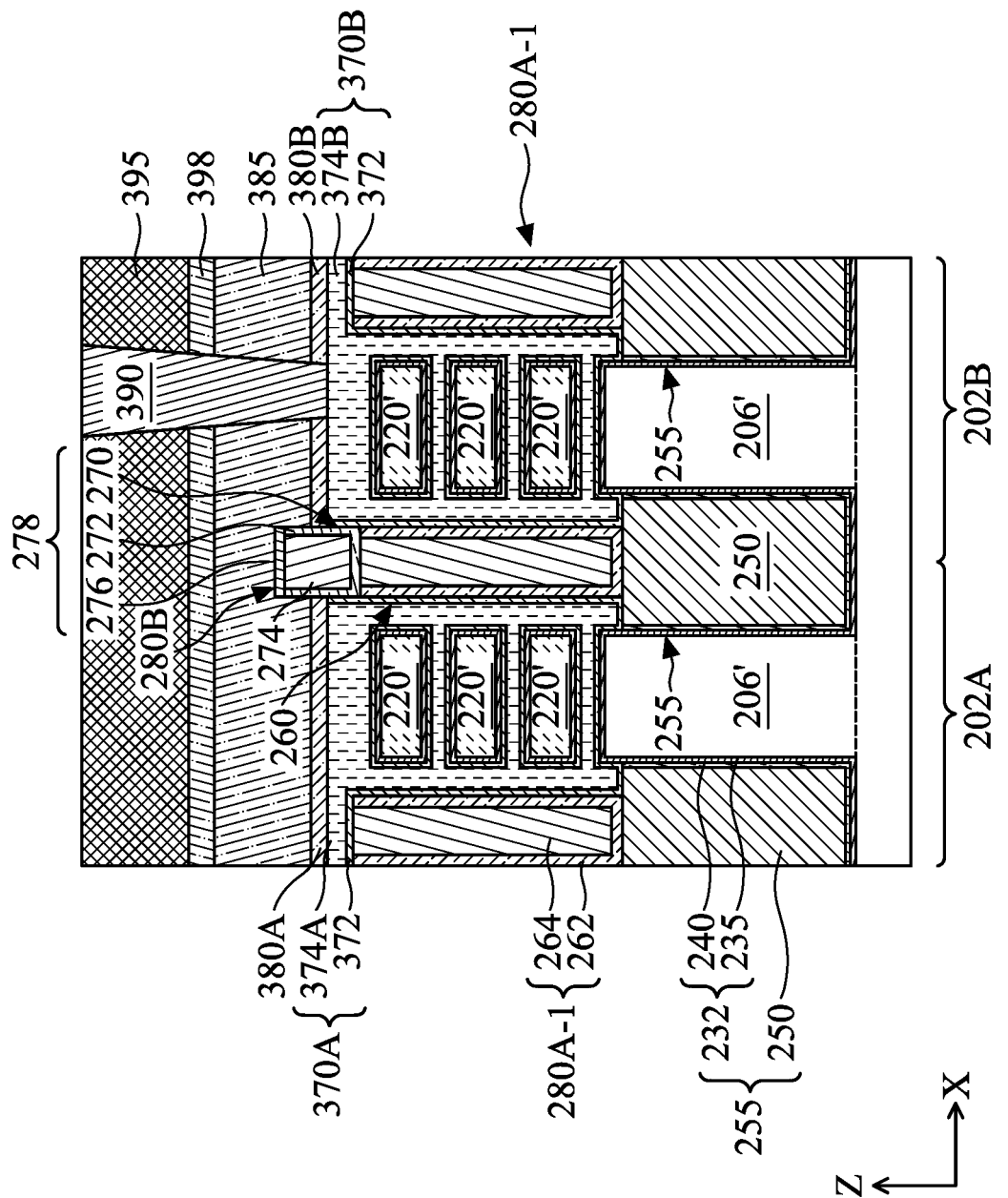

Gate isolation fin 280B also has different configurations in channel regions and source/drain regions of multigate device 200. For example, gate isolation fin 280B has dielectric features 270 disposed over dielectric features 260 in both channel regions and source/drain regions of multigate device 200, but dielectric features 270 have different configurations in channel regions and source/drain regions. In channel regions of multigate device 200, dielectric features 270 have dielectric shells 278 (e.g., dielectric liners 272 and dielectric cap layers 276) that surround dielectric layers 274 (i.e., dielectric cores) in the X-Z plane (FIG. 27B), while dielectric features 270 have dielectric layers 274 disposed between dielectric liners 272 and dielectric cap layers 276 in the Y-Z plane (FIG. 27E). In source/drain regions of multigate device 200, dielectric features 270 have dielectric liners 272 that wrap dielectric layers 274 in the X-Z plane (FIG. 27C), while dielectric features 270 have dielectric layers 274 disposed over dielectric liners 272 in the Y-Z plane (FIG. 27E). In the Y-Z plane (FIG. 27E), dielectric features 270 of gate isolation fin 280B also have u-shaped portions formed from first portions of dielectric features 270 in spacer regions and channel regions (also not under gate spacers 299) and second portions of dielectric features 270 in source/drain regions. The first portions have dielectric layers 274 disposed between dielectric liners 272 and dielectric cap layers 276. The second portions have dielectric layers 274 disposed over dielectric liners 272. A thickness of dielectric layers 274 in the first portions is greater than a thickness of dielectric layers 274 in the second portions. With such configuration in the Y-Z plane, source/drain contacts 392 extend through ILD layer 395, CESL 394, and dielectric cap layers 385 to dielectric features 270 of gate isolation fin 280B, and in the depicted embodiment, bottom portions of source/drain contacts 392 are also wrapped by dielectric features 270 of gate isolation fin 280B. For example, portions of dielectric features 270 in spacer regions are disposed along sidewalls of source/drain contacts 392, and portions of dielectric features in source/drain regions are disposed along bottoms of source/drain contacts 392. Further, dielectric cap layers 385 are disposed between gate spacers 299 and over top surfaces of dielectric features 270 of gate isolation fin 280B. Further, in the depicted embodiment, a height of dielectric features 270 of gate isolation fin 280B in source/drain regions of multigate device 200 is less than a height of dielectric features 270 of gate isolation fin 280B in channel regions and spacer regions of multigate device 200. In the depicted embodiment, an interface between dielectric feature 270 and dielectric feature 260 of gate isolation fin 280B is at substantially the same height as a top surface of topmost channel layers 220' of multigate device 200. In some embodiments, the interface between dielectric feature 270 and dielectric feature 260 of gate isolation fin 280B is lower than the top surface of topmost channel layers 220' of multigate device 200, such as depicted in FIG. 28. In some embodiments, the interface between dielectric feature 270 and dielectric feature 260 of gate isolation fin 280B is higher than the top surface of topmost channel layers 220' of multigate device 200, such as depicted in FIG. 29.

Gate isolation fins 280A and gate isolation fin 280B are configured to enhance performance of multigate device 200. In particular, because dielectric features 270 of gate isolation fins 280A and gate isolation fins 280B include both low-k dielectric material and high-k dielectric material, instead of only high-k dielectric material, gate isolation fins 280A and gate isolation fin 280B can reduce (and, in some embodiments, eliminate) leakage paths between metal gates and source/drain contacts of multigate device 200, which can arise from voids that may form in high-k dielectric materials. For example, it has been observed that voids can form easily in a high-k dielectric upper portion of a gate isolation fin, where the voids provide leakage paths between, for example, a gate of a multigate device (e.g., metal gates 370A, 370B) and a source/drain contact (e.g., source/drain contacts 392), which degrades device performance. Incorporating a low-k dielectric core into the upper portion of the gate isolation fin, as provided in multigate device 200, reduces (and, in some embodiments, eliminates) void formation in the gate isolation fin (in particular, in dielectric features 270), such that a multigate device having the proposed gate isolation fin structure may exhibit improved speed, gate-drain capacitance ($C_{gd}$), and power efficiency ($P_{eff}$) compared to a multigate device having a gate isolation fin with an upper portion having a high-k dielectric core (i.e., the upper portion does not include low-k dielectric material). In some embodiments, multigate device 200 having gate isolation fins 280A and gate isolation fin 280B can reduce gate-drain capacitance about 3% to about 5% compared to a multigate device having gate isolation fins with upper portions that include only high-k dielectric material. In some embodiments, multigate device 200 having gate isolation fins 280A and gate isolation fin 280B can operate about 3% to about 5% faster than a multigate device having gate isolation fins with upper portions that include only high-k dielectric material. In some embodiments, multigate device 200 having gate isolation fins 280A and gate isolation fin 280B can improve power efficiency about 4% to about 6% compared to a multigate device having gate isolation fins with upper portions that include only high-k dielectric material. Gate isolation fins 280A and gate isolation fin 280B thus improve performance of the first transistors of multigate device 200, performance of the second transistors of multigate device 200, and/or overall performance of multigate device 200. Different embodiments may have different advantages, and no particular advantage is necessarily required of any embodiment.

Various parameters of the etch processes described herein can be tuned to achieve selective etching of one or more layers of multigate device 200, such as a flow rate of an etch gas, a concentration of the etch gas, a concentration of the carrier gas, a ratio of the concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. The dry etches may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etches can use a carrier gas to deliver the etch gas. The carrier gas includes nitrogen, argon, helium, xenon, other suitable carrier gas constituent, or combinations thereof. The wet etches may implement a wet etchant solution that includes $H_2SO_4$ (sulfuric acid), $H_2O_2$ (hydrogen peroxide), $NH_4OH$ (ammonium hydroxide), HCl (hydrochloric acid), HF (hydrofluoric acid), DHF (diluted HF), $HNO_3$ (nitric acid), $H_3PO_4$ (phosphoric acid), $H_2O$ (water) (which can be deionized water (DIW) or ozonated de-ionized water ($DIWO_3$)), ozone ($O_3$), other suitable chemicals, or combinations thereof.

Gate isolation techniques disclosed herein form gate isolation fins to isolate metal gates of multigate devices, such as GAA devices, from one another before forming the multigate devices, and in particular, before forming the metal gates of the multigate devices. From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments.

The present disclosure provides for many different embodiments. An exemplary device includes a first multigate device having first source/drain features and a first metal gate that surrounds a first channel layer and a second multigate device having second source/drain features and a second metal gate that surrounds a second channel layer. A gate isolation fin, which separates the first metal gate and the second metal gate, includes a dielectric feature having a first dielectric layer having a first dielectric constant (e.g., a low-k dielectric core) and a second dielectric layer (e.g., a high-k dielectric shell) surrounding the first dielectric layer. The second dielectric layer has a second dielectric constant that is greater than the first dielectric constant. In some embodiments, the second dielectric layer has a first thickness along a bottom of the first dielectric layer, a second thickness along sidewalls of the first dielectric layer, and a third thickness along a top of the first dielectric layer. The third thickness is greater than the first thickness and the second thickness. In some embodiments, the second thickness along sidewalls of the first dielectric layer is less than the first thickness along the bottom of the first dielectric layer. In some embodiments, the device further includes a source/drain contact to the first source/drain features and the second source/drain features. The source/drain contact physically contacts the dielectric feature of the gate isolation fin. In some embodiments, the gate isolation fin is a first gate isolation fin disposed along a first sidewall of the first metal gate, and the device further includes a second gate isolation fin that is different than the first gate isolation fin. The second gate isolation fin is disposed along a second sidewall of the first metal gate.

In some embodiments, the dielectric feature is a first dielectric feature and the gate isolation fin further includes a second dielectric feature. The first dielectric feature is disposed over the second dielectric feature. The second dielectric feature has a third dielectric layer having a third dielectric constant and a fourth dielectric layer that wraps the third dielectric layer. The fourth dielectric layer has a fourth dielectric constant that is less than the second dielectric constant. In some embodiments, the first dielectric constant is the same as the fourth dielectric constant and the third dielectric constant is different than the first dielectric constant and the second dielectric constant. In some embodiments, the third dielectric constant is less than the first dielectric constant and the second dielectric constant.

In some embodiments, the gate isolation fin is further disposed between and separates the first source/drain features and the second source/drain features. In such embodiments, the gate isolation fin has a first height between the first source/drain features and the second source/drain features and a second height between the first metal gate and the second metal gate. The first height is less than the second height. In some embodiments, the second dielectric layer of the dielectric feature surrounds the first dielectric layer of the dielectric feature between the first metal gate and the second metal gate, and the second dielectric layer of the dielectric feature wraps the first dielectric layer of the dielectric feature between the first source/drain features and the second source/drain features.

Another exemplary device includes an isolation feature disposed over a substrate and a gate isolation fin disposed over the isolation feature. The isolation feature is disposed between a first fin portion and a second fin portion extending from the substrate. The gate isolation fin includes an upper dielectric feature and a lower dielectric feature. The upper dielectric feature has a low-k dielectric core surrounded by a high-k dielectric shell. The device further includes a first multigate device having a first channel layer disposed over the first fin portion, a first metal gate that wraps the first channel layer, and first source/drain features. The first metal gate is disposed between the first channel layer and the first fin portion. The device further includes a second multigate device having a second channel layer disposed over the second fin portion, a second metal gate that wraps the second channel layer, and second source/drain features. The second metal gate is disposed between the second channel layer and the second fin portion. The gate isolation fin separates the first metal gate of the first multigate device from the second metal gate of the second multigate device. In some embodiments, the lower dielectric feature has a low-k dielectric layer that wraps an oxide core. In some embodiments, the high-k dielectric shell includes a high-k dielectric liner and a high-k cap layer. The high-k cap layer is disposed between sidewall portions of the high-k dielectric liner. In some embodiments, the upper dielectric feature has a first height between the first metal gate and the second metal gate and a second height between the first source/drain features and the second source/drain features.

In some embodiments, the isolation feature is a first isolation feature, the gate isolation fin is a first gate isolation fin, the lower dielectric feature is a first lower dielectric feature, the upper dielectric feature is a first upper dielectric feature, the low-k dielectric core is a first low-k dielectric core, and the high-k dielectric shell is a first high-k dielectric shell. In such embodiments, the device further includes a second isolation feature and a second gate isolation fin disposed over the second isolation feature. The first metal gate and one of the first source/drain features is disposed between the first gate isolation fin and the second gate isolation fin. The second gate isolation fin has a first portion adjacent the one of the first source/drain features and a second portion adjacent the first metal gate. The first portion is different than the second portion. The first portion has a second upper dielectric feature and a second lower dielectric feature. The second upper dielectric feature has a second low-k dielectric core wrapped by a second high-k dielectric shell. In some embodiments, the device further includes a source/drain contact to the one of the first source/drain features and one of the second source/drain features. In such embodiments, the second low-k dielectric core of the second upper dielectric feature of the second gate isolation fin wraps a first bottom portion of the source/drain contact and a second bottom portion of the source/drain contact wraps the first upper dielectric feature of the first gate isolation fin.

An exemplary method includes forming an isolation feature in a lower portion of a trench and forming a gate isolation fin over the isolation feature. The gate isolation fin is formed in an upper portion of the trench and the gate isolation fin has an upper dielectric feature and a lower dielectric feature. The upper dielectric feature has a dielectric core having a first dielectric constant surrounded by a dielectric shell having a second dielectric constant. The second dielectric constant is greater than the first dielectric constant. The method further includes forming a first multigate device having a first channel layer, a first metal gate, and first source/drain features. The first channel layer is disposed between the first source/drain features and the first metal gate surrounds the first channel layer. The method further includes forming a second multigate device having a second channel layer, a second metal gate, and second source/drain features. The second channel layer is disposed between the second source/drain features and the second metal gate surrounds the second channel layer. The gate isolation fin is disposed between and separates the first metal gate of the first multigate device and the second metal gate of the second multigate device.

In some embodiments, forming the gate isolation fin includes forming the lower dielectric feature in a bottom portion of the upper portion of the trench, depositing a first dielectric layer having the second dielectric constant along a bottom and sidewalls of a top portion of the upper portion of a trench, and depositing a second dielectric layer having the first dielectric constant over the first dielectric layer. The second dielectric layer fills a remainder of the top portion of the upper portion of the trench. In such embodiments, forming the gate isolation fin further includes etching back the second dielectric layer to form a recess having sidewalls formed by the first dielectric layer and a bottom formed by the second dielectric layer, and forming a third dielectric layer having the second dielectric constant in the recess. In some embodiments, forming the gate isolation fin further includes performing a planarization process on the second dielectric layer and the first dielectric layer before etching back the second dielectric layer. In some embodiments, forming the third dielectric layer includes depositing the third dielectric layer over the first dielectric layer and the second dielectric layer and performing a planarization process on the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first multigate device having:
      a first channel layer disposed between first source/drain features, and
      a first metal gate that surrounds the first channel layer;
   a second multigate device having:
      a second channel layer disposed between second source/drain features, and
      a second metal gate that surrounds the second channel layer; and
   a gate isolation fin disposed between and separating the first metal gate and the second metal gate, wherein the gate isolation fin includes a first dielectric feature disposed over a second dielectric feature, the first dielectric feature having:
      a first dielectric layer having a first dielectric constant, and
      a second dielectric layer that surrounds the first dielectric layer, wherein the second dielectric layer has a second dielectric constant that is greater than the first dielectric constant; and
   the second dielectric feature having:
      a third dielectric layer having a third dielectric constant, and
      a fourth dielectric layer that wraps the third dielectric layer, wherein the fourth dielectric layer has a fourth dielectric constant that is less than the second dielectric constant.

2. The device of claim 1, wherein the first dielectric constant is less than about 7 and the second dielectric constant is greater than about 7.

3. The device of claim 1, wherein the first dielectric constant is the same as the fourth dielectric constant and the third dielectric constant is different than the first dielectric constant and the second dielectric constant.

4. The device of claim 3, wherein the third dielectric constant is less than the first dielectric constant and the second dielectric constant.

5. The device of claim 1, wherein the second dielectric layer has a first thickness along a bottom of the first dielectric layer, a second thickness along sidewalls of the first dielectric layer, and a third thickness along a top of the first dielectric layer, wherein the third thickness is greater than the first thickness and the second thickness.

6. The device of claim 5, wherein the second thickness along sidewalls of the first dielectric layer is less than the first thickness along the bottom of the first dielectric layer.

7. The device of claim 1, further comprising a source/drain contact to one of the first source/drain features and one of the second source/drain features, wherein the source/drain contact is disposed over and physically contacts a portion of the first dielectric feature of the gate isolation fin that is between the one of the first source/drain features and the one of the second source/drain features.

8. The device of claim 1, wherein the gate isolation fin is a first gate isolation fin disposed along a first sidewall of the first metal gate, the device further comprising a second gate isolation fin, wherein the second gate isolation fin is different than the first gate isolation fin and the second gate isolation fin is disposed along a second sidewall of the first metal gate.

9. The device of claim 1, wherein the gate isolation fin is further disposed between and separates the first source/drain features and the second source/drain features, and further wherein the gate isolation fin has a first height between the first source/drain features and the second source/drain features and a second height between the first metal gate and the second metal gate, wherein the first height is less than the second height.

10. The device of claim 9, wherein:
the second dielectric layer of the first dielectric feature surrounds the first dielectric layer of the first dielectric feature between the first metal gate and the second metal gate; and
the second dielectric layer of the first dielectric feature wraps the first dielectric layer of the first dielectric feature between the first source/drain features and the second source/drain features.

11. A device comprising:
an isolation feature disposed over a substrate, wherein the isolation feature is disposed between a first fin portion and a second fin portion extending from the substrate;
a gate isolation fin disposed over the isolation feature, wherein the gate isolation fin includes an upper dielectric feature and a lower dielectric feature, wherein the upper dielectric feature has a low-k dielectric core surrounded by a high-k dielectric shell and the lower dielectric feature has a low-k dielectric layer that wraps an oxide core;
a first multigate device having a first channel layer disposed over the first fin portion, a first metal gate that wraps the first channel layer, and first source/drain features, wherein the first metal gate is disposed between the first channel layer and the first fin portion; and
a second multigate device having a second channel layer disposed over the second fin portion, a second metal gate that wraps the second channel layer, and second source/drain features, wherein the second metal gate is disposed between the second channel layer and the second fin portion, and further wherein the gate isolation fin separates the first metal gate of the first multigate device from the second metal gate of the second multigate device.

12. The device of claim 11, wherein the high-k dielectric shell physically contacts the low-k dielectric layer and the oxide core.

13. The device of claim 11, wherein the high-k dielectric shell includes a high-k dielectric liner and a high-k cap layer, wherein the high-k cap layer is disposed between sidewall portions of the high-k dielectric liner.

14. The device of claim 11, wherein the isolation feature is a first isolation feature, the gate isolation fin is a first gate isolation fin, the lower dielectric feature is a first lower dielectric feature, the upper dielectric feature is a first upper dielectric feature, the low-k dielectric core is a first low-k dielectric core, and the high-k dielectric shell is a first high-k dielectric shell, and the device further comprises:
a second isolation feature and a second gate isolation fin disposed over the second isolation feature, wherein:
the first metal gate and one of the first source/drain features is disposed between the first gate isolation fin and the second gate isolation fin;

the second gate isolation fin has a first portion adjacent the one of the first source/drain features and a second portion adjacent the first metal gate, wherein the first portion is different than the second portion; and
the first portion has a second upper dielectric feature and a second lower dielectric feature, wherein the second upper dielectric feature has a second low-k dielectric core wrapped by a second high-k dielectric shell.

15. The device of claim 14 further comprising a source/drain contact to the one of the first source/drain features and one of the second source/drain features, wherein:
the second low-k dielectric core of the second upper dielectric feature of the second gate isolation fin wraps a first bottom portion of the source/drain contact; and
a second bottom portion of the source/drain contact wraps the first upper dielectric feature of the first gate isolation fin.

16. The device of claim 11, wherein the upper dielectric feature has a first height between the first metal gate and the second metal gate and a second height between the first source/drain features and the second source/drain features.

17. A method comprising:
forming an isolation feature in a lower portion of a trench;
forming a gate isolation fin over the isolation feature, wherein the gate isolation fin is formed in an upper portion of the trench and the gate isolation fin has an upper dielectric feature and a lower dielectric feature, wherein the upper dielectric feature has a first dielectric core surrounded by a dielectric shell and the lower dielectric feature has a second dielectric core wrapped by a dielectric liner, wherein the first dielectric core has a first dielectric constant, the dielectric shell has a second dielectric constant, the second dielectric core has a third dielectric constant, and the dielectric liner has a fourth dielectric constant, wherein the second dielectric constant is greater than the first dielectric constant and the fourth dielectric constant is less than the second dielectric constant;
forming a first multigate device having a first channel layer, a first metal gate, and first source/drain features, wherein the first channel layer is disposed between the first source/drain features and the first metal gate surrounds the first channel layer; and
forming a second multigate device having a second channel layer, a second metal gate, and second source/drain features, wherein the second channel layer is disposed between the second source/drain features and the second metal gate surrounds the second channel layer, and further wherein the gate isolation fin is disposed between and separates the first metal gate of the first multigate device and the second metal gate of the second multigate device.

18. The method of claim 17, wherein the forming the gate isolation fin includes:
forming the lower dielectric feature in a bottom portion of the upper portion of the trench;
depositing a first dielectric layer having the second dielectric constant along a bottom and sidewalls of a top portion of the upper portion of a trench;
depositing a second dielectric layer having the first dielectric constant over the first dielectric layer, wherein the second dielectric layer fills a remainder of the top portion of the upper portion of the trench;
etching back the second dielectric layer to form a recess having sidewalls formed by the first dielectric layer and a bottom formed by the second dielectric layer; and forming a third dielectric layer having the second dielectric constant in the recess.

19. The method of claim 18, wherein the forming the gate isolation fin further includes performing a planarization process on the second dielectric layer and the first dielectric layer before etching back the second dielectric layer.

20. The method of claim 18, wherein the forming the third dielectric layer includes depositing the third dielectric layer over the first dielectric layer and the second dielectric layer and performing a planarization process on the third dielectric layer.

* * * * *